US009401714B2

(12) United States Patent
Yamazaki et al.

(10) Patent No.: US 9,401,714 B2
(45) Date of Patent: Jul. 26, 2016

(54) PROGRAMMABLE LOGIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/052,193

(22) Filed: Oct. 11, 2013

(65) Prior Publication Data

US 2014/0103960 A1     Apr. 17, 2014

(30) Foreign Application Priority Data

Oct. 17, 2012   (JP) .................. 2012-229646

(51) Int. Cl.
*H03K 19/177* (2006.01)
*H03K 19/00* (2006.01)

(52) U.S. Cl.
CPC ........ *H03K 19/0013* (2013.01); *H03K 19/1776* (2013.01); *H03K 19/17736* (2013.01)

(58) Field of Classification Search
CPC .................. H01L 27/1225; H01L 31/022466; H03K 19/1776; H03K 19/17736
See application file for complete search history.

(56) References Cited

U.S. PATENT DOCUMENTS

| 4,609,986 A | 9/1986 | Hartmann et al. |
| 4,642,487 A | 2/1987 | Carter |
| 4,870,302 A | 9/1989 | Freeman |
| 5,343,406 A | 8/1994 | Freeman et al. |
| 5,432,719 A | 7/1995 | Freeman et al. |
| 5,488,316 A | 1/1996 | Freeman et al. |
| 5,528,032 A | 6/1996 | Uchiyama |
| 5,731,856 A | 3/1998 | Kim et al. |

(Continued)

FOREIGN PATENT DOCUMENTS

| CN | 102714496 A | 10/2012 |
| EP | 1 737 044 A1 | 12/2006 |
| EP | 2 226 847 A2 | 9/2010 |
| JP | 60-198861 A | 10/1985 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Jason M Crawford
*Assistant Examiner* — Kurtis R Bahr
(74) *Attorney, Agent, or Firm* — Fish & Richardson P.C.

(57) ABSTRACT

To obtain a PLD that achieves high-speed configuration capable of dynamic configuration, consumes less power, and has a short startup time and a PLD that has a smaller number of transistors or a smaller circuit area than a PLD using an SRAM as a configuration memory, a plurality of logic elements arranged in an array and a switch for selecting electrical connection between the logic elements are provided. The switch includes a first transistor including a multilayer film including an oxide layer and an oxide semiconductor layer, a node that becomes floating when the first transistor is turned off, and a second transistor in which electrical continuity between a source and a drain is determined based on configuration data held at the node.

12 Claims, 30 Drawing Sheets

(56) References Cited

U.S. PATENT DOCUMENTS

| | | | |
|---|---|---|---|
| 5,744,864 A | 4/1998 | Cillessen et al. |
| 6,127,702 A | 10/2000 | Yamazaki et al. |
| 6,172,521 B1 | 1/2001 | Motomura |
| 6,294,274 B1 | 9/2001 | Kawazoe et al. |
| 6,535,422 B2 | 3/2003 | Goto et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,797,664 B2 | 9/2010 | Matsumoto et al. |
| 7,994,500 B2 | 8/2011 | Kim et al. |
| 8,058,645 B2 | 11/2011 | Jeong et al. |
| 8,072,237 B1 | 12/2011 | Rahim et al. |
| 8,148,779 B2 | 4/2012 | Jeong et al. |
| 8,188,480 B2 | 5/2012 | Itai |
| 8,188,763 B2 * | 5/2012 | Bertin .................... B82Y 10/00 257/209 |
| 8,202,365 B2 | 6/2012 | Umeda et al. |
| 8,203,143 B2 | 6/2012 | Imai |
| 8,274,078 B2 | 9/2012 | Itagaki et al. |
| 8,421,083 B2 | 4/2013 | Yamazaki et al. |
| 8,501,555 B2 * | 8/2013 | Yamazaki ............ H01L 27/1225 257/E21.414 |
| 8,546,182 B2 | 10/2013 | Akimoto et al. |
| 8,547,753 B2 * | 10/2013 | Takemura ........ H03K 19/17784 326/44 |
| 8,552,434 B2 | 10/2013 | Akimoto et al. |
| 8,633,492 B2 | 1/2014 | Akimoto et al. |
| 8,675,382 B2 | 3/2014 | Kurokawa |
| 8,686,425 B2 | 4/2014 | Yamazaki et al. |
| 8,723,176 B2 | 5/2014 | Yamazaki |
| 8,759,167 B2 | 6/2014 | Akimoto et al. |
| 8,791,463 B2 * | 7/2014 | Misaki ................ H01L 27/1225 257/59 |
| 8,796,683 B2 | 8/2014 | Yamazaki |
| 8,891,281 B2 | 11/2014 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0300201 A1 | 12/2007 | Matsumoto et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0314618 A1 * | 12/2010 | Tanaka .............. H01L 21/02554 257/43 |
| 2010/0320458 A1 | 12/2010 | Umeda et al. |
| 2010/0320459 A1 | 12/2010 | Umeda et al. |
| 2011/0024751 A1 | 2/2011 | Yamazaki et al. |
| 2011/0101351 A1 | 5/2011 | Yamazaki |
| 2011/0140100 A1 * | 6/2011 | Takata ................ H01L 29/7869 257/43 |
| 2011/0175646 A1 | 7/2011 | Takemura et al. |
| 2011/0193083 A1 * | 8/2011 | Kim .................... H01L 29/7869 257/43 |
| 2011/0215328 A1 | 9/2011 | Morosawa et al. |
| 2012/0119205 A1 | 5/2012 | Taniguchi et al. |
| 2012/0126223 A1 * | 5/2012 | Maeng ................ H01L 29/7869 257/43 |
| 2012/0212995 A1 * | 8/2012 | Kurokawa ............ G11C 7/1006 365/149 |
| 2012/0268164 A1 * | 10/2012 | Kobayashi ....... H03K 19/17796 326/40 |
| 2012/0293200 A1 * | 11/2012 | Takemura .......... H03K 19/1736 326/38 |
| 2012/0293201 A1 | 11/2012 | Fujita et al. |
| 2012/0293202 A1 * | 11/2012 | Nishijima .......... H03K 19/1776 326/41 |
| 2012/0293206 A1 * | 11/2012 | Yoneda ............ H03K 19/17736 326/101 |

(56) References Cited

U.S. PATENT DOCUMENTS

| | | | |
|---|---|---|---|
| 2012/0293209 A1 | 11/2012 | Takewaki | |
| 2012/0293242 A1 | 11/2012 | Kato | |
| 2012/0305913 A1 | 12/2012 | Yamazaki et al. | |
| 2013/0009209 A1 | 1/2013 | Yamazaki | |
| 2013/0009219 A1 | 1/2013 | Yamazaki et al. | |
| 2013/0009220 A1 | 1/2013 | Yamazaki et al. | |
| 2013/0078762 A1 | 3/2013 | Akimoto et al. | |
| 2013/0082255 A1 | 4/2013 | Akimoto et al. | |
| 2013/0087785 A1 | 4/2013 | Akimoto et al. | |
| 2013/0089950 A1 | 4/2013 | Akimoto et al. | |
| 2013/0092925 A1* | 4/2013 | Saito | H01L 29/78693 257/43 |
| 2013/0133735 A1* | 5/2013 | Cheong | H01L 31/046 136/256 |
| 2013/0161608 A1 | 6/2013 | Yamazaki | |
| 2013/0161611 A1 | 6/2013 | Yamazaki et al. | |
| 2013/0200365 A1* | 8/2013 | Yamazaki | H01L 29/7869 257/43 |
| 2013/0207170 A1 | 8/2013 | Kurokawa | |
| 2013/0228777 A1 | 9/2013 | Yamazaki et al. | |
| 2013/0285697 A1 | 10/2013 | Kurokawa | |
| 2013/0293263 A1* | 11/2013 | Kurokawa | H03K 19/094 326/41 |
| 2013/0314124 A1* | 11/2013 | Ikeda | H03K 19/177 326/41 |
| 2013/0321025 A1 | 12/2013 | Kurokawa et al. | |
| 2014/0030846 A1 | 1/2014 | Akimoto et al. | |
| 2014/0119092 A1 | 5/2014 | Kurokawa | |
| 2014/0193946 A1 | 7/2014 | Yamazaki et al. | |
| 2014/0231803 A1 | 8/2014 | Yamazaki | |
| 2014/0246673 A1 | 9/2014 | Akimoto et al. | |
| 2014/0339555 A1 | 11/2014 | Yamazaki | |

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 10-285014 A | 10/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 A | 10/2009 |
| JP | 2010-016347 A | 1/2010 |
| JP | 4415062 B1 | 2/2010 |
| JP | 2010-067954 A | 3/2010 |
| JP | 2010-177431 A | 8/2010 |
| JP | 4571221 B1 | 10/2010 |
| JP | 2011-172214 A | 9/2011 |
| JP | 2011-243745 | 12/2011 |
| JP | 2011-243745 A | 12/2011 |
| JP | 2012-160679 A | 8/2012 |
| WO | 2004/114391 A1 | 12/2004 |
| WO | 2008/133345 A1 | 11/2008 |
| WO | 2011/089808 A1 | 7/2011 |

OTHER PUBLICATIONS

Orita, M et al., "Amorphous transparent conductive oxide InGaO3(ZnO)m (m<4):a Zn4s conductor," Philosophical Magazine, 201, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (PCT Application No. PCT/JP2013/077689) dated Dec. 24, 2013, 3 pages.

Written Opinion (PCT Application No. PCT/JP2013/077689) dated Dec. 24, 2013, 4 pages.

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English Translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.
Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ihun Song et al.; "Short Channel Characteristics of Gallium—Indium—Zinc—Oxide Thin Film Transistors for Three Dimensional Stacking Memory"; IEEE Electron Device Letters; Jun. 1, 2008; pp. 549-552; vol. 29, No. 6.
Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.
Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.
Shoji Shukuri et al.; "A Semi-Static Complementary Gain Cell Technology for Sub-1 V Supply DRAM's"; IEEE Transactions on Electron Devices; Jun. 1, 1994; pp. 926-931, vol. 41, No. 6.
Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.
Ki Chul Chun et al.; "A 3T Gain Cell Embedded DRAM Utilizing Preferential Boosting for High Density and Low Power On-Die Caches"; IEEE Journal of Solid-State Circuits; 2011; pp. 1495-1505; vol. 46, No. 6.
T. Naito et al.; "World's first monolithic 3D-FPGA with TFT SRAM over 90nm 9 layer Cu CMOS"; 2010 Symposium on VLSI Technology : Digest of Technical Papers; Jun. 15, 2010; pp. 219-220.
Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.
Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with English translation.

* cited by examiner

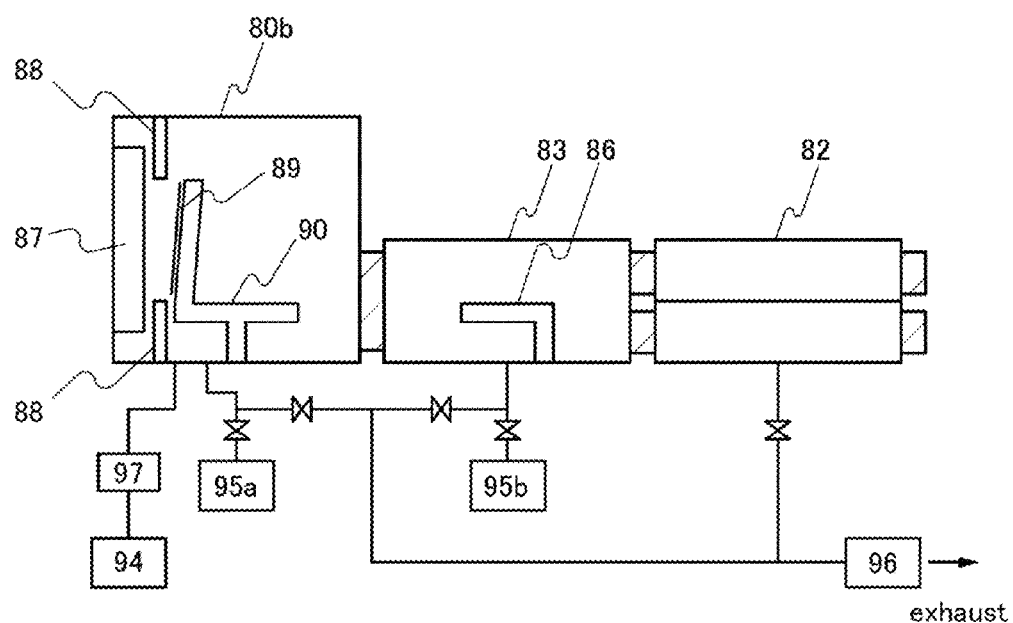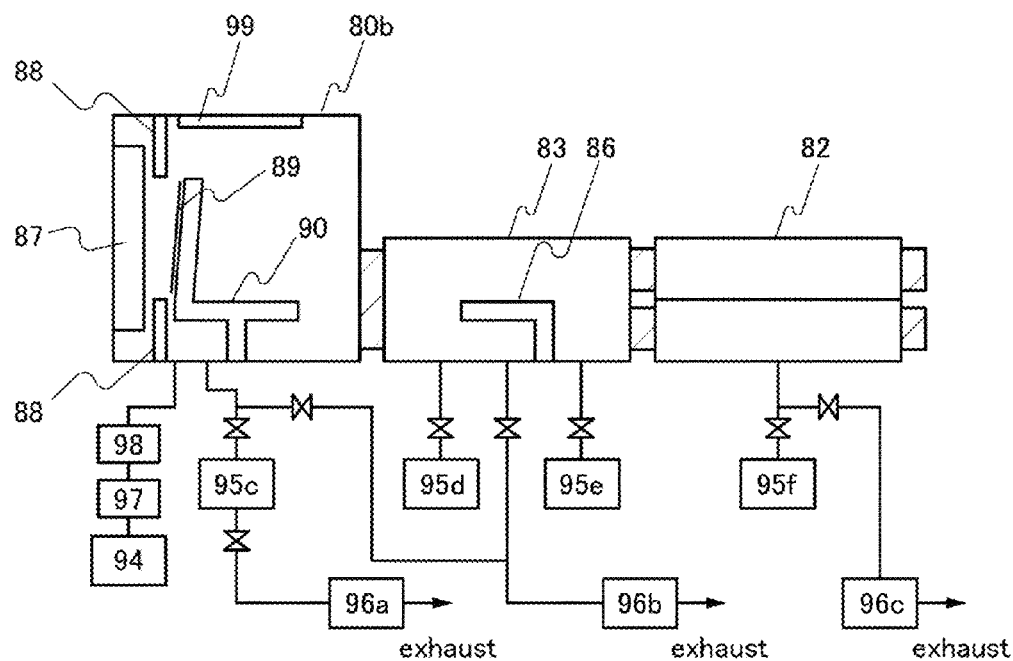

FIG. 29A
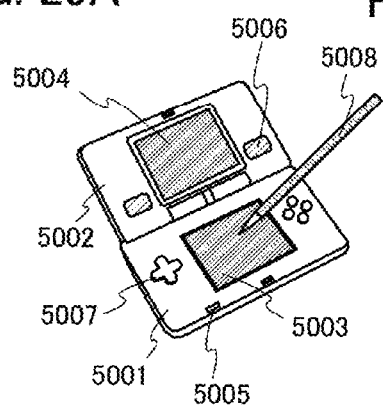
FIG. 29B
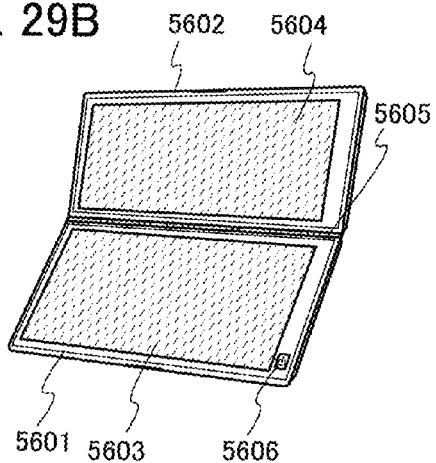
FIG. 29C
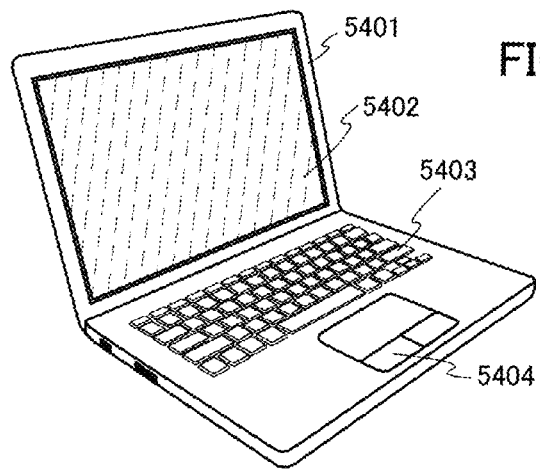
FIG. 29D
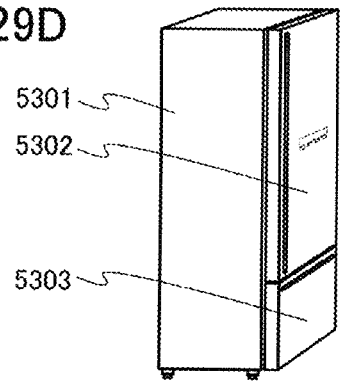
FIG. 29E
FIG. 29F
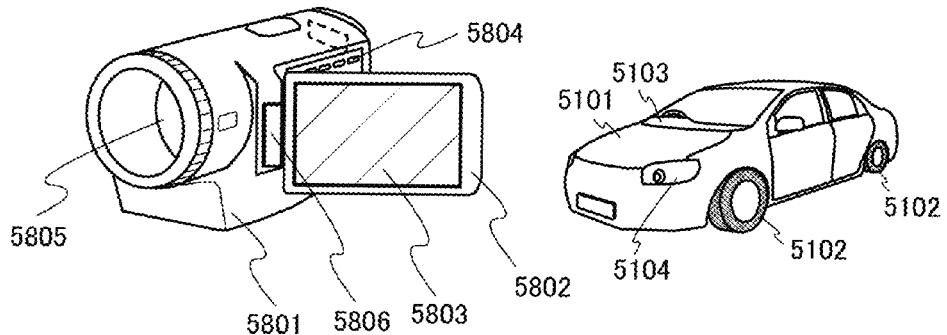

PROGRAMMABLE LOGIC DEVICE

TECHNICAL FIELD

The present invention relates to a semiconductor device and particularly to a programmable logic device and a semiconductor device including the programmable logic device. The present invention also relates to an electronic device including the semiconductor device.

BACKGROUND ART

Unlike a normal integrated circuit in which all circuits are fixed at the time of manufacture, a programmable logic device (PLD) can function with an intended circuit structure set by a user at the time of actual use after shipment. Examples of such devices that are programmable by users are small ones such as a programmable array logic (PAL) and a generic array logic (GAL) and large ones such as a complex programmable logic device (CPLD) and a field programmable gate array (FPGA); in this specification, such devices are collectively called a programmable logic device (hereinafter referred to as PLD).

PLDs have advantages such as a short development period and flexibility in changing design specifications over conventional application specific integrated circuits (ASICs). Thus, the use of PLDs for semiconductor devices has been promoted in recent years.

A PLD is composed of, for example, a plurality of logic elements (also referred to as logic blocks) and wirings between the logic elements. A function of the PLD can be changed by changing a function of the logic elements. Moreover, a function of the PLD can be changed by changing an electrical connection relation between logic elements.

The logic element is composed of a lookup table (LUT) and a multiplexer, for example. A function of the logic element can be specified by setting a given value in a memory element that stores data of the lookup table. Further, a function of the logic element can be specified by setting a given value in a memory element that stores information on selection of signals input to the multiplexer.

The wirings between the logic elements are constituted using, for example, a connection switch capable of controlling connections between plural wirings and plural wirings. The electrical connection relation of the wirings between the logic elements can be specified by setting a given value in a memory element that stores data on the on/off state of the connection switch.

Information including the data of a lookup table, the information on selection of signals input to a multiplexer, and the data on the on/off state of a connection switch is referred to as configuration data. A memory element storing configuration data is referred to as a configuration memory. Setting configuration data in a configuration memory is called "configuration". In particular, setting new configuration data (updating configuration data) in a configuration memory is called "reconfiguration". The circuit structure of the PLD can be changed in response to a user's request by producing (programming) intended configuration data and performing configuration.

The PLD generally performs configuration (static configuration) while the operation of a semiconductor device including the PLD is stopped. In contrast, to further exploit the features of the PLD, a technique of performing configuration (dynamic configuration) while the semiconductor device operates has attracted attention. Specifically, plural pieces of configuration data corresponding to a plurality of circuit structures (contexts) are prepared, and circuit functions are switched. Such a PLD can be called a multi-context PLD.

For dynamic configuration in Patent Document 1, each piece of configuration data corresponding to a plurality of circuit structures is stored at a different address in a dynamic random access memory (DRAM), and a configuration memory is composed of a static random access memory (SRAM). Patent Document 1 suggests a method of performing configuration in a short time by reading configuration data on an intended circuit structure from the address of the DRAM and writing the configuration data into the SRAM, which is the configuration memory.

REFERENCE

Patent Document 1: Japanese Published Patent Application No. H10-285014

DISCLOSURE OF INVENTION

However, with the structure disclosed in Patent Document 1, regular refresh operation is required to maintain configuration data in the DRAM, and the power consumption is increased as a result. Since the DRAM is a volatile memory, it is necessary to store data in the DRAM every time the PLD is powered on. For this reason, a nonvolatile memory is needed to store configuration data. In addition, a step of transferring a large volume of data from the nonvolatile memory to the DRAM is required every time the PLD is powered on; thus, the startup time is increased.

When an SRAM is used as the configuration memory, at least four transistors are required, which leads to a significant increase in the number of elements in the entire PLD and an increase in the circuit area.

In view of the above, an object of one embodiment of the present invention is to provide a PLD that achieves high-speed configuration capable of dynamic configuration, consumes less power, and has a short startup time.

Another object is to provide a PLD with a smaller circuit area than a PLD using an SRAM as a configuration memory.

In light of the above objects, one embodiment of the present invention provides a high-performance PLD that can be reconfigured during the operation with a smaller number of transistors per bit and a shorter time necessary to switch configuration data, as a PLD including a nonvolatile memory capable of storing plural pieces of configuration data.

The nonvolatile memory stores configuration data by controlling the amount of charge at a storage node with a transistor having extremely low off-state current. With this structure, charge can be held, and a nonvolatile memory can be easily achieved.

Specifically, a channel formation region of the transistor included in the nonvolatile memory contains a semiconductor material having a wider bandgap and lower intrinsic carrier density than silicon. With a channel formation region containing a semiconductor material having such characteristics, a transistor with extremely low off-state current can be achieved. An example of the semiconductor material is an oxide semiconductor, which has a bandgap about three times as wide as that of silicon. A transistor including the above semiconductor material can have much lower off-state current than a transistor including a normal semiconductor material such as silicon or germanium.

A transistor using an oxide semiconductor has a problem in that carriers are generated by entry of impurities such as hydrogen and moisture or impurities from an insulating film in contact with the oxide semiconductor into the oxide semiconductor film and as a result, electrical characteristics of the transistor vary. In view of this problem, an oxide is formed in contact with the oxide semiconductor so that a multilayer film including the oxide semiconductor and the oxide is formed. With such a multilayer structure, interface scattering is unlikely to occur at the interface between the oxide and the oxide semiconductor. Thus, motion of carriers is not impeded at the interface, resulting in higher electric-field mobility of the transistor. In addition, the formation of the oxide in contact with the oxide semiconductor can prevent impurities from entering the oxide semiconductor film, so that the transistor including the oxide semiconductor can have stable electrical characteristics and thus a high-performance PLD including the transistor can be provided. The details will be described below.

One embodiment of the present invention is a programmable logic device including a plurality of logic elements arranged in an array, and a switch configured to select electrical connection between the logic elements. The switch includes a first transistor including a multilayer film including an oxide layer and an oxide semiconductor layer; a node brought into a floating state when the first transistor is turned off; and a second transistor including a source and a drain, conduction between which is determined based on configuration data held at the node.

Another embodiment of the present invention is a programmable logic device including a plurality of logic elements arranged in an array, and a switch configured to select electrical connection between the logic elements. The switch includes a plurality of groups each having a first transistor including a multilayer film including an oxide layer and an oxide semiconductor layer; a node brought into a floating state when the first transistor is turned off; and a second transistor including a source and a drain, conduction between which is determined based on configuration data held at the node. The second transistors included in the groups are electrically connected in parallel with each other. Selecting one of the groups sets the on/off state of the switch and sets electrical connection between the logic elements.

In the above structures, each of the groups is specifically configured as follows, for example. A gate of the first transistor is electrically connected to a first wiring. One of a source and a drain of the first transistor is electrically connected to a second wiring. The other of the source and the drain of the first transistor is electrically connected to a gate of the second transistor and one of a pair of electrodes of a capacitor. One of the source and the drain of the second transistor is electrically connected to an input terminal of the switch. The other of the source and the drain of the second transistor is electrically connected to an output terminal of the switch. The other of the pair of electrodes of the capacitor is electrically connected to a third wiring.

In each of the above structures, the multilayer film preferably includes a first oxide layer, the oxide semiconductor layer in contact with the first oxide layer, and a second oxide layer in contact with the oxide semiconductor layer.

In each of the above structures, it is preferable that the oxide semiconductor layer include indium and be provided in contact with the oxide semiconductor layer. Moreover, it is preferable that the oxide layer have a larger energy gap than the oxide semiconductor layer and include indium.

In each of the above structures, it is preferable that the energy of the bottom of the conduction band of the oxide layer be closer to the vacuum level than that of the oxide semiconductor layer. It is further preferable that the energy of the bottom of the conduction band of the oxide layer be closer to the vacuum level than that of the oxide semiconductor layer by 0.05 eV or more and 2 eV or less.

In each of the above structures, it is preferable that a channel be formed mainly in the oxide semiconductor layer. It is preferable that the oxide semiconductor layer and the oxide layer be an In-M-Zn oxide (M is Al, Ti, Ga, Y, Zr, La, Ce, Nd, or Hf) and that the atomic ratio of In to M of the oxide layer be lower than that of the oxide semiconductor layer. It is further preferable that the oxide semiconductor layer be an In—Zn oxide, an In—Ga oxide, or an In—Ga—Zn oxide.

The present invention can provide a PLD that achieves high-speed configuration capable of dynamic configuration, consumes less power, and has a short startup time.

Moreover, it is possible to provide a PLD that has a smaller number of transistors or a smaller circuit area than a PLD using an SRAM as a configuration memory.

BRIEF DESCRIPTION OF DRAWINGS

In the accompanying drawings:

FIGS. 19A and 19B are cross-sectional views each illustrating an example of a deposition chamber;

FIGS. 29A to 29F each illustrate an electronic device; and

BEST MODE FOR CARRYING OUT THE INVENTION

Hereinafter, embodiments of the invention disclosed in this specification will be described in detail with reference to the accompanying drawings. Note that the invention disclosed in this specification is not limited to the following description, and it is easily understood by those skilled in the art that modes and details can be variously changed. The invention disclosed in this specification is not construed as being limited to the description of the following embodiments.

Note that ordinal numbers such as first and second are used for convenience and do not indicate a unique name as an item for specifying the invention in this specification.

The terms "electrically connected" and "electrical connection" include the case where components are connected through an object having any electric function. There is no particular limitation on an object having any electric function as long as electric signals can be transmitted and received between the components connected through the object. Examples of an object having any electric function are a switching element such as a transistor, a resistor, an inductor, a capacitor, and an element with a variety of functions as well as an electrode and a wiring.

Embodiment 1

In Embodiment 1, one embodiment of a PLD will be described with reference to FIGS. 1A and 1B, FIG. 2, FIG. 3, and FIG. 4.

Figure 1A:
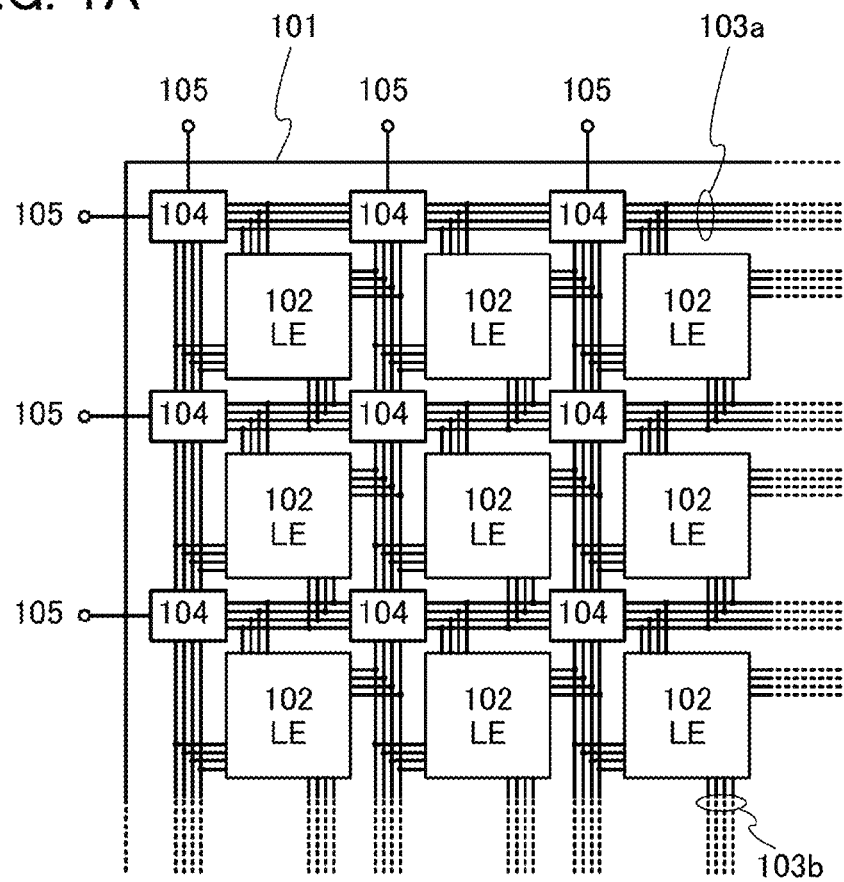
FIGS. 1A and 1B are circuit diagrams illustrating one embodiment of a semiconductor device.

FIG. 1A conceptually illustrates part of a logic array in the PLD. A logic array 101 includes a plurality of logic elements 102 arranged in an array (the logic element is denoted by LE in FIG. 1A). Here, the term "arranged in an array" means that the logic elements are arranged at regular intervals, and the arrangement is not limited to that illustrated in FIG. 1A.

A plurality of wirings are formed to surround the logic elements 102. In FIG. 1A, these wirings consist of a plurality of horizontal wiring groups 103a and a plurality of vertical wiring groups 103b. A wiring group is a bundle of wirings, and for example is a bundle of four wirings as illustrated in FIG. 1A. A switch box 104 is provided at an intersection of the horizontal wiring group 103a and the vertical wiring group 103b. The horizontal wiring groups 103a and the vertical wiring groups 103b are electrically connected to output terminals 105 to transmit and receive signals to and from a circuit provided outside the logic array 101.

Input terminals and output terminals of the plurality of logic elements 102 are electrically connected to the horizontal wiring groups 103a and the vertical wiring groups 103b provided around the logic elements 102. For example, the logic element 102 illustrated in FIG. 1A has four terminals on each of the left, right, top, and bottom sides, and the upper and left terminals can serve as input terminals and the right and lower terminals can serve as output terminals. With the use of these input and output terminals, each of the logic elements 102 can be electrically connected to other logic elements 102.

Figure 1B:
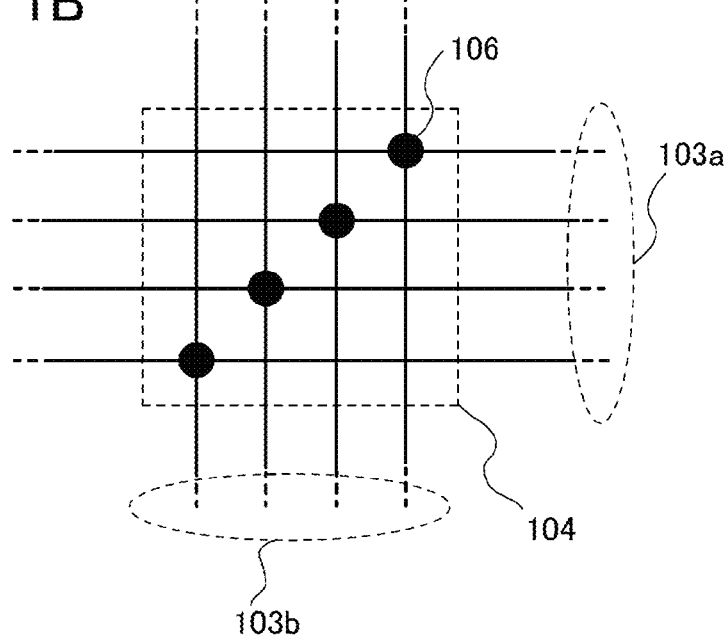

An electrical connection relation between a given logic element 102 and another logic element 102 is determined by a programmable switch provided in the switch box 104. FIG. 1B is an enlarged view of the switch box 104. For example, when the horizontal wiring group 103a and the vertical wiring group 103b each consist of four wirings, there are 16 intersections of the horizontal wiring group 103a and the vertical wiring group 103b. If a switch group 106 is provided at all the intersections, there are significant disadvantages such as signal delay, increase in chip area, and increase in cost. In view of these disadvantages, for example, as illustrated in FIG. 1B, the switch group 106 is provided only at intersections placed diagonally among the 16 intersections.

Figure 2:
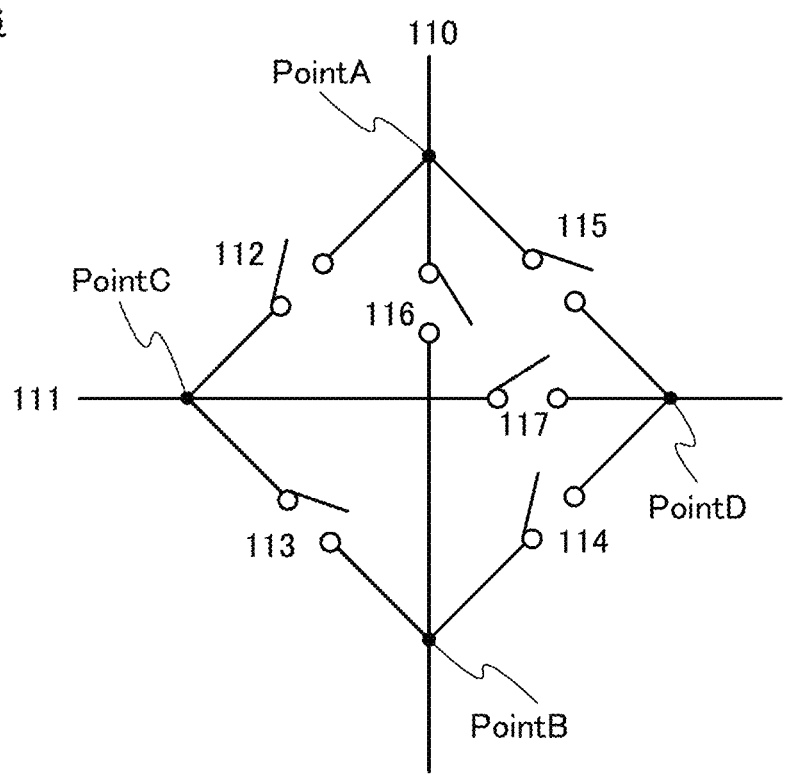
FIG. 2 is a circuit diagram illustrating one embodiment of a semiconductor device.

The switch group 106 is composed of a plurality of switches. FIG. 2 illustrates a structure of the switch group 106. The switch group 106 is provided at an intersection of one wiring 111 included in the horizontal wiring group 103a and one wiring 110 included in the vertical wiring group 103b in FIG. 1B. The switch group 106 has a function of controlling connection between the wiring 111 in the horizontal wiring group 103a and the wiring 110 in the vertical wiring group 103b. Specifically, the switch group 106 includes switches 112 to 117. The switch 112 has a function of controlling electrical connection between a point A of the wiring 110 and a point C of the wiring 111. The switch 113 has a function of controlling electrical connection between a point B of the wiring 110 and the point C of the wiring 111. The switch 115 has a function of controlling electrical connection between the point A of the wiring 110 and a point D of the wiring 111. The switch 114 has a function of controlling electrical connection between the point B of the wiring 110 and the point D of the wiring 111. The switch 116 has a function of controlling electrical connection between the point A and the point B of the wiring 110. The switch 117 has a function of controlling electrical connection between the point C and the point D of the wiring 111.

The switches 112 to 117 each store configuration data, and the on/off state of each of the switches 112 to 117 is selected in accordance with the configuration data.

(Structure of Switch 200)

Figure 3:
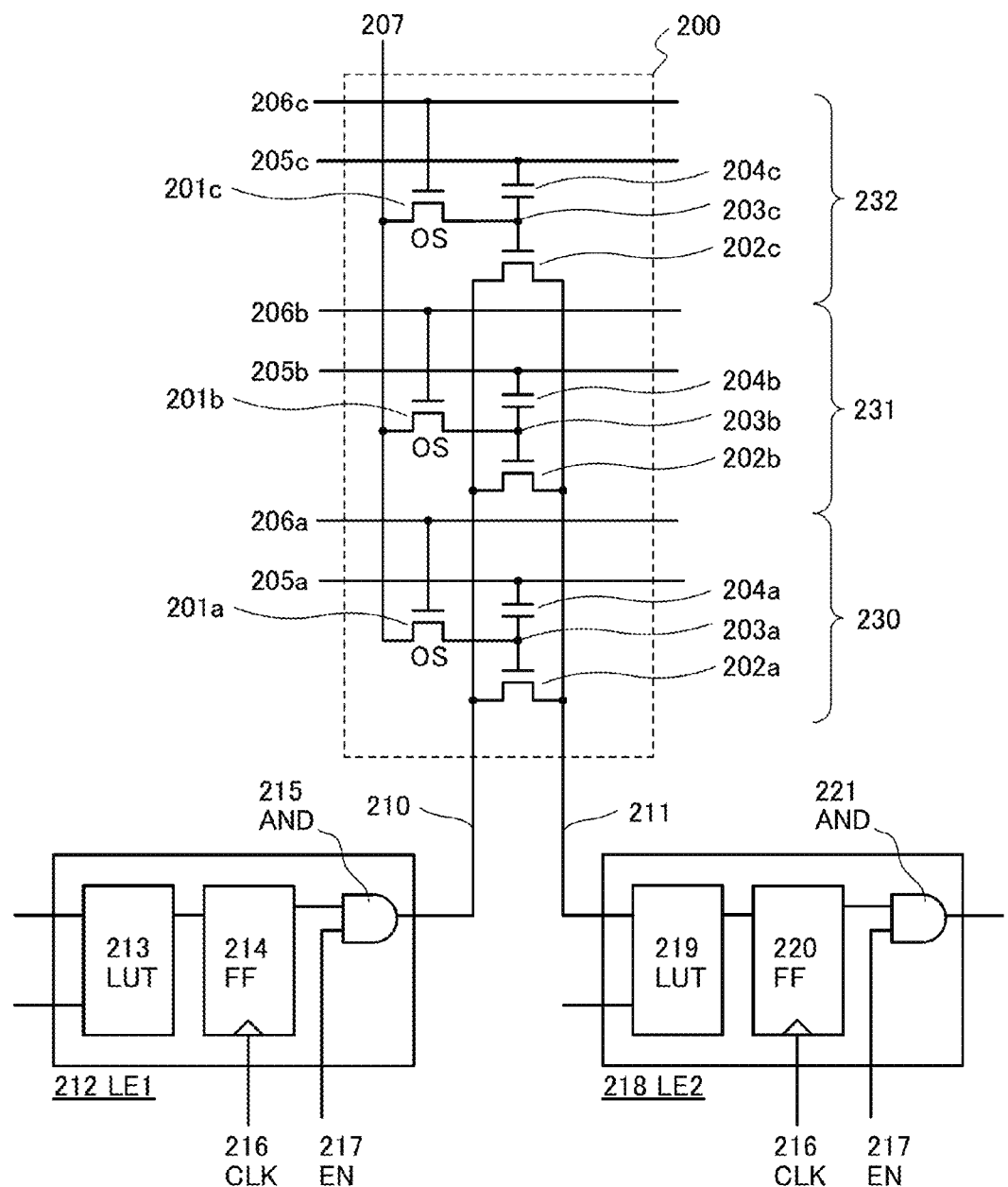
FIG. 3 is a circuit diagram illustrating one embodiment of a semiconductor device.

FIG. 3 illustrates a switch 200 of this embodiment. The switch 200 controls connection between a logic element 212 (denoted by LE1 in FIG. 3) and a logic element 218 (denoted by LE2 in FIG. 3) in a PLD. Each of the logic elements 212 and 218 includes a combinational circuit, a flip-flop, a logic element, and/or the like. A combinational circuit is composed of a lookup table, an AND-OR circuit, or the like and can be reconfigured in accordance with configuration data. For example, in FIG. 3, the logic element 212 includes a lookup table 213, a flip-flop 214, and an AND circuit 215, and the logic element 218 includes a lookup table 219, a flip-flop 220, and an AND circuit 221. The same clock signal is input to the flip-flops 214 and 220 from a wiring 216 and used for synchronization of the logic elements 212 and 218. The same enable signal is input to the AND circuits 215 and 221 from a wiring 217.

The switch 200 is composed of a circuit having three groups each including a first transistor, a second transistor, and a capacitor. For the first transistor, a semiconductor material that has a wider bandgap and lower intrinsic carrier density than silicon is used. An example of such a material is an oxide semiconductor. In FIG. 3, the symbol "OS" representing an oxide semiconductor is given below the transistors including an oxide semiconductor. An oxide semiconductor is used for a channel formation region of the first transistor. Meanwhile, the second transistor is preferably a transistor that uses a semiconductor material such as silicon for a channel formation region and thus can operate at higher speed than the first transistor. In this embodiment, the second transistor is specifically an n-channel transistor.

Moreover, the first transistor is formed using a multilayer film containing an oxide semiconductor used for the channel formation region and an oxide provided in contact with the oxide semiconductor. Such a structure enables the first transistor to have stable electrical characteristics.

As illustrated in FIG. 3, the switch 200 specifically includes first transistors 201a, 201b, and 201c, second transistors 202a, 202b, and 202c, and capacitors 204a, 204b, and 204c. Gates of the first transistors 201a, 201b, and 201c are electrically connected to respective wirings 206a, 206b, and 206c. A write signal is input to the wirings 206a to 206c. Sources of the first transistors 201a to 201c are electrically connected to one wiring 207. A write data signal is input to the wiring 207. Drains of the first transistors 201a, 201b, and 201c are electrically connected to respective gates of the second transistors 202a, 202b, and 202c. The drains of the first transistors 201a, 201b, and 201c are also electrically connected to one of a pair of electrodes of the capacitor 204a, one of a pair of electrodes of the capacitor 204b, and one of a pair of electrodes of the capacitor 204c, respectively. The second transistors 202a to 202c are electrically connected in parallel with each other. That is, sources of the second transistors 202a to 202c are connected to each other, and drains of the second transistors 202a to 202c are connected to each other. The sources of the second transistors 202a to 202c are electrically connected to an output terminal of the logic element 212 through a wiring 210. The drains of the second transistors 202a to 202c are electrically connected to an input terminal of the logic element 218 through a wiring 211. The other of the electrodes of the capacitor 204a is electrically connected to a wiring 205a to which a selection signal is input. The other of the electrodes of the capacitor 204b is electrically connected to a wiring 205b to which a selection signal is input. The other of the electrodes of the capacitor 204c is electrically connected to a wiring 205c to which a selection signal is input. Here, a point where the drain of the first transistor 201a is electrically connected to the gate of the second transistor 202a and the one of the electrodes of the capacitor 204a is referred to as a node 203a. A point where the drain of the first transistor 201b is electrically connected to the gate of the second transistor 202b and the one of the electrodes of the capacitor 204b is referred to as a node 203b. A point where the drain of the first transistor 201c is electrically connected to the gate of the second transistor 202c and the one of the electrodes of the capacitor 204c is referred to as a node 203c. Configuration data is stored at the nodes 203a to 203c.

In this manner, the switch 200 of this embodiment consists of three groups 230, 231, and 232 each including the first and second transistors and the capacitor.

An output signal of the logic element 212 is output to the wiring 210, supplied to the wiring 211 through the switch 200, and input to the logic element 218.

When the potentials of the wirings 206a to 206c are set high ("H") and a potential corresponding to "H" or low ("L") is supplied to the wiring 207, charge corresponding to the potential of the wiring 207 can be stored at the nodes 203a to 203c. Note that at this time, at least one of the wirings 210 and 211 is preferably set "L".

Here, with the use of transistors with extremely low off-state current as the first transistors 201a to 201c, the charges stored at the nodes 203a to 203c can be kept constant, that is, inputted data can be stored while the wirings 206a to 206c are at "L". When the wirings 206a to 206c are set "L" and the wirings 205a to 205c are set "H", the on/off states of the second transistors 202a to 202c are changed in accordance with the charges stored at the respective nodes 203a to 203c. In other words, by selecting one of the wirings 205a to 205c, the on/off state of the switch 200 can be switched instantly in accordance with the charge stored at the node 203a, the node 203b, or the node 203c.

Relating the charges stored at the nodes 203a, 203b, and 203c to first configuration data, second configuration data, and third configuration data enables switching of configuration data by switching a conducting wiring between the wirings 205a, 205b, and 205c.

Such a structure can reduce time for reading data from a memory device that stores plural pieces of configuration data. Consequently, the PLD in which configuration data can be switched at high speed can be provided.

A latch is preferably provided to connect the wiring 211 because the potential of a signal passing through the switch 200 is sometimes lowered in accordance with the resistance of the switch 200. The latch can be composed of an inverter and a pull-up transistor.

Although FIG. 3 shows the case where one switch is provided between the logic elements, a plurality of switches can be connected in series between the logic elements. Alternatively, a cross-point switch that controls connection between plural wirings and plural wirings can be formed by applying the structure in FIG. 3. When a signal passes through a plurality of switches, the potential of the signal is sometimes lowered in accordance with the resistance of the switches.

Figure 12A:
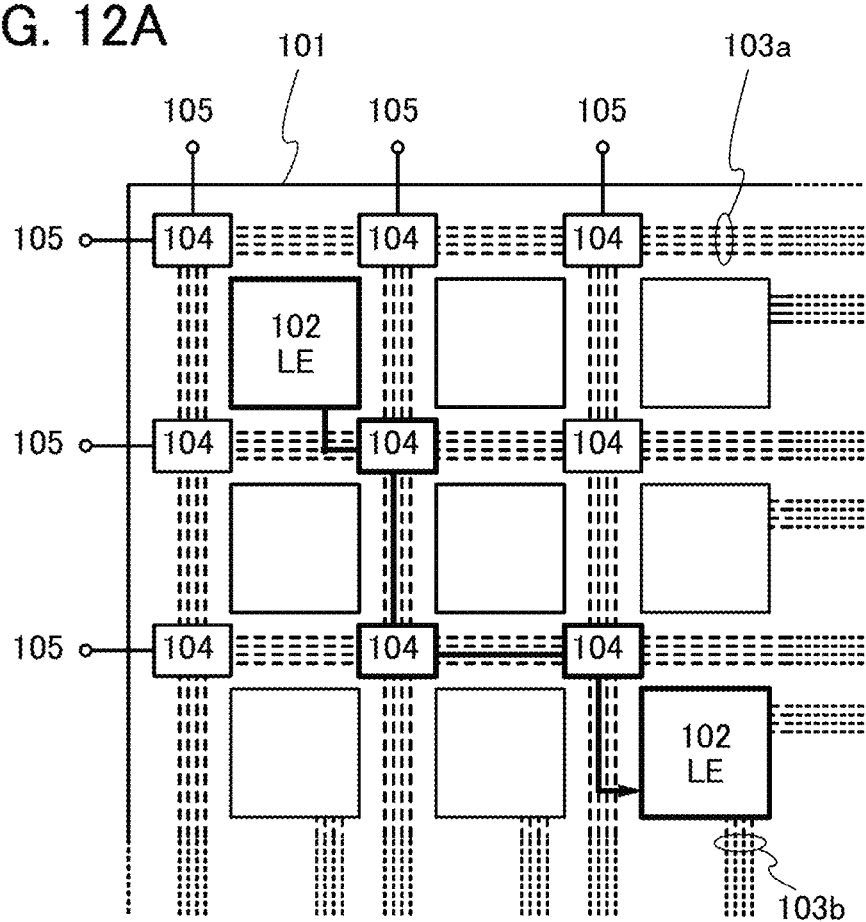
FIGS. 12A to 12C are circuit diagrams illustrating one embodiment of a semiconductor device.

As an example, FIG. 12A illustrates the case where a plurality of switches are placed between logic elements. By setting configuration data, the upper-left logic element 102 can be electrically connected to the lower-right logic element 102, for example. In this case, these logic elements 102 are electrically connected to each other through three switch boxes 104; thus, a signal passes through at least three switches connected in series. In order to prevent the decrease in potential of the signal due to the switch resistance, latches are preferably positioned at every predetermined number of switches.

Figure 12B:
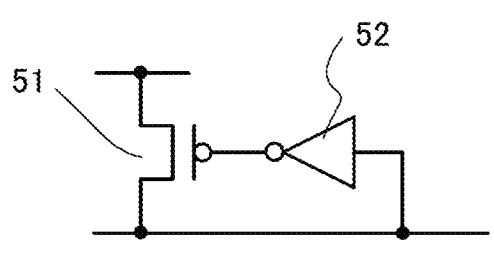
Figure 12C:
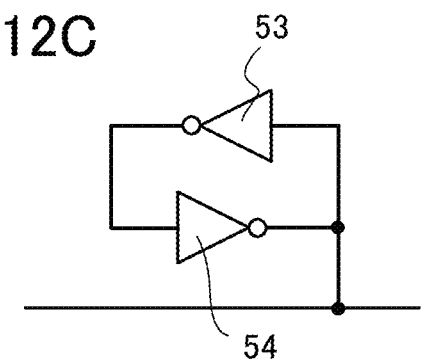

As illustrated in FIG. 12B, the latch can be configured by electrically connecting an output terminal of an inverter 52 to an input terminal of a pull-up transistor 51. Moreover, as illustrated in FIG. 12C, the latch can be configured by connecting an output terminal of an inverter 54 to an input terminal of an inverter 53 and connecting an input terminal of the inverter 54 to an output terminal of the inverter 53.

(Operation of Switch 200)

Next, an example of a method of operating the switch 200 illustrated in FIG. 3 will be described with reference to a timing chart in FIG. 4.

Here, as an example, the potentials of the wirings 206a to 206c at "H" are +V and the potentials of the wirings 206a to 206c at "L" are −V. The potentials of the wirings 205a to 205c at "H" are +V and the potentials of the wirings 205a to 205c at "L" are 0. The potential of the wiring 207 at "H" is +V and the potential of the wiring 207 at "L" is 0. The potentials of the wirings 210, 211, 216, and 217 at "H" are +V and the potentials of the wirings 210, 211, 216, and 217 at "L" are 0.

An initial state is assumed to be such that the wiring 205c is at "H" and the potential of the node 203c is +V. In other words, the on/off state of the switch 200 is determined in accordance with the third configuration data, and the switch 200 is on in the initial state. Further, the potentials of the nodes 203a and 203b are −V in the initial state.

First, write of configuration data (time T1 to time T6) is described.

At the time T2, the wirings 206a and 205a are set "H", the wiring 217 is set "L", and the wiring 207 is "L". At this time, the potential of the node 203a becomes 0; this potential corresponds to a potential for turning off the switch 200. That is, this state corresponds to a state where the switch 200 stores "L" as the first configuration data. Note that the output of the logic element 212 is "L".

At the time T3, the wirings 206a and 205a are set "L". At this time, the potential of the node 203a becomes −V.

At the time T5, the wirings 206b and 205b are set "H", the wiring 217 is set "L", and the wiring 207 is "H". At this time, the potential of the node 203b becomes +V; this potential corresponds to a potential for turning on the switch 200. That is, this state corresponds to a state where the switch 200 stores "H" as the second configuration data. Note that the output of the logic element 212 is "L".

At the time T6, the wirings 206b and 205b are set "L". At this time, the potential of the node 203b becomes 0.

Note that it is preferable that write of configuration data be started as soon as possible after the time T1 and the time T4 at a positive edge of the clock signal input to the wiring 216 and be finished in as short time as possible. Specifically, it is preferable that write of configuration data be started after the hold time of the flip-flop passes from the time T1 and the time T4. With such a structure, configuration data can be rewritten without disturbing the operation of the PLD.

Next, switching of configuration data (time T7 to time T10) is described.

At the time T8, the wiring 205a is set "H" and the wiring 205c is set "L". At this time, the potential of the node 203a becomes 0 and the potential of the node 203c becomes 0. Thus, the switch 200 is turned off, which means that switching to the first configuration data is completed.

At the time T10, the wiring 205a is set "L" and the wiring 205b is set "H". At this time, the potential of the node 203a becomes −V and the potential of the node 203b becomes +V. Thus, the switch 200 is turned on, which means that switching to the second configuration data is completed.

Note that it is preferable that switching of configuration data be performed as soon as possible after the time T7 and the time T9 at a positive edge of the clock signal input to the wiring 216. Specifically, it is preferable that switching of configuration data be performed after the hold time of the flip-flop passes from the time T7 and the time T9. With such a structure, configuration data can be switched without disturbing the operation of the PLD.

With the above-described structure, it is possible to provide a PLD that achieves high-speed configuration capable of dynamic configuration, consumes less power, and has a short startup time.

The first transistor included in the switch employs a multilayer structure of an oxide layer and an oxide semiconductor layer, whereby the transistor can operate stably and as a result, the PLD can have high reliability.

Figure 4:
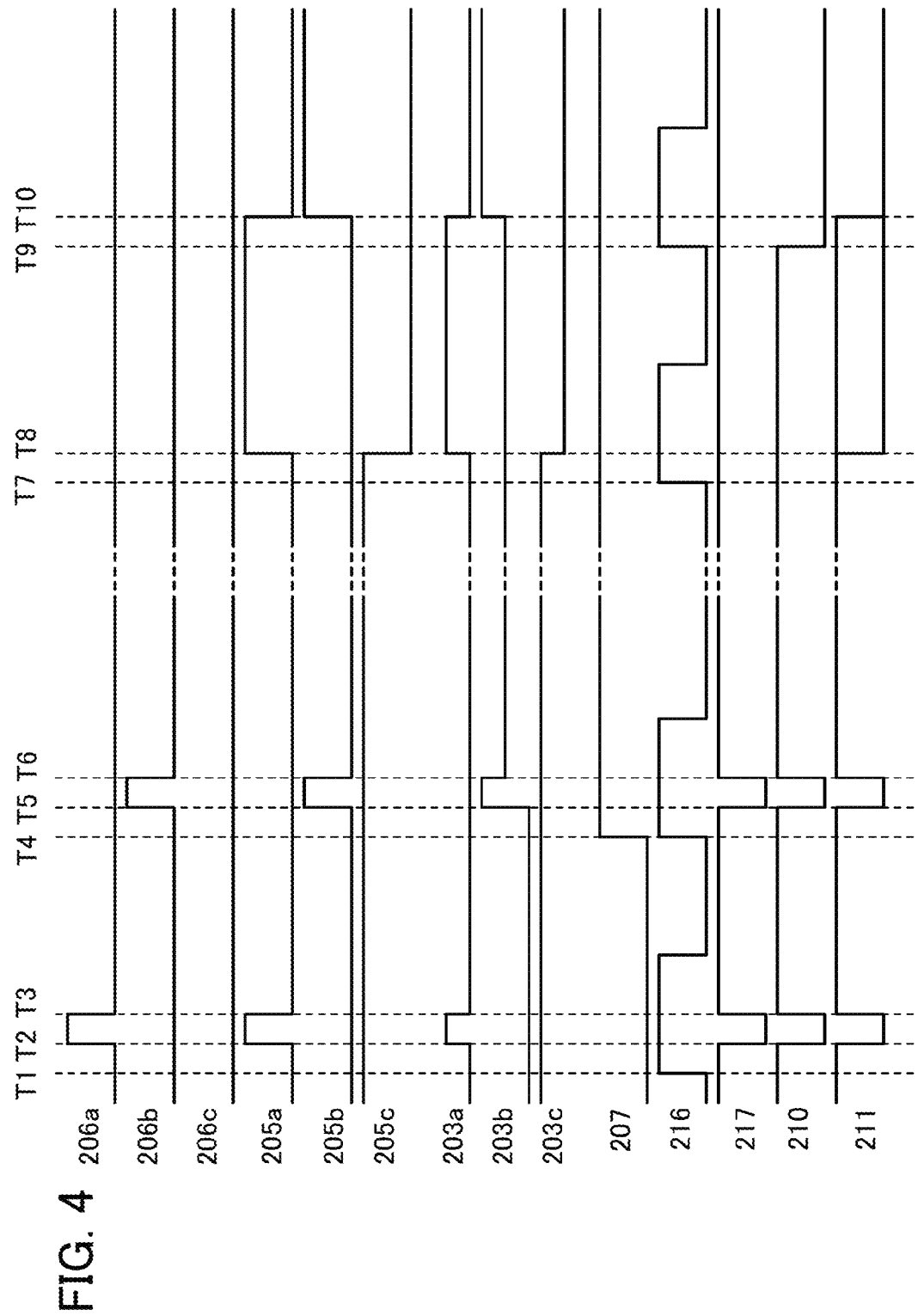
FIG. 4 is a timing chart illustrating one embodiment of circuit operation.

In the method of operating the switch 200 in FIG. 4, the potentials of the wirings 205a to 205c are changed to write configuration data into the nodes 203a to 203c. However, configuration data can be written without change in the potentials of the wirings 205a to 205c when the gate capacitance of the second transistors 202a to 202c is sufficiently larger than the source-gate capacitance and drain-gate capacitance or when an additional storage capacitor is electrically connected to the gates of the second transistors 202a to 202c and the gate capacitance and storage capacitance are sufficiently larger than the source-gate capacitance and drain-gate capacitance.

Further, in the method of operating the switch 200 in FIG. 4, an enable signal 0 is input to the wiring 217 (the output of the logic element 212 is 0) to write configuration data into the nodes 203a to 203c. However, configuration data can be written with the enable signal input to the wiring 217 remaining at 1 (without setting the output of the logic element 212 at 0) when the gate capacitance of the second transistors 202a to 202c is sufficiently larger than the source-gate capacitance and drain-gate capacitance or when an additional storage capacitor is electrically connected to the gates of the second transistors 202a to 202c and the gate capacitance and storage capacitance are sufficiently larger than the source-gate capacitance and drain-gate capacitance.

Here, to demonstrate low off-state current of a transistor whose channel is formed in an oxide semiconductor film in a multilayer film, the results of evaluating the off-state current of the transistor including the multilayer film will be shown below.

(Measurement of Off-State Current of Transistor Including Multilayer Film)

First, a measurement sample is described.

First, a base insulating film was formed over a silicon substrate. As the base insulating film, a 300-nm-thick silicon oxynitride film was formed by CVD.

Next, a first oxide film was formed over the base insulating film. The first oxide film was formed to 5 nm by sputtering using a target of an In—Ga—Zn oxide (In:Ga:Zn=1:3:2 [atomic ratio]) under the following conditions: an argon gas of 30 sccm and an oxygen gas of 15 sccm were used as the deposition gas; the pressure was 0.4 Pa; the substrate temperature was 200° C.; and a DC power of 0.5 kW was applied.

Then, an oxide semiconductor film was formed over the first oxide film. The oxide semiconductor film was formed to 15 nm by sputtering using a target of an In—Ga—Zn oxide (In:Ga:Zn=1:1:1 [atomic ratio]) under the following conditions: an argon gas of 30 sccm and an oxygen gas of 15 sccm were used as the deposition gas; the pressure was 0.4 Pa; the substrate temperature was 300° C.; and a DC power of 0.5 kW was applied.

Next, a second oxide film was formed over the oxide semiconductor film. The second oxide film was formed to 5 nm by sputtering using a target of an In—Ga—Zn oxide (In:Ga:Zn=1:3:2 [atomic ratio]) under the following conditions: an argon gas of 30 sccm and an oxygen gas of 15 sccm were used as the deposition gas; the pressure was 0.4 Pa; the substrate temperature was 200° C.; and a DC power of 0.5 kW was applied.

Then, heat treatment was performed to desorb water, hydrogen, and the like contained in the oxide semiconductor film. Here, heat treatment at 450° C. for one hour in a nitrogen atmosphere was performed, and then heat treatment at 450° C. for one hour in an oxygen atmosphere was performed.

Next, a conductive film was formed over the base insulating film and the second oxide film, a mask was formed over the conductive film by a photolithography process, and the conductive film was partly etched using the mask, so that a source electrode and a drain electrode were formed. As the conductive film to be the source and drain electrodes, a 100-nm-thick tungsten film was formed.

Subsequently, a gate insulating film was formed over the second oxide film and the source and drain electrodes. As the gate insulating film, a 30-nm-thick silicon oxynitride film was formed by CVD.

Then, a gate electrode was formed over the gate insulating film in the following manner. A 30-nm-thick tantalum nitride film was formed by sputtering, and a 135-nm-thick tungsten film was formed over the tantalum nitride film by sputtering. A mask was formed over the tungsten film by a photolithography process and the tantalum nitride film and the tungsten film were partly etched using the mask, so that the gate electrode was formed.

Next, an interlayer insulating film was formed to cover the components. As the interlayer insulating film, a 70-nm-thick aluminum oxide film was formed by sputtering and then a 300-nm-thick silicon oxynitride film was formed over the aluminum oxide film by CVD.

In the transistor, the channel length L is 0.73 μm, the channel width W is 1 cm, and the length Loff between the gate electrode and the source electrode (or the drain electrode) is 0.67 μm.

Through the above steps, the sample transistor was fabricated.

Next, the measurement results of the leakage current of the fabricated transistor will be shown.

The measurement was performed at 85° C. and 125° C. with Vgs of −4 V and Vds of 1 V in dry atmosphere and dark condition.

Figure 30:
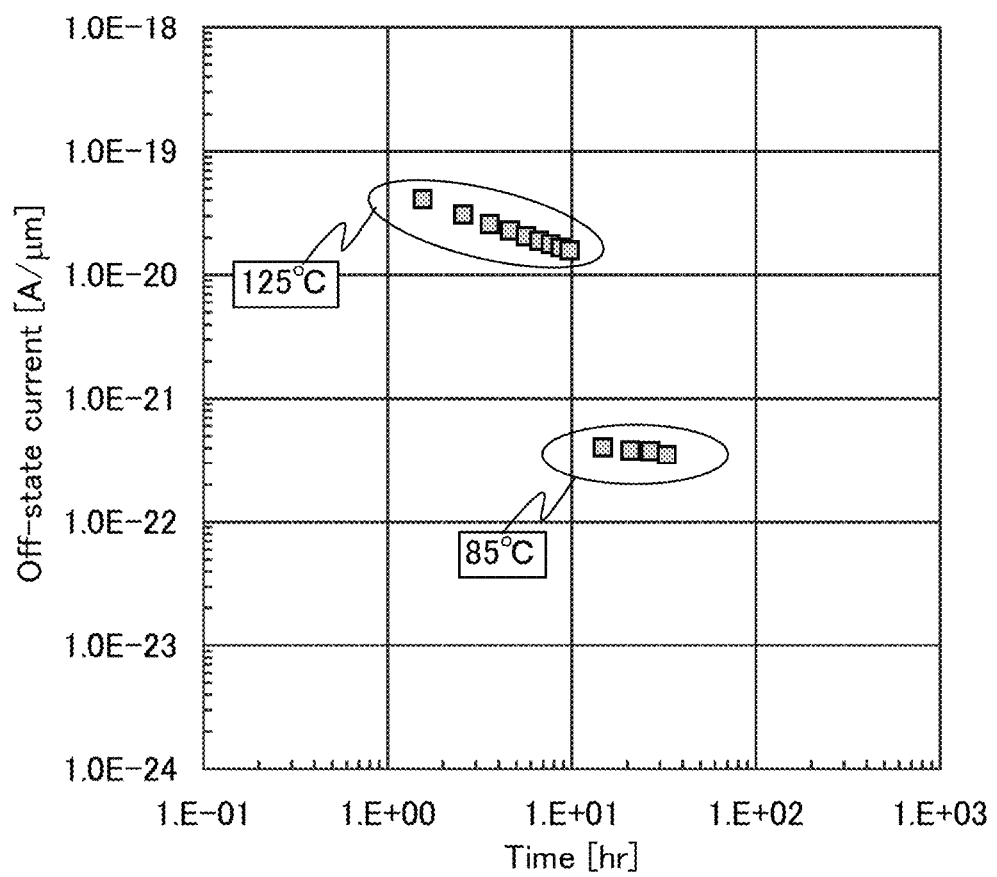
FIG. 30 shows the measurement results of off-state current of a transistor including a multilayer film.

As shown in FIG. 30, the off-state currents at 85° C. and 125° C. over time are as low as less than $1\times10^{-21}$ A/μm and less than $1\times10^{-19}$ A/μm, respectively.

The above demonstrates that the off-state current of the transistor including the multilayer film is extremely low.

As seen above, the transistor whose channel is formed in an oxide semiconductor film in a multilayer film achieves extremely low off-state current. Further, in a programmable logic device including the transistor, a configuration memory can store data for a long time.

This embodiment can be combined with any of the other embodiments as appropriate.

Embodiment 2

In Embodiment 2, a switch 300 in which the n-channel second transistors used in the switch 200 shown in Embodiment 1 are replaced with p-channel second transistors will be described with reference to FIG. 5 and FIG. 6.
(Structure of Switch 300)

Figure 5:
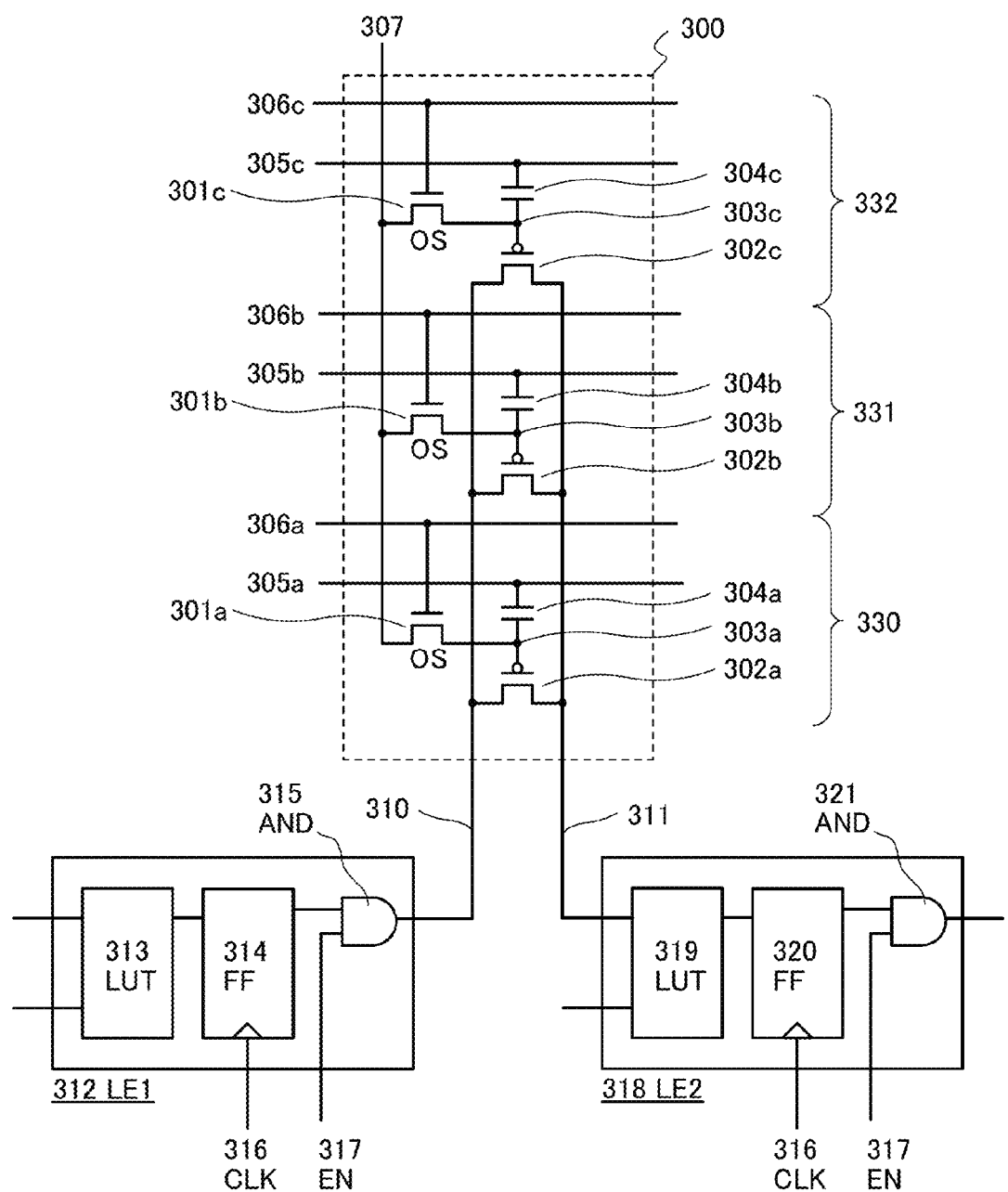
FIG. 5 is a circuit diagram illustrating one embodiment of a semiconductor device.

FIG. 5 illustrates the switch 300 of this embodiment. The structure of the switch 300 is the same as that of the switch 200 in Embodiment 1 except that the n-channel second transistors 202a to 202c are replaced with transistors with opposite polarity, that is, p-channel second transistors 302a to 302c.

The switch 300 controls connection between a logic element 312 and a logic element 318 in a PLD. For example, in FIG. 5, the logic element 312 can be composed of a lookup table 313, a flip-flop 314, and an AND circuit 315, and the logic element 318 can be composed of a lookup table 319, a flip-flop 320, and an AND circuit 321.

Like the switch 200 described in Embodiment 1, the switch 300 is composed of a circuit having three groups each including a first transistor, a second transistor, and a capacitor. For the first transistor, a semiconductor material that has a wider bandgap and lower intrinsic carrier density than silicon is used. An oxide semiconductor is used for a channel formation region of the first transistor. Meanwhile, the second transistor is preferably a transistor that uses a semiconductor material such as silicon for a channel formation region and thus can operate at higher speed than the first transistor. In this embodiment, the second transistor is specifically a p-channel transistor.

The first transistor is formed using a multilayer film containing an oxide semiconductor used for the channel formation region and an oxide provided in contact with the oxide semiconductor. Such a structure enables the first transistor to have stable electrical characteristics.

As illustrated in FIG. 5, the switch 300 specifically includes first transistors 301a, 301b, and 301c, the second transistors 302a, 302b, and 302c, and capacitors 304a, 304b, and 304c. Gates of the first transistors 301a, 301b, and 301c are electrically connected to respective wirings 306a, 306b, and 306c. A write signal is input to the wirings 306a to 306c. Sources of the first transistors 301a to 301c are electrically connected to one wiring 307. A write data signal is input to the wiring 307. Drains of the first transistors 301a, 301b, and 301c are electrically connected to respective gates of the second transistors 302a, 302b, and 302c. The drains of the first transistors 301a, 301b, and 301c are also electrically connected to one of a pair of electrodes of the capacitor 304a, one of a pair of electrodes of the capacitor 304b, and one of a pair of electrodes of the capacitor 304c, respectively. The p-channel second transistors 302a to 302c are electrically connected in parallel with each other. That is, sources of the second transistors 302a to 302c are connected to each other, and drains of the second transistors 302a to 302c are connected to each other. The sources of the second transistors 302a to 302c are electrically connected to an output terminal of the logic element 312 through a wiring 310. The drains of the second transistors 302a to 302c are electrically connected to an input terminal of the logic element 318 through a wiring 311. The other of the electrodes of the capacitor 304a is electrically connected to a wiring 305a to which a selection signal is input. The other of the electrodes of the capacitor 304b is electrically connected to a wiring 305b to which a selection signal is input. The other of the electrodes of the capacitor 304c is electrically connected to a wiring 305c to which a selection signal is input. Here, a point where the drain of the first transistor 301a is electrically connected to the gate of the second transistor 302a and the one of the electrodes of the capacitor 304a is referred to as a node 303a. A point where the drain of the first transistor 301b is electrically connected to the gate of the second transistor 302b and the one of the electrodes of the capacitor 304b is referred to as a node 303b. A point where the drain of the first transistor 301c is electrically connected to the gate of the second transistor 302c and the one of the electrodes of the capacitor 304c is referred to as a node 303c. Configuration data is stored at the nodes 303a to 303c.

In this manner, the switch 300 of this embodiment consists of three groups 330, 331, and 332 each including the first and second transistors and the capacitor.

An output signal of the logic element 312 is output to the wiring 310, supplied to the wiring 311 through the switch 300, and input to the logic element 318.

When the potentials of the wirings 306a to 306c are set high ("H") and a potential corresponding to "H" or low ("L") is supplied to the wiring 307, charge corresponding to the potential of the wiring 307 can be stored at the nodes 303a to 303c. Note that at this time, at least one of the wirings 310 and 311 is preferably set "L".

Here, with the use of transistors with extremely low off-state current as the first transistors 301a to 301c, the charges stored at the nodes 303a to 303c can be kept constant, that is, inputted data can be stored while the wirings 306a to 306c are at "L". When the wirings 306a to 306c are set "L" and the wirings 305a to 305c are set "L", the on/off states of the second transistors 302a to 302c are changed in accordance with the charges stored at the respective nodes 303a to 303c. In other words, by selecting one of the wirings 305a to 305c, the on/off state of the switch 300 can be switched instantly in accordance with the charge stored at the node 303a, the node 303b, or the node 303c.

Here, relating the charges stored at the nodes 303a, 303b, and 303c to first configuration data, second configuration data, and third configuration data enables switching of configuration data by switching a conducting wiring between the wirings 305a, 305b, and 305c.

Such a structure can reduce time for reading data from a memory device that stores plural pieces of configuration data. Thus, the PLD in which configuration data can be switched at high speed can be provided.

When a signal passes through the switch 300, the potential of the signal is sometimes lowered depending on the resistance of the switch. Latches for preventing the potential decrease can be arranged as described in Embodiment 1.

(Operation of Switch 300)

Next, an example of a method of operating the switch 300 illustrated in FIG. 5 will be described with reference to a timing chart in FIG. 6.

Here, as an example, the potentials of the wirings 306a to 306c at "H" are +V and the potentials of the wirings 306a to 306c at "L" are 0. The potentials of the wirings 305a to 305c at "H" are +V and the potentials of the wirings 305a to 305c at "L" are 0. The potential of the wiring 307 at "H" is +V and the potential of the wiring 307 at "L" is 0. The potentials of the wirings 310, 311, 316, and 317 at "H" are +V and the potentials of the wirings 310, 311, 316, and 317 at "L" are 0.

An initial state is assumed to be such that the wiring 305c is at "L" and the potential of the node 303c is 0. In other words, the on/off state of the switch 300 is determined in accordance with the third configuration data, and the switch 300 is on in the initial state. Further, the potentials of the nodes 303a and 303b are +2 V in the initial state.

First, write of configuration data (time T1 to time T6) is described.

At the time T2, the wiring 306a is set "H", the wiring 305a is set "L", the wiring 317 is set "L", and the wiring 307 is "H". At this time, the potential of the node 303a becomes +V; this potential corresponds to a potential for turning off the switch 300. That is, this state corresponds to a state where the switch 300 stores "H" as the first configuration data. Note that the output of the logic element 312 is "L".

At the time T3, the wiring 306a is set "L" and the wiring 305a is set "H". At this time, the potential of the node 303a becomes +2 V.

At the time T5, the wiring 306b is set "H", the wiring 305b is set "L", the wiring 317 is set "L", and the wiring 307 is "L". At this time, the potential of the node 303b becomes 0; this potential corresponds to a potential for turning on the switch 300. That is, this state corresponds to a state where the switch 300 stores "H" as the second configuration data. Note that the output of the logic element 312 is "L".

At the time T6, the wiring 306b is set "L" and the wiring 305b is set "H". At this time, the potential of the node 303b becomes +V.

Note that it is preferable that write of configuration data be started as soon as possible after the time T1 and the time T4 at a positive edge of the clock signal input to the wiring 316 and be finished in as short time as possible. Specifically, it is preferable that write of configuration data be started after the hold time of the flip-flop passes from the time T1 and the time T4. With such a structure, configuration data can be rewritten without disturbing the operation of the PLD.

Next, switching of configuration data (time T7 to time T10) is described.

At the time T8, the wiring 305a is set "L" and the wiring 305c is set "H". At this time, the potential of the node 303a becomes +V and the potential of the node 303c becomes +V. Thus, the switch 300 is turned off, which means that switching to the first configuration data is completed.

At the time T10, the wiring 305a is set "H" and the wiring 305b is set "L". At this time, the potential of the node 303a becomes +2 V and the potential of the node 303b becomes 0. Thus, the switch 300 is turned on, which means that switching to the second configuration data is completed.

Note that it is preferable that switching of configuration data be performed as soon as possible after the time T7 and the time T9 at a positive edge of the clock signal input to the wiring 316. Specifically, it is preferable that switching of configuration data be performed after the hold time of the flip-flop passes from the time T7 and the time T9. With such a structure, configuration data can be switched without disturbing the operation of the PLD.

With the above-described structure, it is possible to provide a PLD that achieves high-speed configuration capable of dynamic configuration, consumes less power, and has a short startup time.

The first transistor included in the switch employs a multilayer structure of an oxide layer and an oxide semiconductor layer, whereby the transistor can operate stably and the PLD can have high reliability as a result.

It is worth noting that a potential of "−V" is not needed in the switch 300 of this embodiment because the second transistor is a p-channel transistor. For this reason, the number of power supply voltages can be reduced as compared to the switch 200 described in Embodiment 1. On the other hand, since a p-channel transistor is used as the second transistor in the switch 300, the switching speed of the switch 300 might be generally lower than that of the switch 200 including the n-channel second transistor in Embodiment 1. Accordingly, it is preferable to select the switch 200 or the switch 300 as appropriate depending on the intended use.

Figure 6:
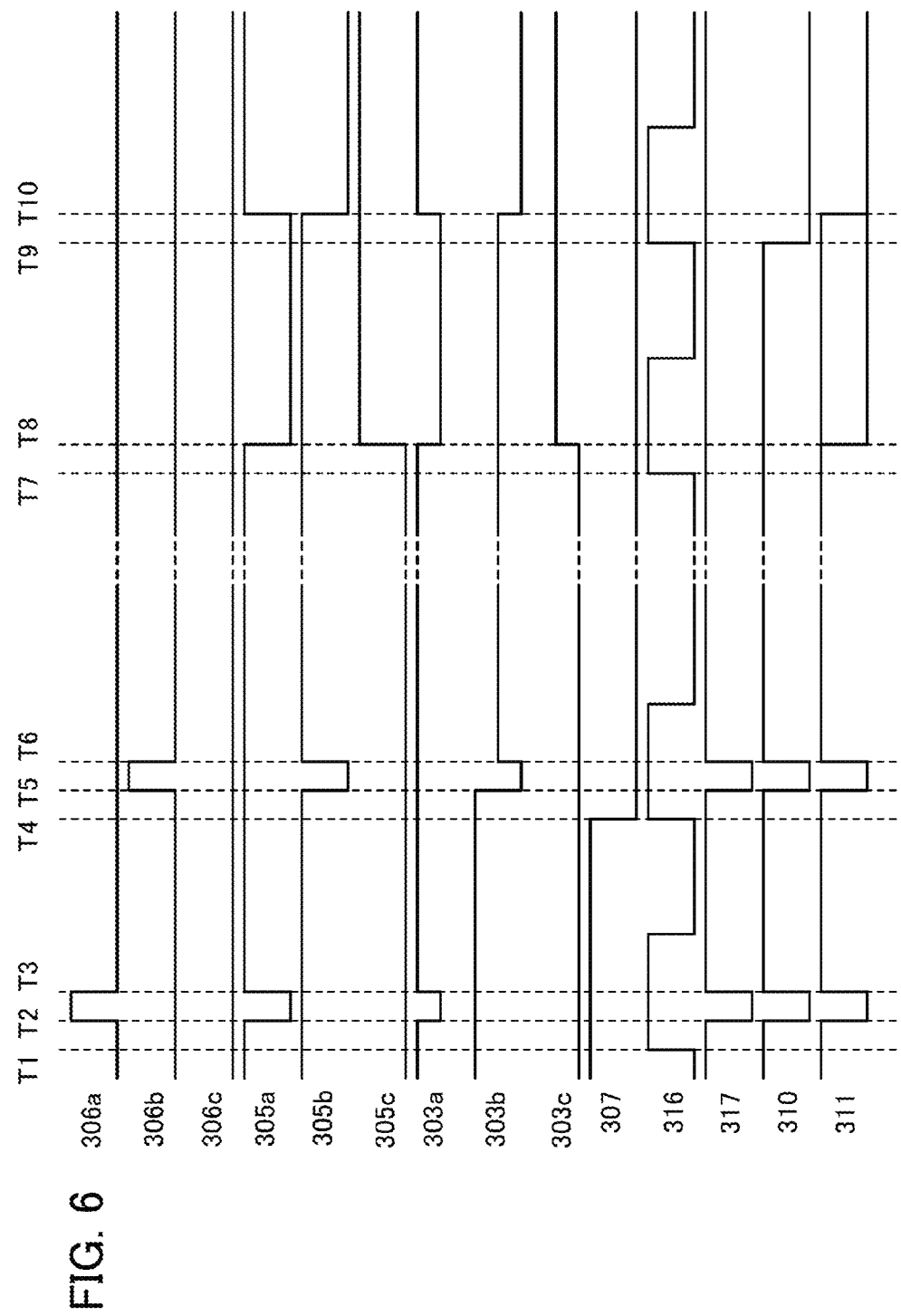
FIG. 6 is a timing chart illustrating one embodiment of circuit operation.

In the method of operating the switch 300 in FIG. 6, the potentials of the wirings 305a to 305c are changed to write configuration data into the nodes 303a to 303c. However, configuration data can be written without change in the potentials of the wirings 305a to 305c when the gate capacitance of the second transistors 302a to 302c is sufficiently larger than the source-gate capacitance and drain-gate capacitance or when an additional storage capacitor is electrically connected to the gates of the second transistors 302a to 302c and the gate capacitance and storage capacitance are sufficiently larger than the source-gate capacitance and drain-gate capacitance.

Further, in the method of operating the switch 300 in FIG. 6, an enable signal 0 is input to the wiring 317 (the output of the logic element 312 is 0) to write configuration data into the nodes 303a to 303c. However, configuration data can be written with the enable signal input to the wiring 317 remaining at 1 (without setting the output of the logic element 312 at 0) when the gate capacitance of the second transistors 302a to 302c is sufficiently larger than the source-gate capacitance and drain-gate capacitance or when an additional storage capacitor is electrically connected to the gates of the second transistors 302a to 302c and the gate capacitance and storage capacitance are sufficiently larger than the source-gate capacitance and drain-gate capacitance.

This embodiment can be combined with any of the other embodiments as appropriate.

Embodiment 3

Embodiment 1 shows the switch 200 using three groups each including a first transistor, a second transistor, and a capacitor, whereas Embodiment 3 will explain a switch 400 including at least three groups (hereinafter referred to as N groups, where N is an integer of 3 or more) of these elements with reference to FIG. 7.

The switch 400 controls connection between a logic element 412 and a logic element 418 in a PLD. For example, in FIG. 7, the logic element 412 can be composed of a lookup table 413, a flip-flop 414, and an AND circuit 415, and the logic element 418 can be composed of a lookup table 419, a flip-flop 420, and an AND circuit 421.

As in the switch 200 described in Embodiment 1, the first transistor in the switch 400 uses a semiconductor material that has a wider bandgap and lower intrinsic carrier density than silicon. An oxide semiconductor is used for a channel formation region of the first transistor. Meanwhile, the second transistor is preferably a transistor that uses a semiconductor material such as silicon for a channel formation region and thus can operate at higher speed than the first transistor. In this embodiment, the second transistor is specifically an n-channel transistor.

Moreover, the first transistor is formed using a multilayer film containing an oxide semiconductor used for the channel formation region and an oxide provided in contact with the oxide semiconductor. Such a structure enables the first transistor to have stable electrical characteristics.

Figure 7:
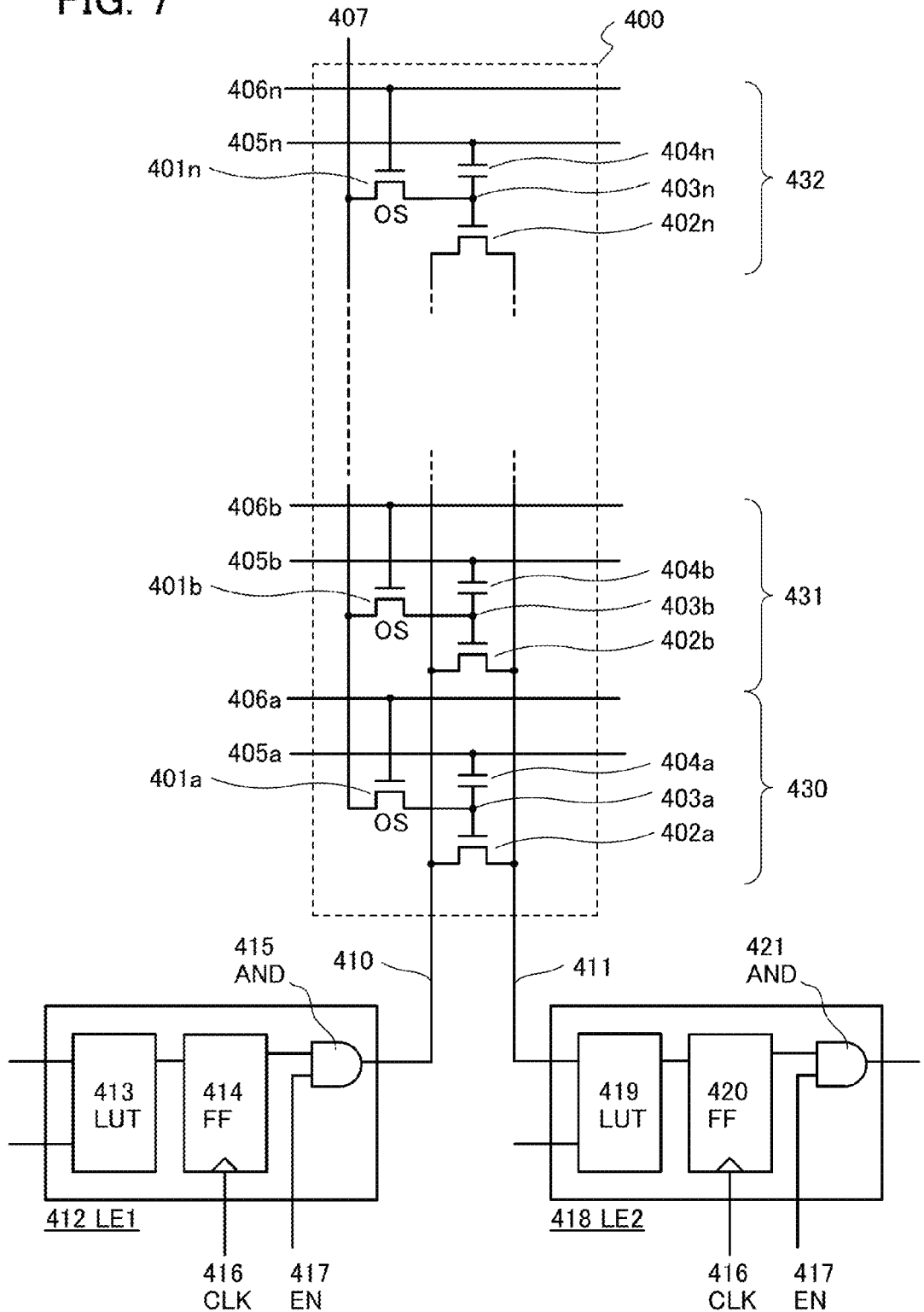
FIG. 7 is a circuit diagram illustrating one embodiment of a semiconductor device.

As illustrated in FIG. 7, the switch 400 specifically includes a first transistor 401a in the first group, a first transistor 401b in the second group, and a first transistor 401n in the N-th group (first transistors in the third to (N−1)th groups are not shown); a second transistor 402a in the first group, a second transistor 402b in the second group, and a second transistor 402n in the N-th group (second transistors in the third to (N−1)th groups are not shown); and a capacitor 404a in the first group, a capacitor 404b in the second group, and a capacitor 404n in the N-th group (capacitors in the third to (N−1)th groups are not shown).

Gates of the first transistors 401a, 401b, and 401n are electrically connected to respective wirings 406a, 406b, and 406n. A write signal is input to the wirings 406a, 406b, and 406n. Sources of the first transistors 401a, 401b, and 401n are electrically connected to one wiring 407. A write data signal is input to the wiring 407. Drains of the first transistors 401a, 401b, and 401n are electrically connected to respective gates of the second transistors 402a, 402b, and 402n. The drains of the first transistors 401a, 401b, and 401n are also electrically connected to one of a pair of electrodes of the capacitor 404a, one of a pair of electrodes of the capacitor 404b, and one of a pair of electrodes of the capacitor 404n, respectively. The second transistors 402a, 402b, and 402n are electrically connected in parallel with each other. That is, sources of the second transistors 402a, 402b, and 402n are connected to each other, and drains of the second transistors 402a, 402b, and 402n are connected to each other. The sources of the second transistors 402a, 402b, and 402n are electrically connected to an output terminal of the logic element 412 through a wiring 410. The drains of the second transistors 402a, 402b, and 402n are electrically connected to an input terminal of the logic element 418 through a wiring 411. The other of the electrodes of the capacitor 404a is electrically connected to a wiring 405a to which a read signal is input. The other of the electrodes of the capacitor 404b is electrically connected to a wiring 405b to which a read signal is input. The other of the electrodes of the capacitor 404n is electrically connected to a wiring 405n to which a read signal is input. Here, a point where the drain of the first transistor 401a is electrically connected to the gate of the second transistor 402a and the one of the electrodes of the capacitor 404a is referred to as a node 403a. A point where the drain of the first transistor 401b is electrically connected to the gate of the second transistor 402b and the one of the electrodes of the capacitor 404b is referred to as a node 403b. A point where the drain of the first transistor 401n is electrically connected to the gate of the second transistor 402n and the one of the electrodes of the capacitor 404n is referred to as a node 403n. Configuration data is stored at the nodes 403a, 403b, and 403n.

In this manner, the switch 400 of this embodiment consists of N groups including groups 430, 431, and 432 each of which includes the first and second transistors and the capacitor.

An output signal of the logic element 412 is output to the wiring 410, supplied to the wiring 411 through the switch 400, and input to the logic element 418.

Note that the switch 400 can operate as appropriate according to the operation described in Embodiment 1.

Such a structure can reduce time for reading data from a memory device that stores plural pieces of configuration data. Consequently, the PLD in which configuration data can be switched at high speed can be provided.

Further, the first transistor included in the switch employs a multilayer structure of an oxide layer and an oxide semiconductor layer, whereby the transistor can operate stably and as a result, the PLD can have high reliability.

It is worth noting that the switch 400 shown in this embodiment can store plural pieces of configuration data at a time and is thus effective in changing the circuit structure of a PLD many times in a short time. Note that the optimum number of groups included in the switch 400 can be selected as appropriate depending on the intended use.

This embodiment can be combined with any of the other embodiments as appropriate.

Embodiment 4

Figure 8:
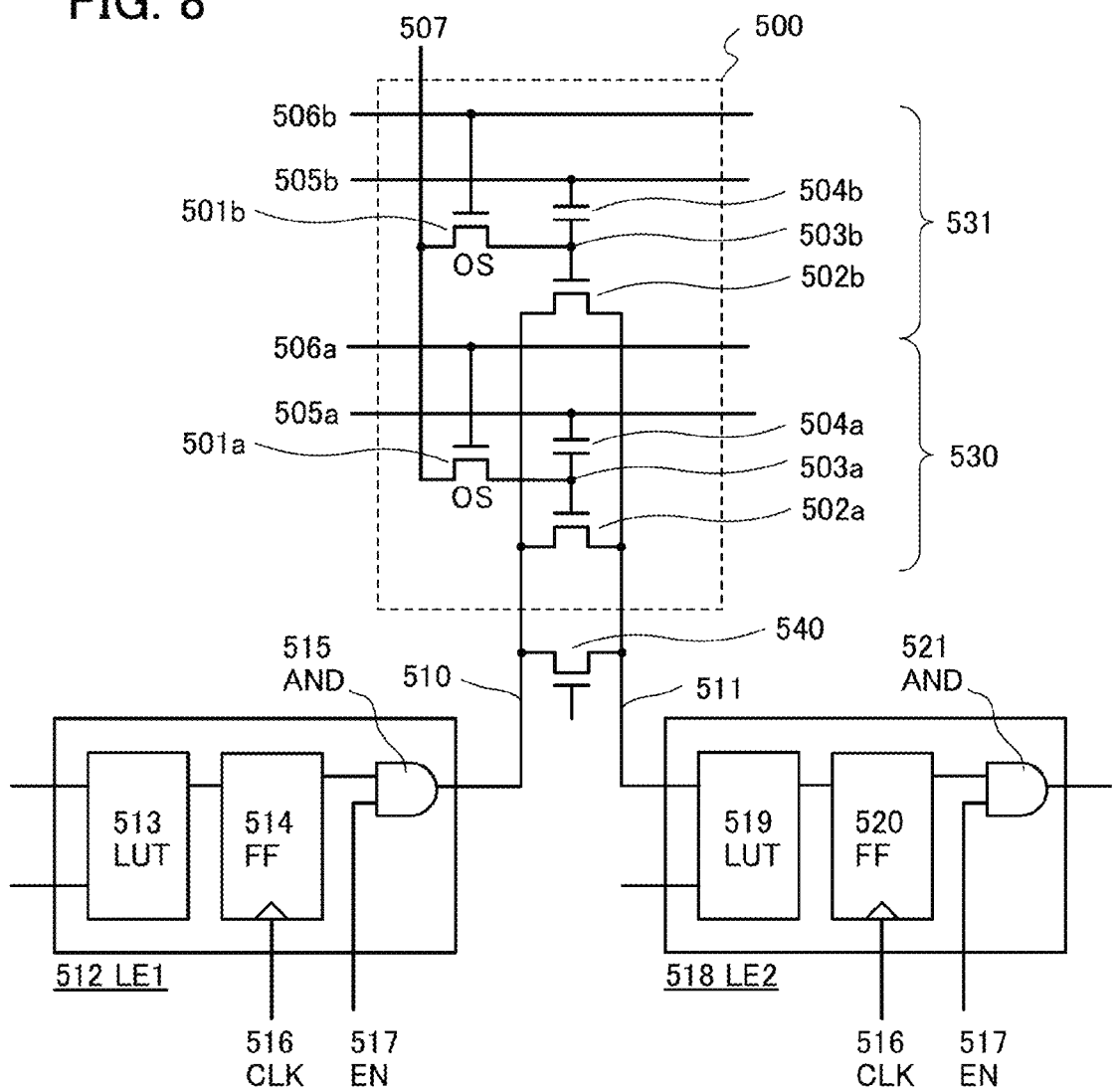
FIG. 8 is a circuit diagram illustrating one embodiment of a semiconductor device.

Embodiment 1 shows the switch 200 using three groups each including a first transistor, a second transistor, and a capacitor, whereas Embodiment 4 will explain a switch 500 including only two groups of these elements with reference to FIG. 8.

The switch 500 controls connection between a logic element 512 and a logic element 518 in a PLD. For example, in FIG. 8, the logic element 512 can be composed of a lookup table 513, a flip-flop 514, and an AND circuit 515, and the logic element 518 can be composed of a lookup table 519, a flip-flop 520, and an AND circuit 521.

As in the switch 200 described in Embodiment 1, the first transistor in the switch 500 uses a semiconductor material that has a wider bandgap and lower intrinsic carrier density than silicon. An oxide semiconductor is used for a channel formation region of the first transistor. Meanwhile, the second transistor is preferably a transistor that uses a semiconductor material such as silicon for a channel formation region and thus can operate at higher speed than the first transistor. In this embodiment, the second transistor is specifically an n-channel transistor.

Moreover, the first transistor is formed using a multilayer film containing an oxide semiconductor used for the channel formation region and an oxide provided in contact with the oxide semiconductor. Such a structure enables the first transistor to have stable electrical characteristics.

As illustrated in FIG. 8, the switch 500 specifically includes first transistors 501a and 501b, second transistors 502a and 502b, and capacitors 504a and 504b. Gates of the first transistors 501a and 501b are electrically connected to respective wirings 506a and 506b. A write signal is input to the wirings 506a and 506b. Sources of the first transistors 501a and 501b are electrically connected to one wiring 507. A write data signal is input to the wiring 507. Drains of the first transistors 501a and 501b are electrically connected to respective gates of the second transistors 502a and 502b. The drains of the first transistors 501a and 501b are also electrically connected to one of a pair of electrodes of the capacitor 504a and one of a pair of electrodes of the capacitor 504b, respectively. The second transistors 502a and 502b are electrically connected in parallel with each other. That is, sources of the second transistors 502a and 502b are connected to each other, and drains of the second transistors 502a and 502b are connected to each other. The sources of the second transistors 502a and 502b are electrically connected to an output terminal of the logic element 512 through a wiring 510. The drains of the second transistors 502a and 502b are electrically connected to an input terminal of the logic element 518 through a wiring 511. The other of the electrodes of the capacitor 504a is electrically connected to a wiring 505a to which a read signal is input. The other of the electrodes of the capacitor 504b is electrically connected to a wiring 505b to which a read signal is input. Here, a point where the drain of the first transistor 501a is electrically connected to the gate of the second transistor 502a and the one of the electrodes of the capacitor 504a is referred to as a node 503a. A point where the drain of the first transistor 501b is electrically connected to the gate of the second transistor 502b and the one of the electrodes of the capacitor 504b is referred to as a node 503b. Configuration data is stored at the nodes 503a and 503b.

In this manner, the switch 500 of this embodiment consists of two groups 530 and 531 each including the first and second transistors and the capacitor.

An output signal of the logic element 512 is output to the wiring 510, supplied to the wiring 511 through the switch 500, and input to the logic element 518.

Such a structure can reduce time for reading data from a memory device that stores plural pieces of configuration data. Thus, the PLD in which configuration data can be switched at high speed can be provided.

It is worth noting that the switch 500 can operate as appropriate according to the operation described in Embodiment 1, and configuration data in one of the groups 530 and 531 that is not selected can be changed in a period during which the other of the groups 530 and 531 is selected. Accordingly, setting configuration data again in non-selected groups sequentially enables switches composed of only two groups to achieve a PLD.

Further, the first transistor included in the switch employs a multilayer structure of an oxide layer and an oxide semiconductor layer, whereby the transistor can operate stably and as a result, the PLD can have high reliability.

Note that in the switch 500 described in this embodiment, as illustrated in FIG. 8, a transistor 540 may be provided between the wiring 510 and the wiring 511 so that the logic elements 512 and 518 are short-circuited when configuration data is written into the nodes 503a and 503b. With such a structure, the nodes 503a and 503b can stably store configuration data.

This embodiment can be combined with any of the other embodiments as appropriate.

Embodiment 5

In Embodiment 5, a switch 600 that does not use the capacitor included in the switch 200 of Embodiment 1 and additionally includes a third transistor will be described with reference to FIG. 9 and FIG. 10.

(Structure of Switch 600)

Figure 9:
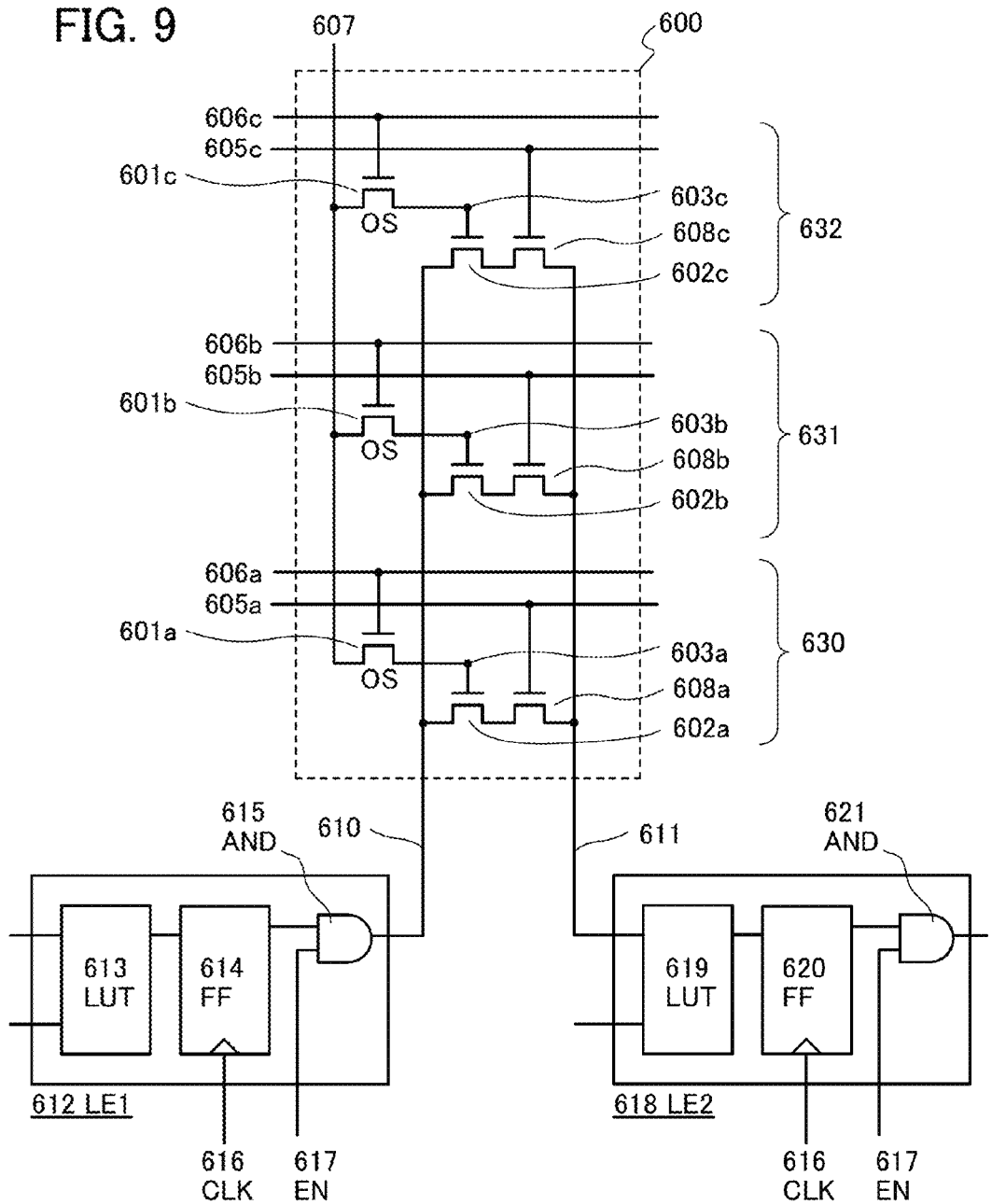
FIG. 9 is a circuit diagram illustrating one embodiment of a semiconductor device.

FIG. 9 illustrates the switch 600 of this embodiment. The switch 600 controls connection between a logic element 612 and a logic element 618 in a PLD. For example, in FIG. 9, the logic element 612 can be composed of a lookup table 613, a flip-flop 614, and an AND circuit 615, and the logic element 618 can be composed of a lookup table 619, a flip-flop 620, and an AND circuit 621.

The switch 600 is composed of a circuit having three groups each including a first transistor, a second transistor, and a third transistor. For the first transistor, a semiconductor material that has a wider bandgap and lower intrinsic carrier density than silicon is used. An oxide semiconductor is used for a channel formation region of the first transistor. Meanwhile, each of the second and third transistors is preferably a transistor that uses a semiconductor material such as silicon for a channel formation region and thus can operate at higher speed than the first transistor. In this embodiment, the second and third transistors are specifically n-channel transistors.

Moreover, the first transistor is formed using a multilayer film containing an oxide semiconductor used for the channel formation region and an oxide provided in contact with the oxide semiconductor. Such a structure enables the first transistor to have stable electrical characteristics.

As illustrated in FIG. 9, the switch 600 specifically includes first transistors 601a, 601b, and 601c, second transistors 602a, 602b, and 602c, and third transistors 608a, 608b, and 608c. Gates of the first transistors 601a, 601b, and 601c are electrically connected to respective wirings 606a, 606b, and 606c. A write signal is input to the wirings 606a to 606c. Sources of the first transistors 601a to 601c are electrically connected to one wiring 607. A write data signal is input to the wiring 607. Drains of the first transistors 601a, 601b, and 601c are electrically connected to respective gates of the second transistors 602a, 602b, and 602c. Drains of the second transistors 602a, 602b, and 602c are electrically connected to respective sources of the third transistors 608a, 608b, and 608c. As a result, the second transistors 602a, 602b, and 602c are electrically connected in series with the third transistors 608a, 608b, and 608c, respectively. Drains of the third transistors 608a to 608c are connected to each other. The sources of the second transistors 602a to 602c are electrically connected to an output terminal of the logic element 612 through a wiring 610. The drains of the third transistors 608a to 608c are electrically connected to an input terminal of the logic element 618 through a wiring 611. Here, points where the drains of the first transistors 601a, 601b, and 601c are electrically connected to the respective gates of the second transistors 602a, 602b, and 602c are respectively referred to as nodes 603a, 603b, and 603c. Configuration data is stored at the nodes 603a to 603c.

In this manner, the switch 600 of this embodiment consists of three groups 630, 631, and 632 each including the first, second, and third transistors.

An output signal of the logic element 612 is output to the wiring 610, supplied to the wiring 611 through the switch 600, and input to the logic element 618.

When the potentials of the wirings 606a to 606c are set high ("H") and a potential corresponding to "H" or low ("L") is supplied to the wiring 607, charge corresponding to the potential of the wiring 607 can be stored at the nodes 603a to 603c. Note that at this time, at least one of the wirings 610 and 611 is preferably set "L".

Here, with the use of transistors with extremely low off-state current as the first transistors 601a to 601c, the charges stored at the nodes 603a to 603c can be kept constant, that is, inputted data can be stored while the wirings 606a to 606c are at "L". The wirings 606a to 606c are set "L" and the wirings 605a, 605b, and 605c are set "H" to turn on the third transistors 608a to 608c, whereby the on/off state of the switch 600 is determined by the on/off states of the second transistors 602a to 602c corresponding to the charges stored at the nodes 603a to 603c. In other words, by selecting one of the wirings 605a to 605c, the on/off state of the switch 600 can be switched instantly in accordance with the charge stored at the node 603a, the node 603b, or the node 603c.

Here, relating the charges stored at the nodes 603a, 603b, and 603c to first configuration data, second configuration data, and third configuration data enables switching of configuration data by switching a conducting wiring between the wirings 605a, 605b, and 605c.

Such a structure can reduce time for reading data from a memory device that stores plural pieces of configuration data. Thus, the PLD in which configuration data can be switched at high speed can be provided.

When a signal passes through the switch 600, the potential of the signal is sometimes lowered depending on the resistance of the switch. Latches for preventing the potential decrease can be arranged as described in Embodiment 1.

(Operation of Switch 600)

Next, an example of a method of operating the switch 600 illustrated in FIG. 9 will be described with reference to a timing chart in FIG. 10.

Here, as an example, the potentials of the wirings 606a to 606c at "H" are +V and the potentials of the wirings 606a to 606c at "L" are 0. The potentials of the wirings 605a to 605c at "H" are +V and the potentials of the wirings 605a to 605c at "L" are 0. The potential of the wiring 607 at "H" is +V and the potential of the wiring 607 at "L" is 0. The potentials of the wirings 610, 611, 616, and 617 at "H" are +V and the potentials of the wirings 610, 611, 616, and 617 at "L" are 0.

As an initial state, the case where the wiring 605c is at "H" and the potential of the node 603c is +V is considered. In other words, the on/off state of the switch 600 is determined in accordance with the third configuration data, and the switch 600 is on in the initial state. Further, the potentials of the nodes 603a and 603b are 0 in the initial state.

First, write of configuration data (time T1 to time T6) is described.

At the time T2, the wiring 606a is set "H", the wiring 617 is set "L", and the wiring 607 is "L". At this time, the potential of the node 603a becomes 0; this potential corresponds to a potential for turning off the switch 600. That is, this state corresponds to a state where the switch 600 stores "L" as the first configuration data. Note that the output of the logic element 612 is "L".

At the time T3, the wiring 606a is set "L". At this time, the potential of the node 603a is 0.

At the time T5, the wirings 606b is set "H", the wiring 617 is set "L", and the wiring 607 is "H". At this time, the potential of the node 603b becomes +V; this potential corresponds to a potential for turning on the switch 600. That is, this state corresponds to a state where the switch 600 stores "H" as the second configuration data. Note that the output of the logic element 612 is "L".

At the time T6, the wiring 606b is set "L". At this time, the potential of the node 603b is +V.

Note that it is preferable that write of configuration data be started as soon as possible after the time T1 and the time T4 at a positive edge of the clock signal input to the wiring 616 and be finished in as short time as possible. Specifically, it is preferable that write of configuration data be started after the hold time of the flip-flop passes from the time T1 and the time T4. With such a structure, configuration data can be rewritten without disturbing the operation of the PLD.

Next, switching of configuration data (time T7 to time T10) is described.

At the time T8, the wiring 605a is set "H" and the wiring 605c is set "L". At this time, the potential of the node 603a is 0 and the potential of the node 603c is +V. Thus, the switch 600 is turned off, which means that switching to the first configuration data is completed.

At the time T10, the wiring 605a is set "L" and the wiring 605b is set "H". At this time, the potential of the node 603a is 0 and the potential of the node 603b is +V. Thus, the switch 600 is turned on, which means that switching to the second configuration data is completed.

Note that it is preferable that switching of configuration data be performed as soon as possible after the time T7 and the time T9 at a positive edge of the clock signal input to the wiring 616. Specifically, it is preferable that switching of configuration data be performed after the hold time of the flip-flop passes from the time T7 and the time T9. With such a structure, configuration data can be switched without disturbing the operation of the PLD.

With the above-described structure, it is possible to provide a PLD that achieves high-speed configuration capable of dynamic configuration, consumes less power, and has a short startup time.

The first transistor included in the switch employs a multilayer structure of an oxide layer and an oxide semiconductor layer, whereby the transistor can operate stably and as a result, the PLD can have high reliability.

Figure 10:
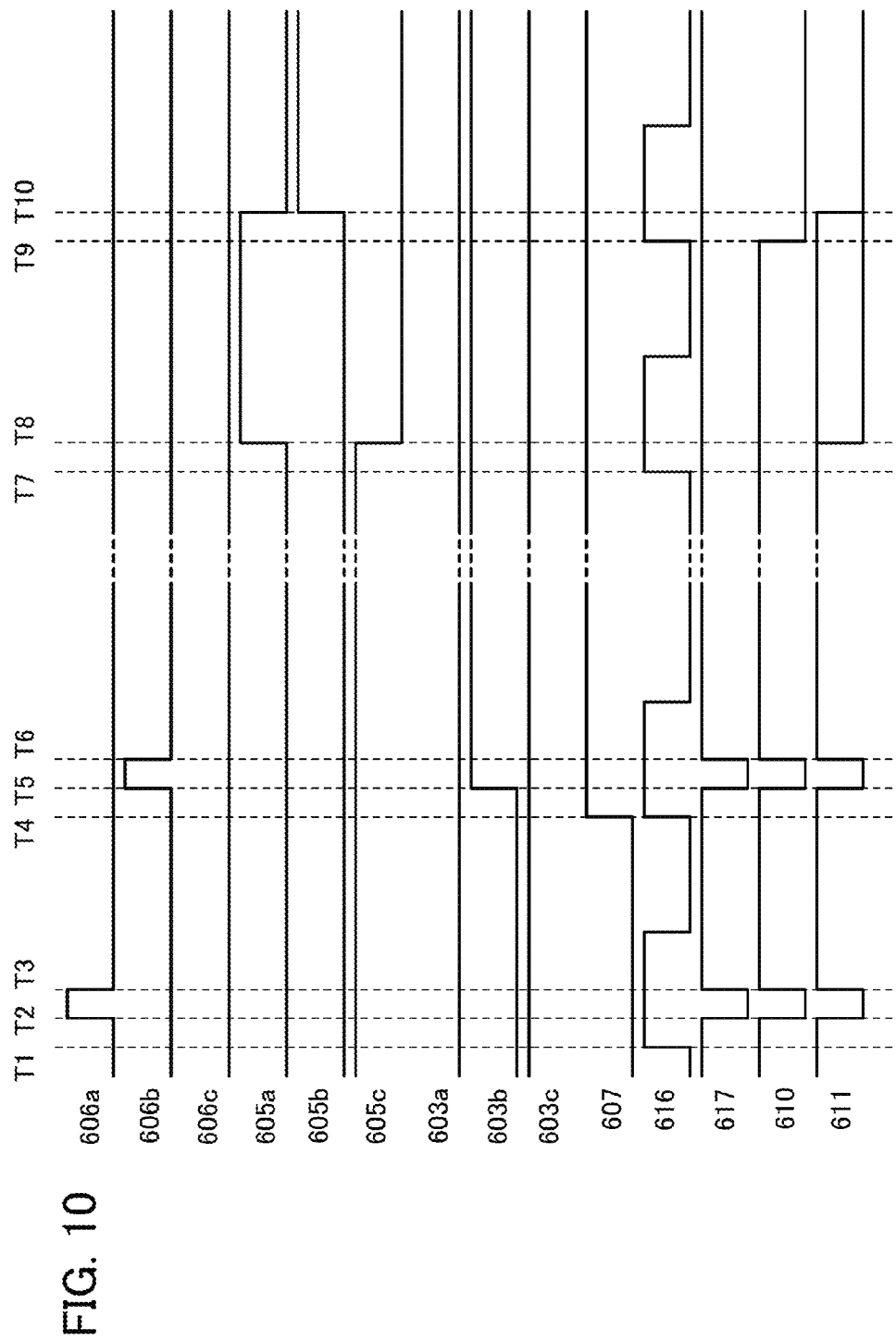
FIG. 10 is a timing chart illustrating one embodiment of circuit operation.

Further, in the method of operating the switch 600 in FIG. 10, an enable signal 0 is input to the wiring 617 (the output of the logic element 612 is 0) to write configuration data into the nodes 603a to 603c. However, configuration data can be written with the enable signal input to the wiring 617 remaining at 1 (without setting the output of the logic element 612 at 0) when the gate capacitance of the second transistors 602a to 602c is sufficiently larger than the source-gate capacitance and drain-gate capacitance or when an additional storage capacitor is electrically connected to the gates of the second transistors 602a to 602c and the gate capacitance and storage capacitance are sufficiently larger than the source-gate capacitance and drain-gate capacitance.

This embodiment can be combined with any of the other embodiments as appropriate.

Embodiment 6

Figure 11:
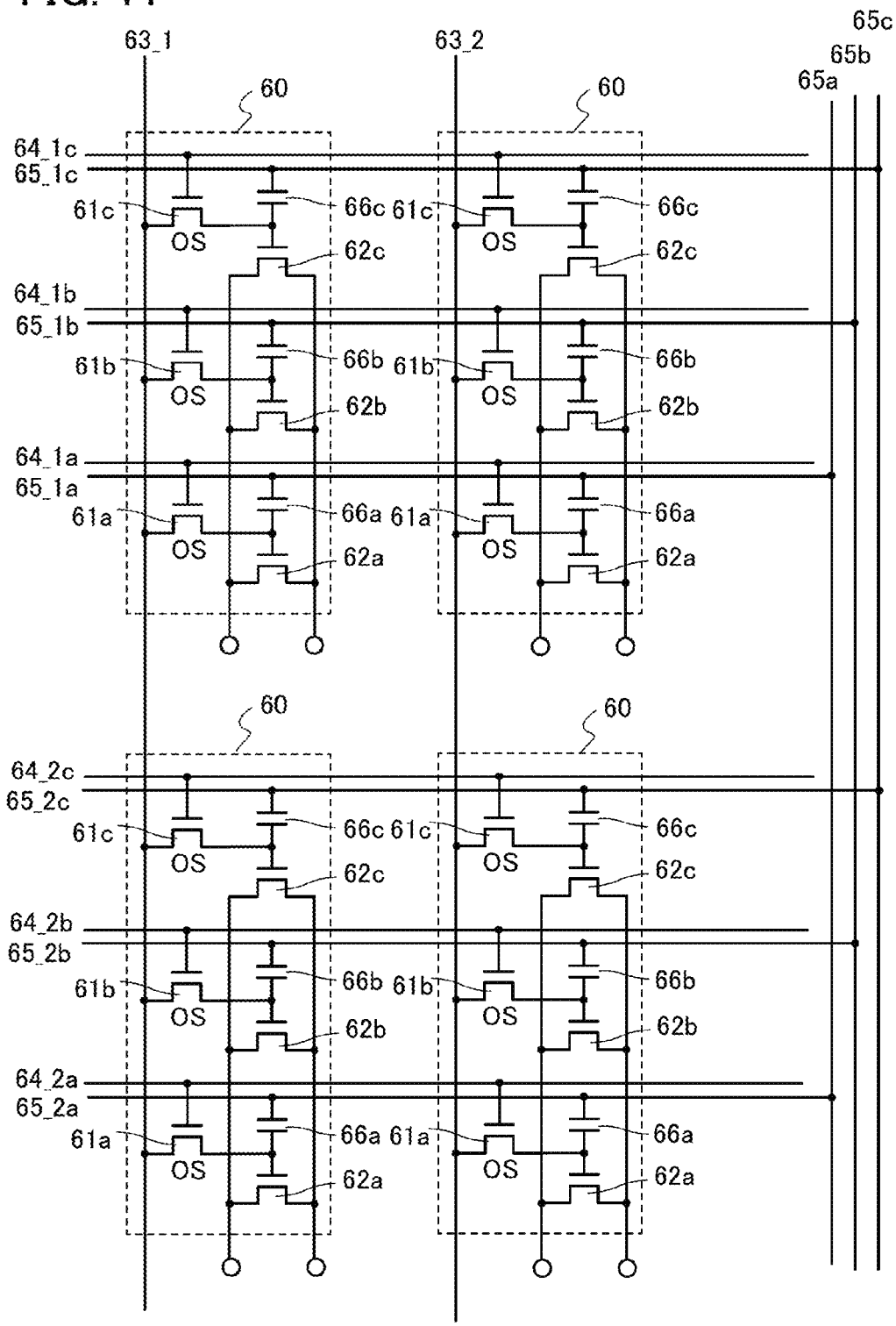
FIG. 11 is a circuit diagram illustrating one embodiment of a semiconductor device.

In Embodiment 6, an example of electrical connection between a plurality of switches in a logic array included in a PLD will be described with reference to FIG. 11.

As described in Embodiment 1, a logic array is configured with an arrangement of a plurality of logic elements, wirings, and switches. FIG. 11 is a conceptual diagram showing only switches 60 in the logic array. The switch 60 includes first transistors 61a, 61b, and 61c, second transistors 62a, 62b, and 62c, and capacitors 66a, 66b, and 66c like the switch 200 described in Embodiment 1, for example.

Here, a wiring 63_1 electrically connected to sources of the first transistors 61a to 61c in the switch 60 is shared by the switches 60 arranged in the vertical direction. Similarly, a wiring 63_2 is shared by and electrically connected to the switches 60 arranged in the vertical direction.

On the other hand, wirings 64_1a, 64_1b, 64_1c, 64_2a, 64_2b, and 64_2c that are connected to gates of the first transistors 61a, 61b, and 61c in the switches 60 are shared by the switches 60 arranged in the horizontal direction.

With the electrical connection between the switches in this embodiment, to write configuration data through the first transistors 61a, 61b, and 61c in each of the switches 60, the wirings 64_1c, 64_1b, 64_1a, 64_2c, 64_2b, and 64_2a are selected in this order to sequentially turn on the first transistors from the top row, and configuration data is written through the wirings 63_1 and 63_2.

Wirings 65_1a, 65_1b, 65_1c, 65_2a, 65_2b, and 65_2c each of which is electrically connected to one electrode of the capacitor 66a, the capacitor 66b, or the capacitor 66c are shared by the switches 60 in the horizontal direction, and are also shared by the switches 60 in the vertical direction through wirings 65a, 65b, and 65c. Accordingly, the one electrode of the capacitor in each of the three groups included in the switch 60 is electrically connected to a corresponding one of the wirings 65a, 65b, and 65c; thus, selecting one of the wirings 65a, 65b, and 65c enables configuration data stored in the groups that share the selected wiring to be read at a time.

Note that the above structure may be divided into blocks and operation such as data read and data write may be performed in each block.

This embodiment can be combined with any of the other embodiments as appropriate.

Embodiment 7

Embodiment 7 will explain examples of the structure of a lookup table (LUT) included in the logic element of the other embodiments. The LUT can be composed of a plurality of multiplexers. Configuration data can be input to any of input terminals and control terminals of the plurality of multiplexers.

Figure 13A:
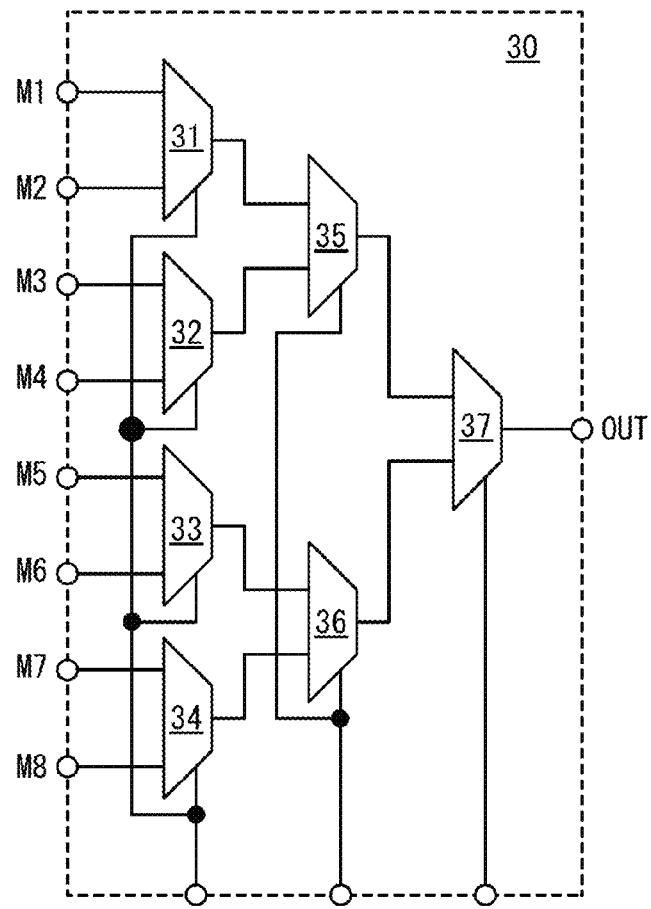
FIGS. 13A to 13C are circuit diagrams each illustrating one embodiment of a semiconductor device.

FIG. 13A illustrates one embodiment of a LUT 30 included in the logic element.

In FIG. 13A, the LUT 30 is composed of seven two-input multiplexers (multiplexers 31 to 37). Input terminals of the multiplexers 31 to 34 correspond to input terminals M1 to M8 of the LUT 30.

Control terminals of the multiplexers 31 to 34 are electrically connected to each other and correspond to an input terminal IN3 of the LUT 30. Output terminals of the multiplexers 31 and 32 are electrically connected to two respective input terminals of the multiplexer 35. Output terminals of the multiplexers 33 and 34 are electrically connected to two respective input terminals of the multiplexer 36. Control terminals of the multiplexers 35 and 36 are electrically connected to each other and correspond to an input terminal IN2 of the LUT 30. Output terminals of the multiplexers 35 and 36 are electrically connected to two respective input terminals of the multiplexer 37. A control terminal of the multiplexer 37 corresponds to an input terminal IN1 of the LUT 30. An output terminal of the multiplexer 37 corresponds to an output terminal OUT of the LUT 30.

The kind of logic operation performed by the LUT 30 can be determined by input of configuration data from a configuration memory to any of the input terminals M1 to M8.

Figure 13B:
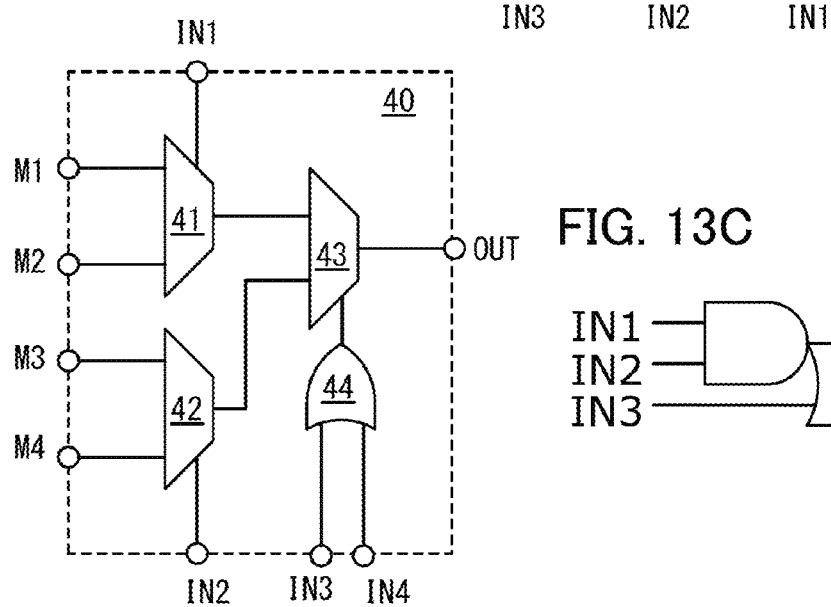
Figure 13C:
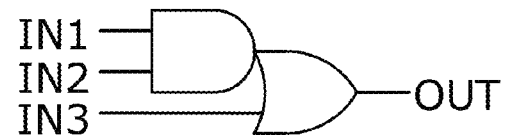

For example, when configuration data having digital values "0", "1", "0", "1", "0", "1", "1", and "1" are input to the input terminals M1 to M8 of the LUT 30 in FIG. 13A, the function of an equivalent circuit illustrated in FIG. 13C is obtained.

FIG. 13B illustrates one embodiment of a LUT 40 included in the logic element.

In FIG. 13B, the LUT 40 is composed of three two-input multiplexers (multiplexers 41 to 43) and a two-input OR circuit 44. Input terminals of the multiplexers 41 and 42 correspond to input terminals M1 to M4 of the LUT 40. A control terminal of the multiplexer 41 corresponds to an input terminal IN1 of the LUT 40. A control terminal of the multiplexer 42 corresponds to an input terminal IN2 of the LUT 40. Output terminals of the multiplexers 41 and 42 are electrically connected to two respective input terminals of the multiplexer 43. Two input terminals of the OR circuit 44 correspond to input terminals IN3 and IN4 of the LUT 40, and an output of the OR circuit 44 is input to a control terminal of the multiplexer 43. An output terminal of the multiplexer 43 corresponds to an output terminal OUT of the LUT 40.

The kind of logic operation performed by the LUT 40 can be determined by input of configuration data to any of the input terminals M1 to M4 and the input terminals IN1 to IN4.

For example, when configuration data having digital values "0", "1", "0", "0", and "0" are input to the input terminals M1, M3, M4, IN2, and IN4 of the LUT 40 in FIG. 13B, the function of the equivalent circuit illustrated in FIG. 13C is obtained.

Although FIGS. 13A and 13B illustrate the examples of the LUTs 30 and 40 each of which is composed of two-input multiplexers, the LUTs 30 and 40 may be composed of multiplexers with three or more inputs.

The LUT 30 or the LUT 40 may further include any or all of a diode, a resistor, a logic circuit (or a logic element), and a switch in addition to the multiplexers. As the logic circuit (or the logic element), a buffer, an inverter, a NAND circuit, a NOR circuit, a three-state buffer, a clocked inverter, or the like can be used. As the switch, an analog switch or a transistor can be used, for example.

In the above description, three-input one-output logic operation illustrated in FIG. 13C is performed with the LUT 30 in FIG. 13A or the LUT 40 in FIG. 13B; however, this embodiment is not limited to such cases. By appropriately selecting the structure of the LUT 30 or the LUT 40 and configuration data to be input, logic operation with four or more inputs and two or more outputs can be performed.

This embodiment can be combined with any of the other embodiments as appropriate.

Embodiment 8

Figure 14:
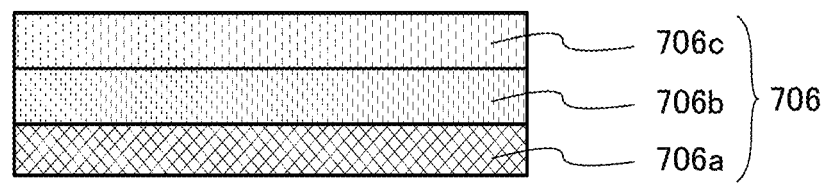
FIG. 14 is a cross-sectional view of a multilayer film of one embodiment of the present invention.

Referring to FIG. 14, Embodiment 8 will explain the structure of a multilayer film that can be used in the first transistor included in the switch described in the foregoing embodiments.

A multilayer film 706 illustrated in FIG. 14 includes an oxide layer 706a, an oxide semiconductor layer 706b over the oxide layer 706a, and an oxide layer 706c over the oxide semiconductor layer 706b. Although the case where the multilayer film 706 consists of three layers is described below, the multilayer film 706 may consist of two layers or four or more layers. For example, the multilayer film 706 may include the oxide layer 706a and the oxide semiconductor layer 706b over the oxide layer 706a. Alternatively, the multilayer film 706 may include the oxide semiconductor layer 706b and the oxide layer 706c over the oxide semiconductor layer 706b.

Here, the band structure of the multilayer film 706 is described with reference to FIGS. 15A and 15B and FIGS. 16A and 16B.

The oxide layer 706a was formed using an In—Ga—Zn oxide having an energy gap of 3.15 eV, the oxide semiconductor layer 706b was formed using an In—Ga—Zn oxide having an energy gap of 2.8 eV, and the oxide layer 706c was formed using an oxide layer having the same physical properties as the oxide layer 706a. The energy gap in the vicinity of the interface between the oxide layer 706a and the oxide semiconductor layer 706b and the energy gap in the vicinity of the interface between the oxide layer 706c and the oxide semiconductor layer 706b were each 3 eV. The energy gaps were measured using a spectroscopic ellipsometer (UT-300 manufactured by HORIBA Jobin Yvon SAS.). The thicknesses of the oxide layer 706a, the oxide semiconductor layer 706b, and the oxide layer 706c were each 10 nm.

Figure 15A:
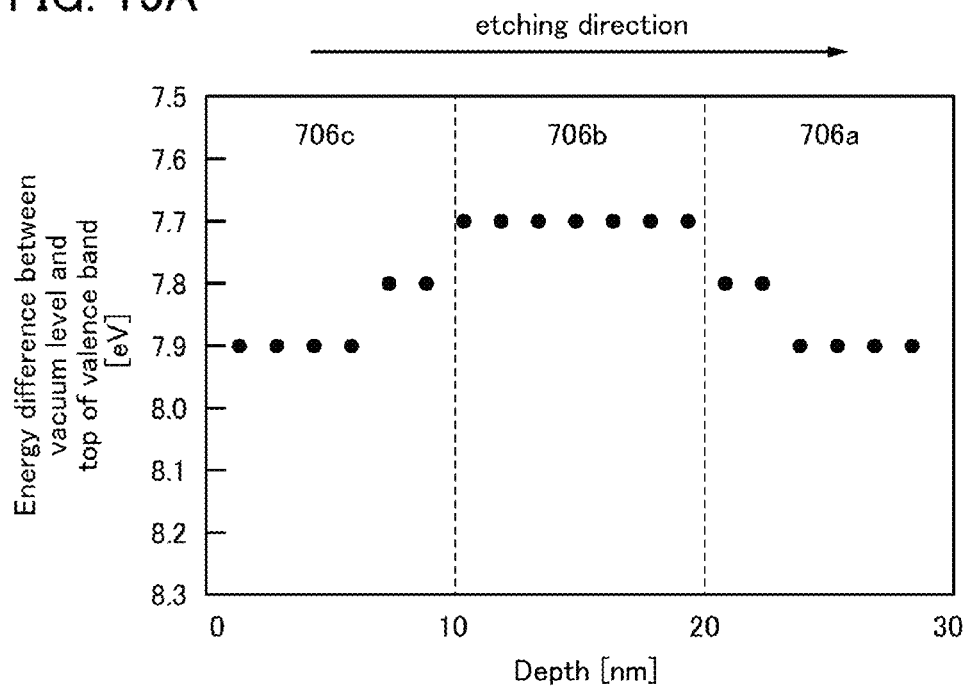
FIGS. 15A and 15B show a band structure of a multilayer film of one embodiment of the present invention.

FIG. 15A is a plot of the results of measuring the energy difference between the vacuum level and the top of the valence band of each layer while the multilayer film 706 was etched from the oxide layer 706c side. The energy difference between the vacuum level and the top of the valence band was measured using an instrument for ultraviolet photoelectron spectroscopy (UPS), VersaProbe (manufactured by ULVAC-PHI, Inc.).

Figure 15B:
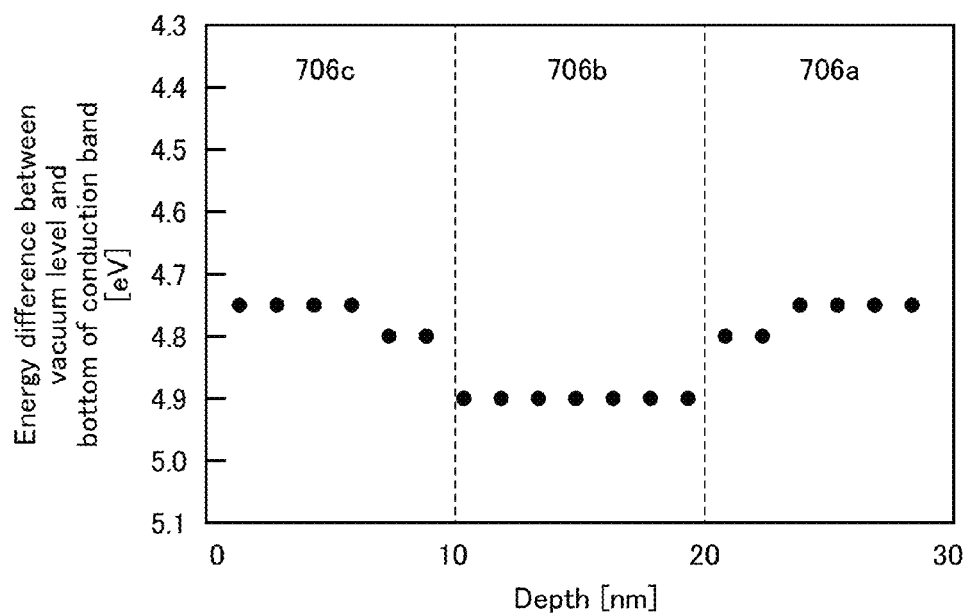

FIG. 15B is a plot of the results of calculating the energy difference between the vacuum level and the bottom of the conduction band of each layer by subtracting the energy gap of each layer from the energy difference between the vacuum level and the top of the valence band.

Figure 16A:
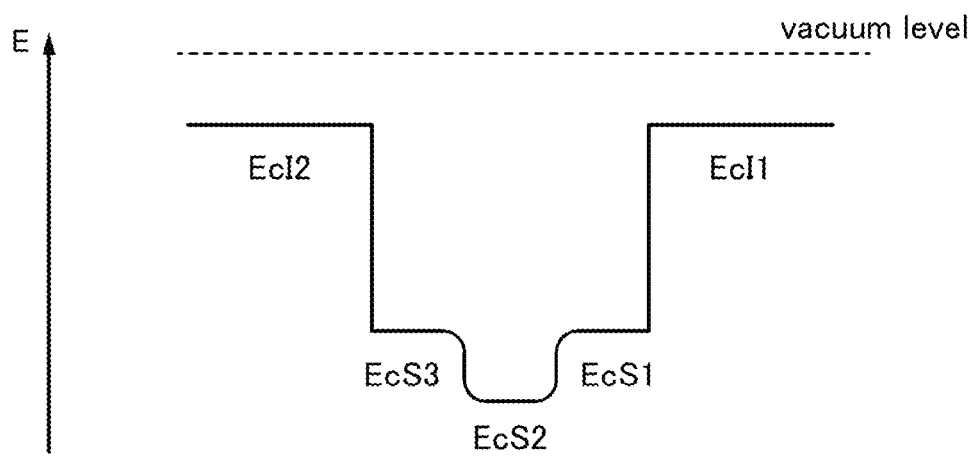
FIGS. 16A and 16B each show a band structure of a multilayer film of one embodiment of the present invention.

FIG. 16A schematically shows part of the band structure in FIG. 15B. FIG. 16A shows the case where silicon oxide films are provided in contact with the oxide layers 706a and 706c. Here, EcI1 denotes the energy of the bottom of the conduction band of the silicon oxide film; EcS1, the energy of the bottom of the conduction band of the oxide layer 706a; EcS2, the energy of the bottom of the conduction band of the oxide semiconductor layer 706b; EcS3, the energy of the bottom of the conduction band of the oxide layer 706c; and EcI2, the energy of the bottom of the conduction band of the silicon oxide film.

As shown in FIG. 16A, the energy of the bottom of the conduction band of the oxide layer 706a, the oxide semiconductor layer 706b, and the oxide layer 706c is continuously changed. This is because oxygen is diffused among the oxide layer 706a, the oxide semiconductor layer 706b, and the oxide layer 706c.

The oxide semiconductor layer and the oxide layers, which contain the same main components and are stacked, are not simply stacked but formed to have continuous junction (here, particularly a U-shaped well structure where the energy of the bottom of the conduction band is continuously changed between the layers). That is, a stacked structure is formed so that impurities that cause defect levels such as a trap center and a recombination center for the oxide semiconductor or a barrier impeding carrier flow do not exist at the interfaces between the layers. If impurities are mixed between the oxide semiconductor layer and the oxide layer stacked, the continuity of the energy band is lost and carriers disappear by a trap or recombination.

In order to form continuous junction, the layers need to be stacked successively without being exposed to the air by using a multi-chamber deposition system (sputtering system) provided with a load lock chamber. Each chamber of the sputtering system is preferably evacuated to a high vacuum (to about $1 \times 10^{-4}$ Pa to $5 \times 10^{-7}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas (particularly a gas containing a carbon component or a hydrate) from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of −40° C. or lower, preferably −80° C. or lower, more preferably −100° C. or lower is used, so that entry of moisture or the like into the oxide semiconductor film can be prevented as much as possible.

Figure 16B:
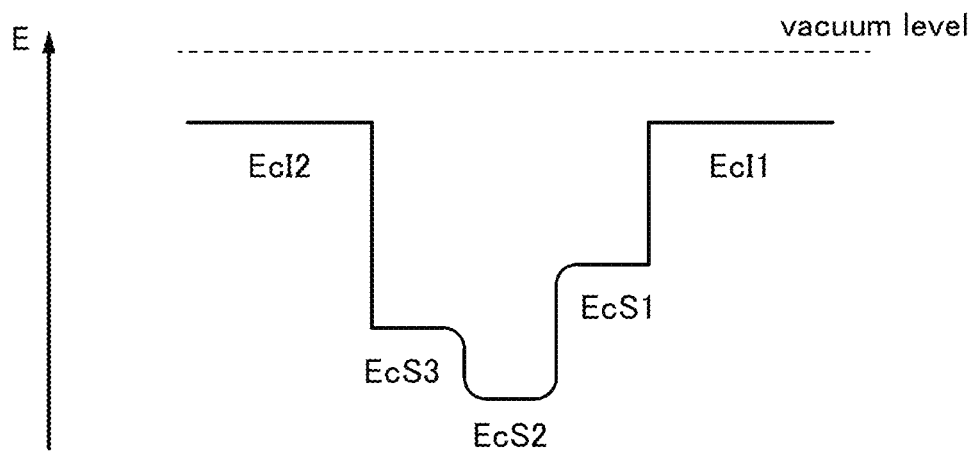

Note that FIG. 16A shows the case where the oxide layers 706a and 706c have the same physical properties; however, the oxide layers 706a and 706c may have different physical properties. For example, FIG. 16B shows part of the band structure in which EcS1 is higher than EcS3. Alternatively, although not shown in FIGS. 16A and 16B, EcS3 may be higher than EcS1.

For example, assuming that the silicon oxide film (the energy of the bottom of the conduction band is EcI2) is a gate insulating film and a gate electrode is placed left of the silicon oxide film in the band structure illustrated in FIG. 16B, the structure preferably has an energy of the bottom of the conduction band of EcS1>EcS3 as shown in FIG. 16B. This is because current flows mainly through EcS2 near EcS3 on the gate electrode side.

When the oxide layer 706c and the gate electrode are provided so that a silicon oxide film is sandwiched therebetween, the silicon oxide film functions as a gate insulating film, and the oxide layer 706c can prevent indium contained in the oxide semiconductor layer 706b from diffusing into the gate insulating film. To prevent indium diffusion by the oxide layer 706c, the indium content of the oxide layer 706c is preferably lower than that of the oxide semiconductor layer 706b.

According to FIGS. 15A and 15B and FIGS. 16A and 16B, the oxide semiconductor layer 706b of the multilayer film 706 serves as a well and a channel of the transistor including the multilayer film 706 is formed in the oxide semiconductor layer 706b. Since the energy of the bottom of the conduction band is continuously changed, the multilayer film 706 can also be referred to as a U-shaped well.

Figure 17:
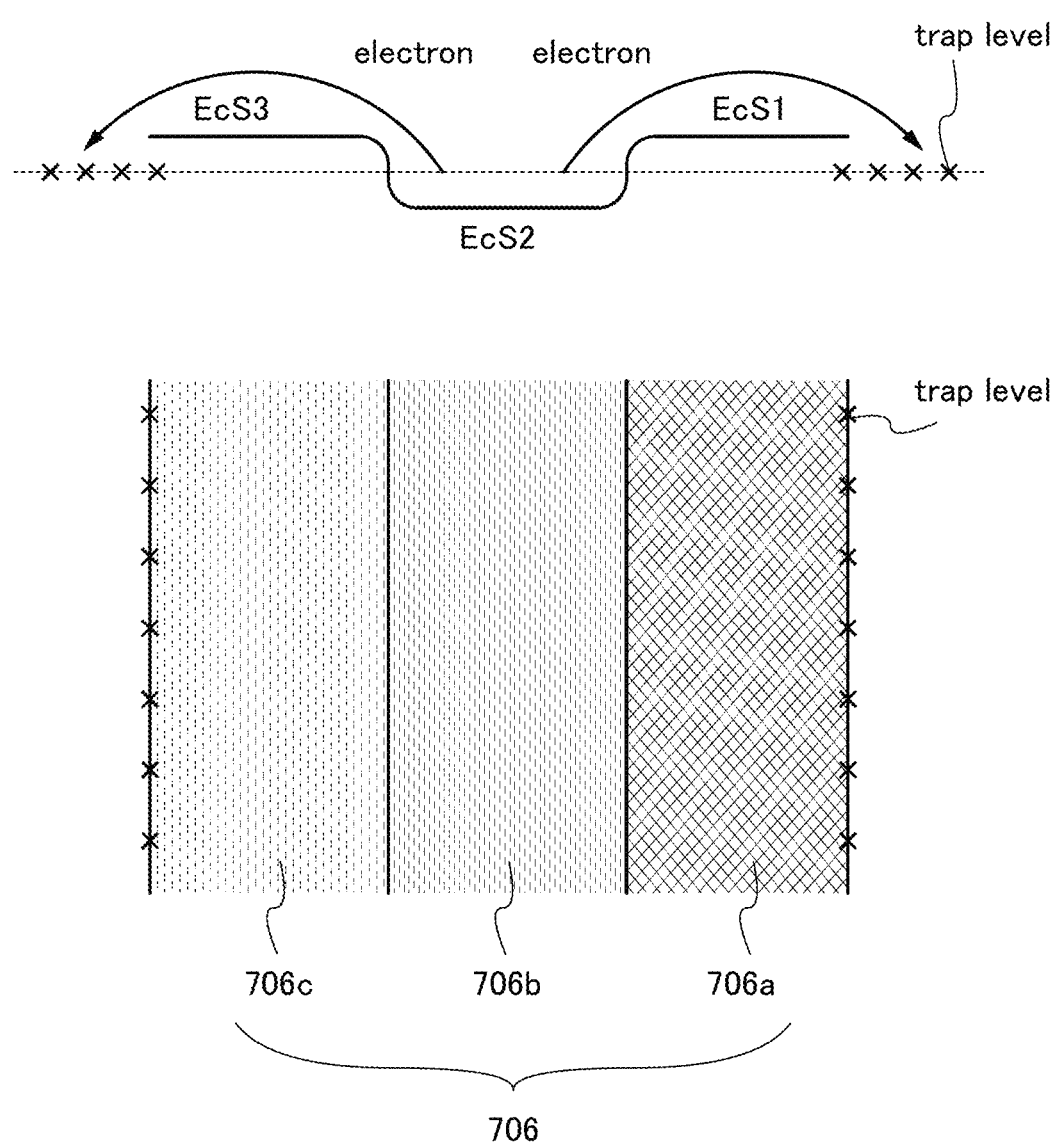
FIG. 17 shows a band structure of a multilayer film of one embodiment of the present invention.

Note that although trap levels due to impurities or defects might be formed in the vicinity of the interface between an insulating film such as a silicon oxide film and each of the oxide layers 706a and 706c as shown in FIG. 17, the oxide semiconductor layer 706b can be distanced away from the trap levels owing to existence of the oxide layers 706a and 706c. However, when the energy difference between EcS2 and EcS1 or EcS3 is small, an electron in the oxide semiconductor layer 706b might reach the trap level by passing over the energy difference. When an electron is trapped in the trap level, negative charge is generated at the interface with the insulating film, causing positive shift of the threshold voltage of the transistor.

Thus, the energy difference between EcS1 and EcS2 and the energy difference between EcS3 and EcS2 are each preferably 0.1 eV or more, more preferably 0.15 eV or more because the amount of change in the threshold voltage of the transistor is reduced and the transistor has stable electrical characteristics.

Next, a structure of an oxide semiconductor film is described below.

An oxide semiconductor film is roughly classified into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of the CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. When an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element (e.g., silicon) that has higher bonding strength to oxygen than a metal element included in the oxide semiconductor film disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. For example, oxygen vacancies in the oxide semiconductor film might serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. Note that charge trapped by the carrier traps in the oxide semiconductor film takes a long time to be released and might behave like fixed charge. Thus, a transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In a TEM image of the microcrystalline oxide semiconductor film, crystal parts cannot be found clearly in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, a crystal grain cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak indicating a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part (e.g., larger than or equal to 1 nm and smaller than or equal to 30 nm). Further, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

This embodiment can be combined with any of the other embodiments as appropriate.

Embodiment 9

In Embodiment 9, a deposition system for depositing the oxide semiconductor layer 706b having crystal parts will be described with reference to FIGS. 18A and 18B, FIGS. 19A and 19B, and FIG. 20. Moreover, a method of depositing an oxide semiconductor layer by the deposition system will be described.

First, the structure of a deposition system that hardly allows the entry of impurities into a film during deposition will be described with reference to FIGS. 18A and 18B.

Figure 18A:
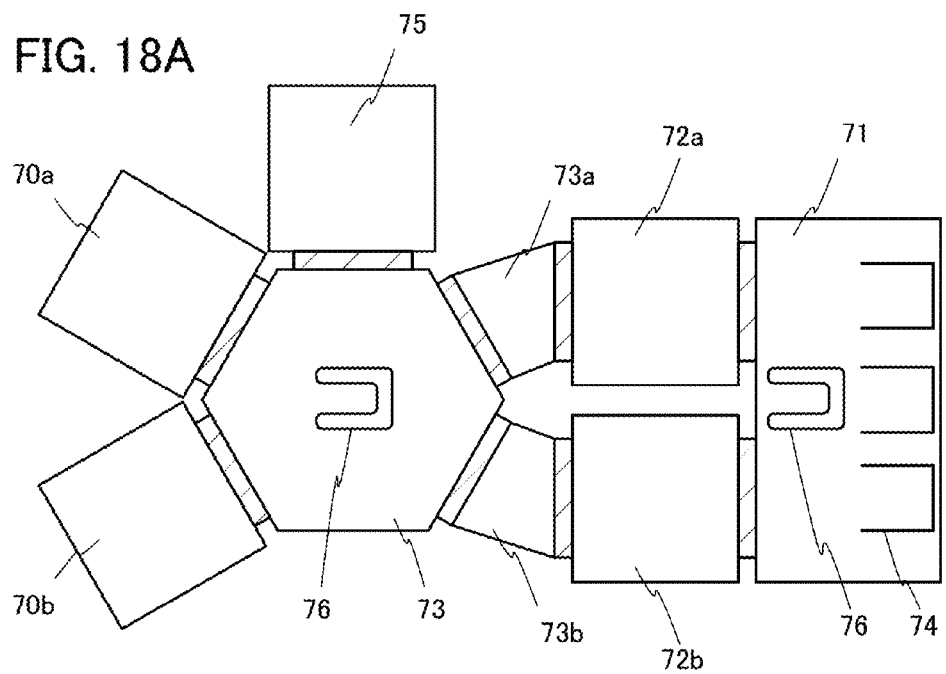
FIGS. 18A and 18B are top views each illustrating an example of a deposition system.

FIG. 18A is a top view schematically illustrating a multi-chamber deposition system. The deposition system includes a substrate supply chamber 71 provided with three cassette ports 74 for holding substrates, a load lock chamber 72a, an unload lock chamber 72b, a transfer chamber 73, a transfer chamber 73a, a transfer chamber 73b, a substrate heating chamber 75, and deposition chambers 70a and 70b. The substrate supply chamber 71 is connected to the load lock chamber 72a and the unload lock chamber 72b. The load lock chamber 72a and the unload lock chamber 72b are connected to the transfer chamber 73 through the transfer chamber 73a and the transfer chamber 73b. The substrate heating chamber 75 and the deposition chambers 70a and 70b are each connected only to the transfer chamber 73.

Gate valves (represented by hatch patterns in FIG. 18A) are provided to connect chambers so that the chambers except the substrate supply chamber 71 can be independently kept under vacuum. The substrate supply chamber 71 and the transfer chamber 73 each include at least one substrate transfer robot 76 with which a glass substrate can be transferred. Here, the substrate heating chamber 75 preferably also serves as a plasma treatment chamber. In a single wafer multi-chamber deposition system, a substrate can be transferred without being exposed to the air between treatments, so that adsorption of impurities to the substrate can be prevented. In addition, the order of deposition, heat treatment, and the like can be freely determined. Note that the numbers of transfer chambers, deposition chambers, load lock chambers, unload lock chambers, and substrate heating chambers are not limited to the above, and can be determined as appropriate in accordance with the installation space or the process.

Figure 18B:
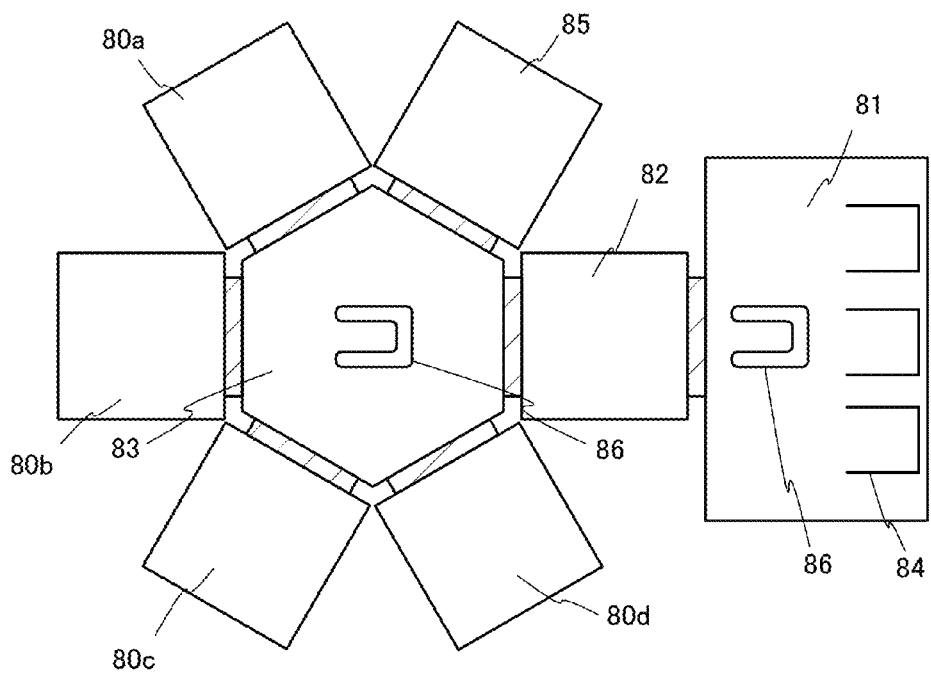

FIG. 18B illustrates a multi-chamber deposition system having a structure different from that in FIG. 18A. The deposition system includes a substrate supply chamber 81 provided with cassette ports 84, a load/unload lock chamber 82, a transfer chamber 83, a substrate heating chamber 85, and deposition chambers 80a, 80b, 80c, and 80d. The substrate supply chamber 81, the substrate heating chamber 85, and the deposition chambers 80a to 80d are connected to each other through the transfer chamber 83.

Gate valves (represented by hatch patterns in FIG. 18B) are provided to connect chambers so that the chambers except the substrate supply chamber 81 can be independently kept under vacuum. The substrate supply chamber 81 and the transfer chamber 83 each include at least one substrate transfer robot 86 with which a glass substrate can be transferred.

Here, the details of the deposition chamber (sputtering chamber) illustrated in FIG. 18B are described with reference to FIGS. 19A and 19B. The deposition chamber 80b illustrated in FIG. 19A includes a target 87, a shield 88, and a substrate stage 90. Here, a glass substrate 89 is provided on the substrate stage 90. Although not illustrated, the substrate stage 90 may be provided with a substrate holding mechanism that holds the glass substrate 89, a rear heater that heats the glass substrate 89 from the back surface, or the like. The shield 88 can prevent particles sputtered from the target 87 from being deposited on a region where deposition is not needed.

The deposition chamber 80b illustrated in FIG. 19A is connected to the transfer chamber 83 through a gate valve, and the transfer chamber 83 is connected to the load/unload lock chamber 82 through a gate valve. The transfer chamber 83 is provided with a substrate transfer robot 86 with which a glass substrate can be delivered between the deposition chamber 80b and the load/unload lock chamber 82. One vacuum chamber of the load/unload lock chamber 82 is divided into an upper part and a lower part, and one of the parts can be used as the load chamber and the other can be used as the unload chamber. Such a structure is preferable because the installation area of the sputtering system can be reduced.

The deposition chamber 80b in FIG. 19A is connected to a refiner 94 through a mass flow controller 97. Although the numbers of refiners 94 and mass flow controllers 97 provided correspond to the number of kinds of gases to be used, FIG. 19A shows only one refiner 94 and one mass flow controller 97 for simplicity. As the gas introduced into the deposition chamber 80b and the like, a gas with a dew point of $-80°$ C. or lower, preferably $-100°$ C. or lower is used. The use of a gas with low dew point, such as an oxygen gas or a rare gas (e.g., an argon gas), can reduce entry of moisture during the deposition.

The deposition chamber 80b in FIG. 19A is connected to a cryopump 95a through a valve, the transfer chamber 83 is connected to a cryopump 95b through a valve, and the load/unload lock chamber 82 is connected to a vacuum pump 96 through a valve. Note that the load lock chamber and the unload lock chamber of the load/unload lock chamber 82 may be independently connected to the vacuum pump. The deposition chamber 80b and the transfer chamber 83 are connected to the vacuum pump 96 through respective valves.

For example, the vacuum pump 96 can be a pump in which a dry pump and a mechanical booster pump are connected in series. With such a structure, the deposition chamber 80b and the transfer chamber 83 are evacuated from atmospheric pressure to a low vacuum (about 0.1 Pa to 10 Pa) by the vacuum pump 96, and then evacuated from a low vacuum to a high vacuum ($1 \times 10^{-4}$ Pa to $1 \times 10^{-7}$ Pa) by the cryopump 95a or the cryopump 95b after the valves are switched.

Another example of the deposition chamber in FIG. 18B, which is different from that illustrated in FIG. 19A, will be described with reference to FIG. 19B.

The deposition chamber 80b illustrated in FIG. 19B is connected to the transfer chamber 83 through a gate valve, and the transfer chamber 83 is connected to the load/unload lock chamber 82 through a gate valve.

The deposition chamber 80b in FIG. 19B is connected to the mass flow controller 97 through a gas heating mechanism 98, and the gas heating mechanism 98 is connected to the refiner 94 through the mass flow controller 97. With the gas heating mechanism 98, a gas to be introduced into the deposition chamber 80b can be heated to temperatures ranging from 40° C. to 400° C., preferably from 50° C. to 200° C. Although the numbers of gas heating mechanisms 98, refiners 94, and mass flow controllers 97 provided correspond to the number of kinds of gases to be used, FIG. 19B shows only one gas heating mechanism 98, one refiner 94, and one mass flow controller 97 for simplicity.

The deposition chamber 80b in FIG. 19B is connected to a turbo molecular pump 95c and a vacuum pump 96b through valves. For the turbo molecular pump 95c, a vacuum pump 96a is provided as an auxiliary pump through a valve. The vacuum pumps 96a and 96b can have a structure similar to that of the vacuum pump 96.

The deposition chamber 80b in FIG. 19B is provided with a cryotrap 99.

The turbo molecular pump 95c enables high productivity because of the capability of evacuating large-sized molecules (or atoms) stably and low frequency of maintenance, but has a low capability of evacuating hydrogen and water. Hence, the cryotrap 99 having a high capability of evacuating molecules (or atoms) having a relatively high melting point, such as water, is connected to the deposition chamber 80b. The temperature of a refrigerator of the cryotrap 99 is 100 K or lower, preferably 80 K or lower. In the case where the cryotrap 99 includes a plurality of refrigerators, it is preferable to set the temperature of each refrigerator at a different temperature because efficient evacuation is possible. For example, the temperature of a first-stage refrigerator can be 100 K or lower and that of a second-stage refrigerator can be 20 K or lower.

The transfer chamber 83 in FIG. 19B is connected to the vacuum pump 96b and cryopumps 95d and 95e through respective valves. With one cryopump, evacuation cannot be performed while the cryopump is regenerated; however, with two or more cryopumps connected in parallel, even when one of the cryopumps is regenerated, evacuation can be performed using the other cryopump(s). Note that regeneration of the cryopump refers to treatment for discharging molecules (or atoms) entrapped in the cryopump. The evacuation capability of the cryopump is lowered when molecules (or atoms) are entrapped too much in the cryopump; therefore, regeneration is regularly performed.

The load/unload lock chamber 82 in FIG. 19B is connected to a cryopump 95f and a vacuum pump 96c through respective valves. Note that the vacuum pump 96c can have a structure similar to that of the vacuum pump 96.

Next, the substrate heating chamber 85 illustrated in FIG. 18B will be described in detail with reference to FIG. 20.

Figure 20:
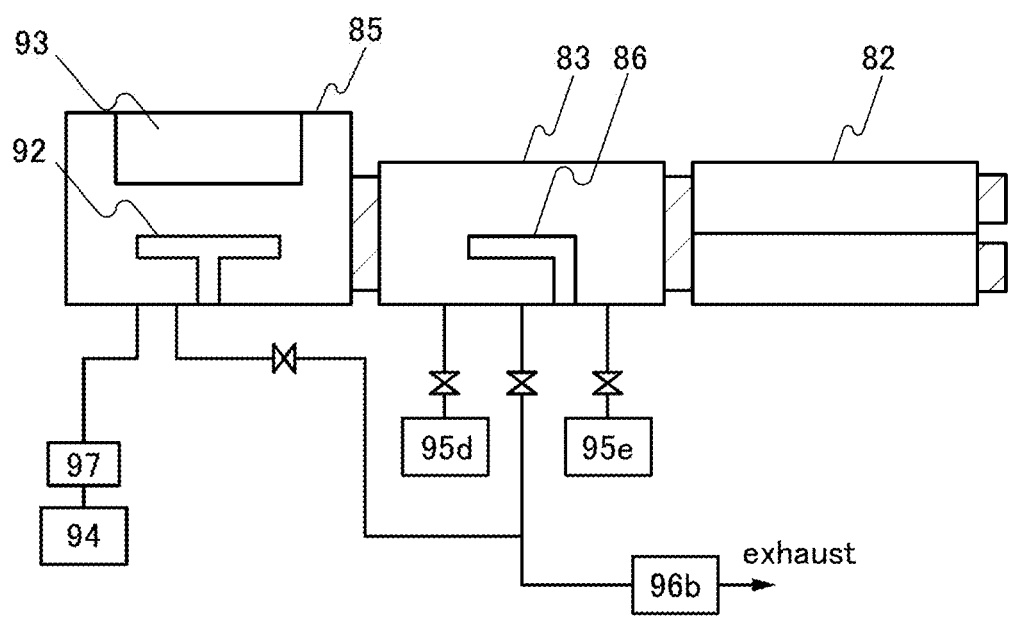
FIG. 20 is a cross-sectional view illustrating an example of a heat treatment chamber.

The substrate heating chamber 85 illustrated in FIG. 20 is connected to the transfer chamber 83 through a gate valve. The transfer chamber 83 is connected to the load/unload lock chamber 82 through a gate valve. Note that the load/unload lock chamber 82 can be evacuated in a manner similar to that in FIG. 19A or FIG. 19B.

The substrate heating chamber 85 in FIG. 20 is connected to the refiner 94 through the mass flow controller 97. Although the numbers of refiners 94 and mass flow controllers 97 provided correspond to the number of kinds of gases to be used, FIG. 20 shows only one refiner 94 and one mass flow controller 97 for simplicity. Moreover, the substrate heating chamber 85 is connected to the vacuum pump 96b through a valve.

The substrate heating chamber 85 includes a substrate stage 92. At least one substrate needs to be set on the substrate stage 92, and the substrate stage 92 may be a substrate stage on which a plurality of substrates can be set. The substrate heating chamber 85 also includes a heating mechanism 93.

For example, the heating mechanism 93 may use a resistance heater or the like for heating. Alternatively, heat conduction or heat radiation from a medium such as a heated gas may be used in the heating mechanism 93. For example, a rapid thermal annealing (RTA) apparatus such as a gas rapid thermal annealing (GRTA) apparatus or a lamp rapid thermal annealing (LRTA) apparatus can be used. In LRTA, an object is heated by emission of light (an electromagnetic wave) from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature inert gas.

Note that the back pressure of the deposition chamber 80b and the substrate heating chamber 85 is less than or equal to $1\times10^{-4}$ Pa, preferably less than or equal to $3\times10^{-5}$ Pa, more preferably less than or equal to $1\times10^{-5}$ Pa.

In the deposition chamber 80b and the substrate heating chamber 85, the partial pressure of a gas molecule (atom) having a mass-to-charge ratio (m/z) of 18 is less than or equal to $3\times10^{-5}$ Pa, preferably less than or equal to $1\times10^{-5}$ Pa, more preferably less than or equal to $3\times10^{-6}$ Pa.

In the deposition chamber 80b and the substrate heating chamber 85, the partial pressure of a gas molecule (atom) with m/z of 28 is less than or equal to $3\times10^{-5}$ Pa, preferably less than or equal to $1\times10^{-5}$ Pa, more preferably less than or equal to $3\times10^{-6}$ Pa.

In the deposition chamber 80b and the substrate heating chamber 85, the partial pressure of a gas molecule (atom) with m/z of 44 is less than or equal to $3\times10^{-5}$ Pa, preferably less than or equal to $1\times10^{-5}$ Pa, more preferably less than or equal to $3\times10^{-6}$ Pa.

Further, in the deposition chamber 80b and the substrate heating chamber 85, the leakage rate is less than or equal to $3\times10^{-6}$ Pa·m$^3$/s, preferably less than or equal to $1\times10^{-6}$ Pa·m$^3$/s.

In the deposition chamber 80b and the substrate heating chamber 85, the leakage rate of a gas molecule (atom) with m/z of 18 is less than or equal to $1\times10^{-7}$ Pa·m$^3$/s, preferably less than or equal to $3\times10^{-8}$ Pa·m$^3$/s.

In the deposition chamber 80b and the substrate heating chamber 85, the leakage rate of a gas molecule (atom) with m/z of 28 is less than or equal to $1\times10^{-5}$ Pa·m$^3$/s, preferably less than or equal to $1\times10^{-6}$ Pa·m$^3$/s.

In the deposition chamber 80b and the substrate heating chamber 85, the leakage rate of a gas molecule (atom) with m/z of 44 is less than or equal to $3\times10^{-6}$ Pa·m$^3$/s, preferably less than or equal to $1\times10^{-6}$ Pa·m$^3$/s.

The total pressure and the partial pressure in a vacuum chamber can be measured using a mass analyzer. For example, Qulee CGM-051, a quadrupole mass analyzer (also referred to as Q-mass) manufactured by ULVAC, Inc. can be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be lower than or equal to the above value.

For example, an open/close portion of the deposition chamber is preferably sealed with a metal gasket. For the metal gasket, metal covered with iron fluoride, aluminum oxide, or chromium oxide is preferably used. The metal gasket achieves higher adhesion than an O-ring and thus can reduce the external leakage. Further, the use of the metal in the passive state, which is covered with iron fluoride, aluminum oxide, chromium oxide, or the like, can prevent a gas containing impurities released from the metal gasket from being released, resulting in a reduction in the internal leakage.

For a member of the deposition system, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above member of the deposition system may be covered with iron fluoride, aluminum oxide, chromium oxide, or the like.

The member of the deposition system is preferably formed with only metal as much as possible. For example, in the case where a viewing window formed with quartz or the like is provided, it is preferable that the surface of the viewing window be thinly covered with iron fluoride, aluminum oxide, chromium oxide, or the like to suppress the released gas.

When the refiner is located immediately in front of where a deposition gas is introduced, the length of a pipe from the refiner to the deposition chamber is less than or equal to 10 m, preferably less than or equal to 5 m, more preferably less than or equal to 1 m. When the length of the pipe is 10 m or less, 5 m or less, or 1 m or less, the adverse effect of the gas released from the pipe can be reduced accordingly.

As the pipe for the deposition gas, a metal pipe the inside of which is covered with iron fluoride, aluminum oxide, chromium oxide, or the like is preferably used. With the above pipe, the amount of released gas containing impurities can be decreased and the entry of impurities into the deposition gas can be reduced as compared to a SUS316L-EP pipe, for example. Further, an ultra-compact high-performance metal gasket joint (UPG joint) is preferably used to joint pipes. A structure where all pipes are composed of metal is preferable to a structure using resin or the like because the adverse effect of released gas and external leakage can be reduced.

An adsorbate present in the deposition chamber does not affect the pressure in the deposition chamber because it is adsorbed onto an inner wall or the like; however, the adsorbate causes gas to be released when the deposition chamber is evacuated. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be subjected to baking for promotion of desorption of the adsorbate. By the baking, the desorption rate of the adsorbate can be increased about tenfold. The baking is performed at temperatures ranging from 100° C. to 450° C. At this time, when the adsorbate is removed while an inert gas is introduced into the deposition chamber, the desorption rate of water or the like, which is difficult to desorb simply by evacuation, can be further increased. Note that the desorption rate of the adsorbate can be further increased by heating of the inert gas to be introduced at substantially the same temperature as the temperature of the baking. Here, a rare gas is preferably used as the inert gas. Depending on the kind of a film to be formed, oxygen or the like may be used instead of an inert gas. For example, to form an oxide semiconductor layer, it is sometimes preferable to use oxygen, which is the main component of the oxide semiconductor.

Alternatively, treatment for evacuating the deposition chamber is preferably performed a certain period of time after a heated oxygen gas, a heated inert gas such as a heated rare gas, or the like is introduced to increase pressure in the deposition chamber. The introduction of the heated gas can desorb the adsorbate in the deposition chamber, so that the impurities present in the deposition chamber can be reduced. Note that an advantageous effect can be achieved when this treatment is repeated 2 to 30 times, preferably 5 to 15 times. Specifically, by introduction of an inert gas, oxygen, or the like with a temperature from 40° C. to 400° C., preferably from 50° C. to 200° C. into the deposition chamber, the pressure therein can be kept in the range from 0.1 Pa to 10 kPa, preferably from 1 Pa to 1 kPa, more preferably from 5 Pa to 100 Pa for a time ranging from 1 to 300 minutes, preferably 5 to 120 minutes. After that, the deposition chamber is evacuated for a time ranging from 5 to 300 minutes, preferably from 10 to 120 minutes.

The desorption rate of the adsorbate can be further increased also by dummy deposition. The dummy deposition refers to film formation on a dummy substrate by sputtering or the like, in which a film is deposited on the dummy substrate and the inner wall of the deposition chamber so that impurities in the deposition chamber and an adsorbate on the inner wall of the deposition chamber are trapped in the film. The dummy substrate is preferably a substrate that releases a smaller amount of gas, and for example, may be the same as a substrate 700 described later. By performing dummy deposition, the impurity concentration in a film to be formed can be reduced. Note that the dummy deposition may be performed at the same time as the baking of the deposition chamber.

The formation of an oxide semiconductor layer with the use of the above deposition system can prevent impurities from entering the oxide semiconductor layer. Moreover, the formation of a film in contact with the oxide semiconductor layer with the use of the above deposition system can prevent entry of impurities into the oxide semiconductor layer from the film in contact therewith.

Next, a method of forming an oxide semiconductor film (particularly a CAAC-OS film) with the use of the above deposition system will be described.

The surface temperature of a target is set at 100° C. or lower, preferably 50° C. or lower, further preferably about room temperature (typically 20° C. or 25° C.). In a sputtering apparatus for a large substrate, a large target is often used. However, it is difficult to manufacture a target for a large substrate without a juncture. In fact, a plurality of targets are arranged so that there is as little space as possible therebetween to obtain a large target; however, a slight space is inevitably generated. When the surface temperature of the target increases, Zn or the like is sometimes volatilized from such slight space, and the space might expand gradually. If the space expands, a metal of a backing plate or a metal used for adhesion might be sputtered, which causes an increase in impurity concentration. Thus, it is preferable that the target be cooled sufficiently.

Specifically, for the backing plate, a metal having high conductivity and high heat dissipation properties (specifically Cu) is used. The target can be cooled efficiently by making a sufficient amount of cooling water flow through a water channel formed in the backing plate. Here, the sufficient amount of cooling water, which depends on the size of the target, can be 3 L/min or more, 5 L/min or more, or 10 L/min or more for a circular target with a diameter of 300 mm, for example.

The CAAC-OS film is formed in an oxygen gas atmosphere at a substrate heating temperature of 100° C. to 600° C., preferably 150° C. to 550° C., more preferably 200° C. to 500° C. The thickness of the CAAC-OS film ranges from 1 nm to 40 nm, preferably from 3 nm to 20 nm. As the substrate heating temperature during the film formation is higher, the impurity concentration in the obtained CAAC-OS film is lower. Further, migration of sputtered particles on a deposition surface is likely to occur; therefore, the atomic arrangement is ordered and the density is increased, and a CAAC-OS film with a high degree of crystallinity is easily formed. With the film formation in an oxygen gas, plasma damage is reduced and a surplus atom such as a rare gas atom is not contained in the film, whereby a CAAC-OS film with a high degree of crystallinity is easily formed. Note that a mixed gas atmosphere including an oxygen gas and a rare gas may be alternatively used, in which case the percentage of the oxygen gas is 30 vol. % or higher, preferably 50 vol. % or higher, more preferably 80 vol. % or higher, still more preferably 100 vol. %.

Note that when the target includes Zn, the film formation in an oxygen gas atmosphere leads to a reduction in plasma damage; thus, a CAAC-OS film in which Zn is unlikely to be volatilized can be obtained.

The CAAC-OS film is formed under conditions in which the deposition pressure is 0.8 Pa or less, preferably 0.4 Pa or less and the distance between the target and the substrate is 40 mm or less, preferably 25 mm or less. When the CAAC-OS film is deposited under such conditions, the frequency of collision between a sputtered particle and another sputtered particle, a gas molecule, or an ion can be reduced. That is, depending on the deposition pressure, the distance between the target and the substrate is made shorter than the mean free path of a sputtered particle, a gas molecule, or an ion, so that the concentration of impurities entering the film can be reduced.

For example, when the pressure is 0.4 Pa and the temperature is 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, a methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm. Note that doubling of the pressure halves a mean free path and doubling of the absolute temperature doubles a mean free path.

The mean free path depends on pressure, temperature, and the diameter of a molecule (atom). When pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter, and the molecule (atom) entering the film lowers the degree of crystallinity because of its large diameter. For this reason, it can be said that a molecule (atom) whose diameter is larger than that of Ar, for example, is likely to behave as an impurity.

Next, heat treatment is performed. The heat treatment is performed under reduced pressure or in an inert atmosphere or an oxidation atmosphere. By the heat treatment, the impurity concentration in the CAAC-OS film can be reduced.

The heat treatment is preferably performed in such a manner that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the impurity concentration in the CAAC-OS film can be reduced; however, oxygen vacancies are caused at the same time. By the heat treatment in an oxidation atmosphere, the oxygen vacancies caused can be reduced.

When heat treatment is performed on the CAAC-OS film in addition to the substrate heating during the deposition, the impurity concentration in the film can be reduced.

Specifically, the concentration of hydrogen in the CAAC-OS film, which is measured by SIMS, can be $2 \times 10^{20}$ atoms/cm$^3$ or lower, preferably $5 \times 10^{19}$ atoms/cm$^3$ or lower, more preferably $1 \times 10^{19}$ atoms/cm$^3$ or lower, still more preferably $5 \times 10^{18}$ atoms/cm$^3$ or lower.

The concentration of nitrogen in the CAAC-OS film, which is measured by SIMS, can be lower than $5 \times 10^{19}$ atoms/cm$^3$, preferably $5 \times 10^{18}$ atoms/cm$^3$ or lower, more preferably $1 \times 10^{18}$ atoms/cm$^3$ or lower, still more preferably $5 \times 10^{17}$ atoms/cm$^3$ or lower.

The concentration of carbon in the CAAC-OS film, which is measured by SIMS, can be lower than $5 \times 10^{19}$ atoms/cm$^3$, preferably $5 \times 10^{18}$ atoms/cm$^3$ or lower, more preferably $1 \times 10^{18}$ atoms/cm$^3$ or lower, still more preferably $5 \times 10^{17}$ atoms/cm$^3$ or lower.

The amount of the following gas molecules (atoms) released from the CAAC-OS film can be $1 \times 10^{19}$/cm$^3$ or less, preferably $1 \times 10^{18}$/cm$^3$ or less, which is measured by thermal desorption spectroscopy (TDS) analysis: a gas molecule (atom) with m/z of 2 (e.g., a hydrogen molecule), a gas molecule (atom) with m/z of 18, a gas molecule (atom) with m/z of 28, and a gas molecule (atom) with m/z of 44.

The undermentioned method of measuring the amount of released oxygen atoms is referred to for a method of measuring the release amount by TDS.

In the above manner, a CAAC-OS film with a high degree of crystallinity can be formed.

Embodiment 10

Embodiment 10 will explain an example of the first transistor included in the switch described in the foregoing embodiments.

In this embodiment, a bottom-gate top-contact (BGTC) transistor, which is one of bottom-gate transistors, will be described with reference to FIGS. 21A to 21D.

Figure 21A:
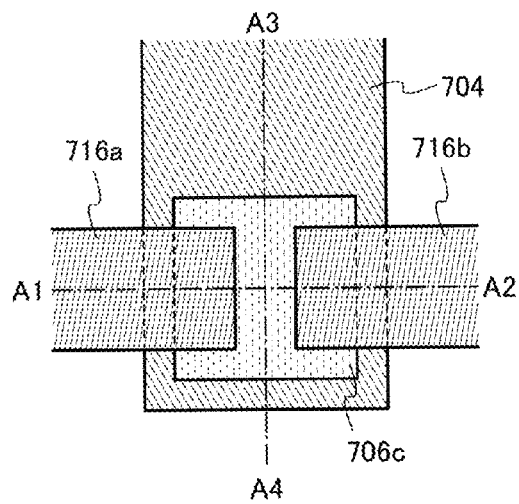
FIG. 21A is a top view and FIGS. 21B to 21D are cross-sectional views illustrating a transistor of one embodiment of the present invention.
Figure 21C:
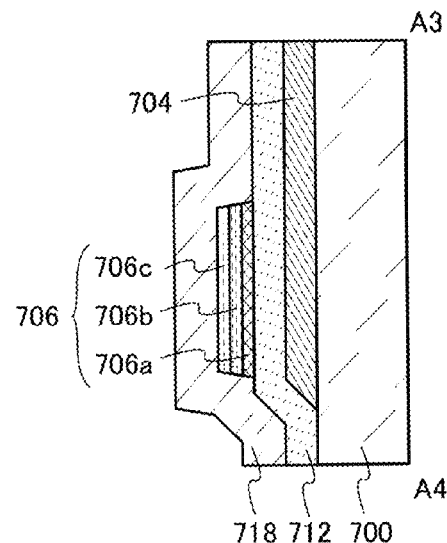
Figure 21B:
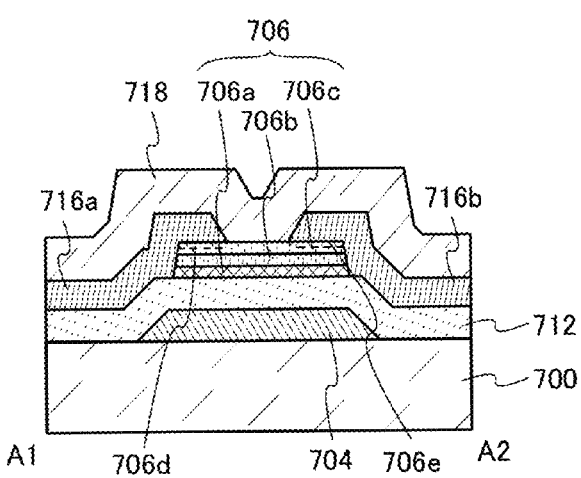

FIGS. 21A to 21D are a top view and cross-sectional views of a BGTC transistor. FIG. 21A is the top view of the transistor. FIG. 21B is a cross-sectional view along dashed-dotted line A1-A2 in FIG. 21A. FIG. 21C is a cross-sectional view along dashed-dotted line A3-A4 in FIG. 21A.

The transistor illustrated in FIG. 21B includes a gate electrode 704 over a substrate 700, a gate insulating film 712 over the gate electrode 704, the multilayer film 706 over the gate insulating film 712, a source electrode 716a and a drain electrode 716b over the gate insulating film 712 and the multilayer film 706, and a protective insulating film 718 over the multilayer film 706, the source electrode 716a, and the drain electrode 716b. In FIG. 21B, the multilayer film 706 includes the oxide layer 706a, the oxide semiconductor layer 706b over the oxide layer 706a, and the oxide layer 706c over the oxide semiconductor layer 706b.

Note that the source electrode 716a and the drain electrode 716b are preferably provided in contact with side edges of the oxide semiconductor layer 706b.

A conductive film used for the source electrode 716a and the drain electrode 716b may deprive part of the oxide layer 706c of oxygen depending on the kind of the conductive film, so that a source region 706d and a drain region 706e may be formed as illustrated in FIG. 21B.

In FIG. 21A, the distance between the source electrode 716a and the drain electrode 716b in a region overlapping the gate electrode 704 refers to channel length. Note that when the transistor includes the source region 706d and the drain region 706e, the distance between the source region 706d and the drain region 706e in a region overlapping the gate electrode 704 may refer to channel length.

Note that a channel formation region is a region that is included in the multilayer film 706, overlaps the gate electrode 704, and is sandwiched between the source electrode 716a and the drain electrode 716b (see FIG. 21B). A channel is a region which is included in the channel formation region and through which current mainly flows. Here, the channel refers to the oxide semiconductor layer 706b in the channel formation region.

The multilayer film 706 and the oxide layer 706a, the oxide semiconductor layer 706b, and the oxide layer 706c included in the multilayer film 706 will be described below.

The oxide layer 706a contains at least one kind of the elements composing the oxide semiconductor layer 706b. The energy at the bottom of the conduction band of the oxide layer 706a is located closer to the vacuum level than that of the oxide semiconductor layer 706b by 0.05 eV or more, 0.07 eV or more, 0.1 eV or more, or 0.15 eV or more and 2 eV or less, 1 eV or less, 0.5 eV or less, or 0.4 eV or less. Note that the oxide semiconductor layer 706b preferably contains at least indium because carrier mobility can be increased. When an electric field is applied to the gate electrode 704 at this time, a channel is formed in the oxide semiconductor layer 706b, which has low energy at the bottom of the conduction band, in the multilayer film 706. That is, with the oxide layer 706a provided between the oxide semiconductor layer 706b and the gate insulating film 712, the channel of the transistor can be formed in the oxide semiconductor layer 706b, which is not in contact with the gate insulating film 712. Since the oxide layer 706a contains one or more elements included in the oxide semiconductor layer 706b, interface scattering is unlikely to occur at the interface between the oxide semiconductor layer 706b and the oxide layer 706a. Thus, the transistor can have high field-effect mobility because the movement of carriers is not hindered at the interface.

The thickness of the oxide layer 706a ranges from 3 nm to 100 nm, preferably from 3 nm to 50 nm. The thickness of the oxide semiconductor layer 706b ranges from 3 nm to 200 nm, preferably from 3 nm to 100 nm, more preferably from 3 nm to 50 nm.

The oxide layer 706c contains at least one kind of the elements composing the oxide semiconductor layer 706b. The energy at the bottom of the conduction band of the oxide layer 706c is located closer to the vacuum level than that of the oxide semiconductor layer 706b by 0.05 eV or more, 0.07 eV or more, 0.1 eV or more, or 0.15 eV or more and 2 eV or less, 1 eV or less, 0.5 eV or less, or 0.4 eV or less. Since the oxide layer 706c contains one or more kinds of elements contained in the oxide semiconductor layer 706b, an interface state is unlikely to be formed at the interface between the oxide semiconductor layer 706b and the oxide layer 706c. When an interface state is formed at the interface, a second transistor in which the interface serves as a channel and which has a different threshold voltage may be formed and the apparent threshold voltage of the transistor is changed accordingly in some cases. Thus, with the oxide layer 706c, variation in electrical characteristics (e.g., threshold voltage) of transistors can be reduced.

The thickness of the oxide layer 706c ranges from 3 nm to 100 nm, preferably from 3 nm to 50 nm.

For example, each of the oxide layers 706a and 706c can be an oxide layer in which the same elements as the oxide semiconductor layer 706b (i.e., indium, gallium, and zinc) are contained as the main components and the atomic ratio of gallium is higher than that of the oxide semiconductor layer 706b. Specifically, an oxide layer in which the atomic ratio of gallium is 1.5 times or more, preferably 2 times or more, further preferably 3 times or more that of the oxide semiconductor layer 706b is used as each of the oxide layers 706a and 706c. Gallium is strongly bonded to oxygen and thus has a function of preventing oxygen vacancies from occurring in the oxide layer. In other words, the oxide layers 706a and 706c are oxide layers in which oxygen vacancies are less likely to occur than in the oxide semiconductor layer 706b.

Note that the oxide layer 706a, the oxide semiconductor layer 706b, and the oxide layer 706c are amorphous or crystalline. It is preferable that the oxide layer 706a be amorphous, the oxide semiconductor layer 706b be crystalline, and the oxide layer 706c be amorphous or crystalline. The crystalline oxide semiconductor layer 706b, in which the channel is formed, gives the transistor stable electrical characteristics.

Next, the other components of the transistor will be described.

There is no particular limitation on the substrate 700. For example, a glass substrate, a ceramic substrate, a quartz substrate, or a sapphire substrate may be used as the substrate 700. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. Still alternatively, any of these substrates provided with a semiconductor element may be used as the substrate 700.

Depending on the substrate 700, microfabrication is sometimes difficult due to the shrinkage of the substrate 700 caused by heat treatment or the like in a fabrication process of a semiconductor device. For this reason, the substrate 700 is preferably a substrate with low shrinkage during heat treatment. For example, the substrate 700 may be a glass substrate that has a shrinkage of 10 ppm or less, preferably 5 ppm or less, more preferably 3 ppm or less after heat treatment at 400° C., preferably 450° C., more preferably 500° C. for one hour.

Alternatively, a flexible substrate may be used as the substrate 700. As a method of providing a transistor over a flexible substrate, there is a method in which a transistor is formed over a non-flexible substrate, and then separated from the non-flexible substrate and transferred to the flexible substrate 700. In this case, a separation layer is preferably provided between the non-flexible substrate and the transistor.

The gate electrode 704 can be formed using a single layer or a stacked layer of a conductive film containing at least one of aluminum, titanium, chromium, cobalt, nickel, copper, yttrium, zirconium, molybdenum, ruthenium, silver, tantalum, and tungsten.

As illustrated in FIG. 21A, the gate electrode 704 is provided so that the edge of the multilayer film 706 is located inside the edge of the gate electrode 704. Thus, when light enters from the substrate 700 side, carriers can be prevented from being generated in the multilayer film 706 by the light. Note that it is also possible that the multilayer film 706 is formed to extend over the edge of the gate electrode 704.

The gate insulating film 712 can be formed using a single layer or a stacked layer of an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 712 may be, for example, a multilayer film including a silicon nitride layer as the first layer and a silicon oxide layer as the second layer. In this case, a silicon oxynitride layer may be used instead of the silicon oxide layer, and a silicon nitride oxide layer may be used instead of the silicon nitride layer. As the silicon oxide layer, a silicon oxide layer with a low defect density is preferably used. Specifically, a silicon oxide layer that has a spin density of $3 \times 10^{17}$ spins/cm$^3$ or less, preferably $5 \times 10^{16}$ spins/cm$^3$ or less corresponding to a signal at a g-factor of 2.001 in electron spin resonance (ESR) is used. As the silicon oxide layer, a silicon oxide layer containing excess oxygen is preferably used. As the silicon nitride layer, a silicon nitride layer that releases a small amount of hydrogen and ammonia is used. The amount of released hydrogen and released ammonia can be measured by TDS.

The source electrode 716a and the drain electrode 716b can be formed using a single layer or a stacked layer of a conductive film containing at least one of aluminum, titanium, chromium, cobalt, nickel, copper, yttrium, zirconium, molybdenum, ruthenium, silver, tantalum, and tungsten. Note that the source electrode 716a and the drain electrode 716b may have the same composition or different compositions.

The protective insulating film 718 can be formed using a single layer or a stacked layer of an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 718 may be, for example, a multilayer film including a silicon oxide layer as the first layer and a silicon nitride layer as the second layer. In this case, a silicon oxynitride layer may be used instead of the silicon oxide layer, and a silicon nitride oxide layer may be used instead of the silicon nitride layer. As the silicon oxide layer, a silicon oxide layer with a low defect density is preferably used. Specifically, a silicon oxide layer that has a spin density of $3 \times 10^{17}$ spins/cm$^3$ or less, preferably $5 \times 10^{16}$ spins/cm$^3$ or less corresponding to a signal at a g-factor of 2.001 in ESR is used. As the silicon nitride layer, a silicon nitride layer that releases a small amount of hydrogen and ammonia is used. The amount of released hydrogen and released ammonia can be measured by TDS. Further, as the silicon nitride layer, a silicon nitride layer through which oxygen does not penetrate or hardly penetrates is used.

Figure 21D:
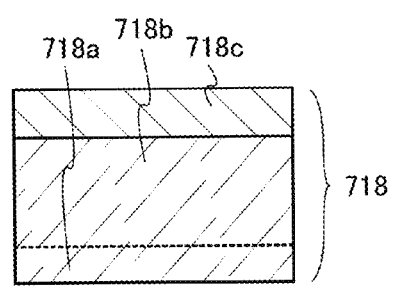

Alternatively, the protective insulating film 718 may be, for example, a multilayer film in which the first layer is a first silicon oxide layer 718a, the second layer is a second silicon oxide layer 718b, and the third layer is a silicon nitride layer 718c (see FIG. 21D). In this case, the first silicon oxide layer 718a and/or the second silicon oxide layer 718b may be a silicon oxynitride layer. Moreover, the silicon nitride layer 718c may be a silicon nitride oxide layer. As the first silicon oxide layer 718a, a silicon oxide layer with a low defect density is preferably used. Specifically, a silicon oxide layer that has a spin density of $3\times10^{17}$ spins/cm$^3$ or less, preferably $5\times10^{16}$ spins/cm$^3$ or less corresponding to a signal at a g-factor of 2.001 in ESR is used. As the second oxide layer 718b, a silicon oxide layer containing excess oxygen is used. As the silicon nitride layer 718c, a silicon nitride layer that releases a small amount of hydrogen and ammonia is used. The amount of released hydrogen and released ammonia can be measured by TDS. Further, as the silicon nitride layer, a silicon nitride layer through which oxygen does not penetrate or hardly penetrates is used.

The silicon oxide layer containing excess oxygen indicates a silicon oxide layer from which oxygen can be released by heat treatment or the like. When the above definition of the silicon oxide layer is applied broadly to an insulating film, an insulating film having excess oxygen means an insulating film from which oxygen is released by heat treatment.

Here, a film from which oxygen is released by heat treatment may release oxygen whose amount (converted into the number of oxygen atoms) is $1\times10^{18}$ atoms/cm$^3$ or higher, $1\times10^{19}$ atoms/cm$^3$ or higher, or $1\times10^{20}$ atoms/cm$^3$ or higher in TDS analysis.

A method of measuring the amount of released oxygen using TDS analysis will be described below.

The total amount of released gas from a measurement sample in TDS is proportional to the integral value of the ion intensity of the released gas. Then, this integral value is compared with a reference sample, whereby the total amount of released gas can be calculated.

For example, the number of released oxygen molecules ($N_{O2}$) from a measurement sample can be calculated according to Formula (1) using the TDS results of a silicon wafer containing hydrogen at a predetermined density, which is the reference sample, and the TDS results of the measurement sample. Here, all gases having a mass number of 32 which are obtained in the TDS analysis are assumed to originate from an oxygen molecule. CH$_3$OH, which is a gas having a mass number of 32, is not taken into consideration because it is unlikely to be present. Further, an oxygen molecule including an oxygen atom having a mass number of 17 or 18, which is an isotope of an oxygen atom, is also not taken into consideration because the proportion of such a molecule in the natural world is minimal

[Formula 1]

$$N_{O2} = \frac{N_{H2}}{S_{H2}} \times S_{O2} \times \alpha \quad (1)$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the measurement sample is analyzed by TDS. In addition, $\alpha$ is a coefficient affecting the ion intensity in the TDS analysis. Refer to Japanese Published Patent Application No. H6-275697 for the details of Formula (1). The amount of released oxygen is measured with EMD-WA1000S/W, a thermal desorption spectroscopy apparatus produced by ESCO Ltd., using a silicon wafer containing hydrogen atoms at $1\times10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

The film from which oxygen is released by heat treatment may contain a peroxide radical, which specifically means that the spin density attributed to a peroxide radical is $5\times10^{17}$ spins/cm$^3$ or higher. Note that the film containing a peroxide radical may have an asymmetric signal at a g-factor of around 2.01 in ESR.

The insulating film containing excess oxygen may be formed using oxygen-excess silicon oxygen ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by RBS.

In the case where at least one of the gate insulating film 712 and the protective insulating film 718 includes an insulating film containing excess oxygen, oxygen vacancies in the oxide semiconductor layer 706b can be reduced.

The transistor formed with the above components has a channel in the oxide semiconductor layer 706b of the multilayer film 706, and thus has stable electrical characteristics and high field-effect mobility.

Next, a method of fabricating the transistor illustrated in FIGS. 21A to 21D will be described with reference to FIGS. 22A to 22C and FIGS. 23A and 23B.

First, the substrate 700 is prepared.

Next, a conductive film to be the gate electrode 704 is formed. As the conductive film to be the gate electrode 704, any of the conductive films mentioned above as the gate electrode 704 can be deposited by sputtering, chemical vapor deposition (CVD), molecular beam epitaxy (MBE), atomic layer deposition (ALD), or pulsed laser deposition (PLD).

Figure 22A:
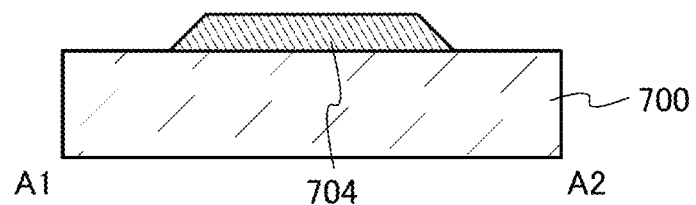
FIGS. 22A to 22C are cross-sectional views illustrating a method of fabricating a transistor of one embodiment of the present invention.

Then, the conductive film to be the gate electrode 704 is partly etched to form the gate electrode 704 (see FIG. 22A).

Figure 22B:
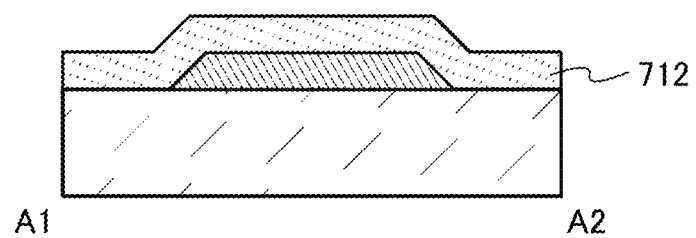

Next, the gate insulating film 712 is formed (see FIG. 22B). As the gate insulating film 712, any of the insulating films mentioned above as the gate insulating film 712 can be deposited by sputtering, CVD, MBE, ALD, or PLD.

Then, an oxide layer to be the oxide layer 706a is formed. As the oxide layer to be the oxide layer 706a, any of the oxide layers mentioned above as the oxide layer 706a can be deposited by sputtering, CVD, MBE, ALD, or PLD.

Next, an oxide semiconductor layer to be the oxide semiconductor layer 706b is formed. The oxide semiconductor layer 706b can be formed by referring to the description in Embodiment 9.

Subsequently, an oxide layer to be the oxide layer 706c is formed. As the oxide layer to be the oxide layer 706c, any of the oxide layers mentioned above as the oxide layer 706c can be deposited by sputtering, CVD, MBE, ALD, or PLD.

It is preferable to successively form the oxide layer to be the oxide layer 706a, the oxide semiconductor layer to be the oxide semiconductor layer 706b, and the oxide layer to be the oxide layer 706c without exposure to the air, because impurities are less likely to enter interfaces between the layers.

Figure 22C:
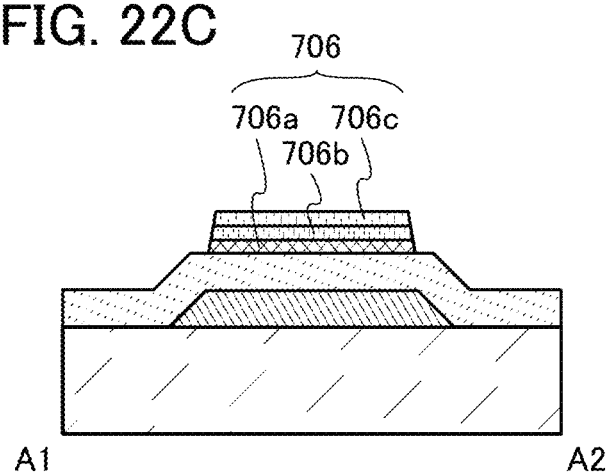

Then, the oxide layer to be the oxide layer 706a, the oxide semiconductor layer to be the oxide semiconductor layer 706b, and the oxide layer to be the oxide layer 706c are partly etched to form the multilayer film 706 including the oxide layer 706a, the oxide semiconductor layer 706b, and the oxide layer 706c (see FIG. 22C).

Subsequently, first heat treatment is preferably performed. The first heat treatment can be performed at temperatures ranging from 250° C. to 650° C., preferably from 300° C. to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for the loss of oxygen due to desorption. By the first heat treatment, the crystallinity of the oxide semiconductor layer 706b can be improved, and in addition, impurities such as hydrogen and water can be removed from the gate insulating film 712 and/or the multilayer film 706.

Next, a conductive film to be the source electrode 716a and the drain electrode 716b is formed. As the conductive film to be the source electrode 716a and the drain electrode 716b, any of the conductive films mentioned above as the source electrode 716a and the drain electrode 716b can be deposited by sputtering, CVD, MBE, ALD, or PLD.

Figure 23A:
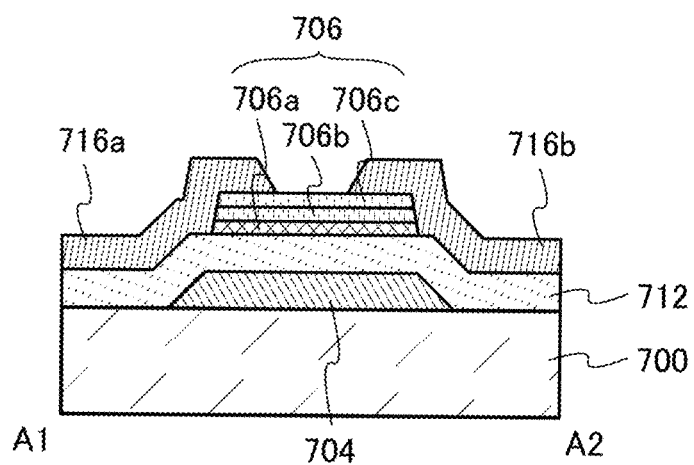
FIGS. 23A and 23B are cross-sectional views illustrating a method of fabricating a transistor of one embodiment of the present invention.

Then, the conductive film to be the source electrode 716a and the drain electrode 716b is partly etched to form the source electrode 716a and the drain electrode 716b (see FIG. 23A).

Next, second heat treatment is preferably performed. The description of the first heat treatment can be referred to for the second heat treatment. By the second heat treatment, impurities such as hydrogen and water can be removed from the multilayer film 706. Note that water is a compound containing hydrogen and thus may act as impurities in the oxide semiconductor layer 706b.

Figure 23B:
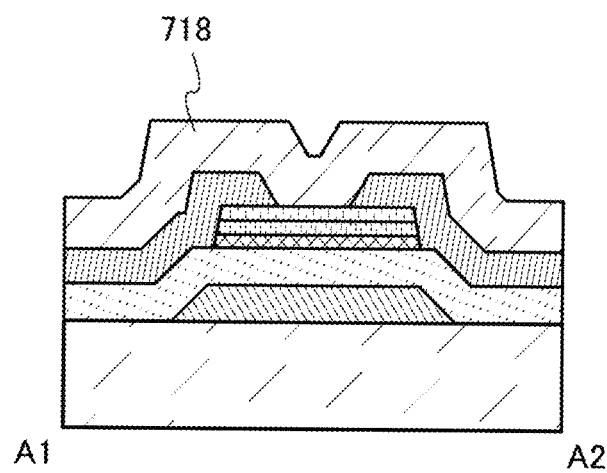

Then, the protective insulating film 718 is formed (see FIG. 23B). As the protective insulating film 718, any of the insulating films mentioned above as the protective insulating film 718 can be deposited by sputtering, CVD, MBE, ALD, or PLD.

Here, the case where the protective insulating film 718 has a three-layer structure illustrated in FIG. 21D is described. First, the first silicon oxide layer 718a is formed. Then, the second oxide layer 718b is formed. Subsequently, it is preferable to perform treatment for adding oxygen ions to the second oxide layer 718b. The treatment for adding oxygen ions can be performed by an ion doping apparatus or a plasma treatment apparatus. As the ion doping apparatus, an ion doping apparatus having a mass separation function may be used. As a source for oxygen ions, an oxygen gas such as $^{16}O_2$ or $^{18}O_2$, a nitrous oxide gas, an ozone gas, or the like can be used. Next, the silicon nitride layer 718c is formed; thus, the protective insulating film 718 is completed.

Next, third heat treatment is preferably performed. The description of the first heat treatment can be referred to for the third heat treatment. By the third heat treatment, excess oxygen is released from the gate insulating film 712 and/or the protective insulating film 718, so that oxygen vacancies in the multilayer film 706 can reduced. Note that in the multilayer film 706, oxygen vacancies appear to move by capturing adjacent oxygen atoms; thus, excess oxygen can reach the oxide semiconductor layer 706b through the oxide layer 706a or the oxide layer 706c.

Through the above steps, the BGTC transistor can be fabricated. The transistor has stable electrical characteristics because oxygen vacancies in the oxide semiconductor layer 706b of the multilayer film 706 are reduced.

Embodiment 11

Embodiment 11 will explain another example of the transistor that is different from the transistor illustrated in FIGS. 21A to 21D in Embodiment 10.

In this embodiment, a top-gate top-contact (TGTC) transistor, which is one of top-gate transistors, will be described with reference to FIGS. 24A to 24C.

Figure 24A:
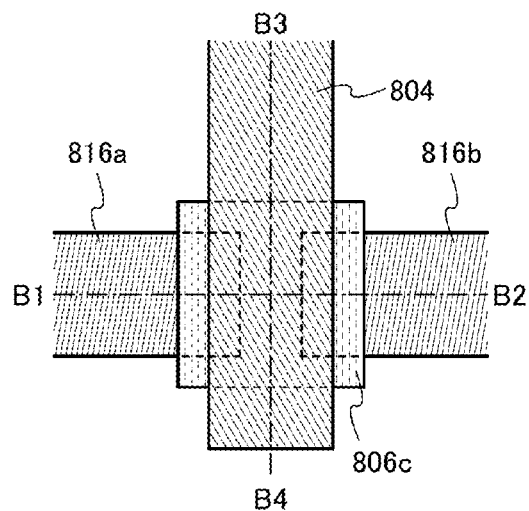
FIG. 24A is a top view and FIGS. 24B and 24C are cross-sectional views illustrating a transistor of one embodiment of the present invention.
Figure 24C:
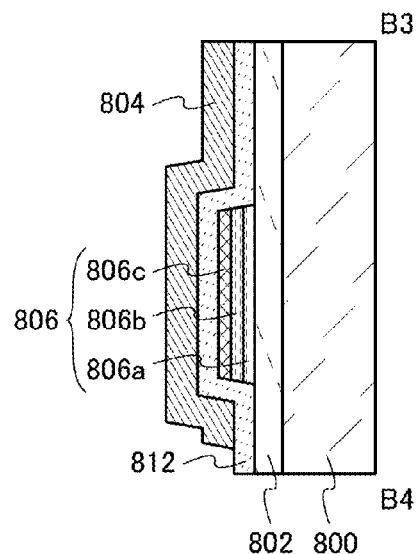
Figure 24B:
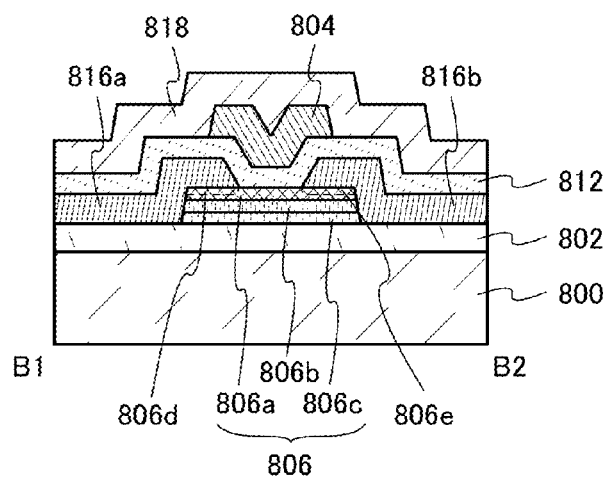

FIGS. 24A to 24C are a top view and cross-sectional views of a TGTC transistor. FIG. 24A is the top view of the transistor. FIG. 24B is a cross-sectional view along dashed-dotted line B1-B2 in FIG. 24A. FIG. 24C is a cross-sectional view along dashed-dotted line B3-B4 in FIG. 24A.

The transistor illustrated in FIG. 24B includes a base insulating film 802 over a substrate 800; a multilayer film 806 including an oxide layer 806a over the base insulating film 802, an oxide semiconductor layer 806b over the oxide layer 806a, and an oxide layer 806c over the oxide semiconductor layer 806b; a source electrode 816a and a drain electrode 816b over the base insulating film 802 and the multilayer film 806; a gate insulating film 812 over the multilayer film 806, the source electrode 816a, and the drain electrode 816b; a gate electrode 804 over the gate insulating film 812; and a protective insulating film 818 over the gate insulating film 812 and the gate electrode 804. Note that the transistor does not necessarily include the base insulating film 802 and/or the protective insulating film 818.

Note that the source electrode 816a and the drain electrode 816b are preferably provided in contact with side edges of the oxide semiconductor layer 806b.

A conductive film used for the source electrode 816a and the drain electrode 816b may deprive part of the oxide layer 806c of oxygen depending on the kind of the conductive film, so that a source region 806d and a drain region 806e may be formed as illustrated in FIG. 24B.

In FIG. 24A, the distance between the source electrode 816a and the drain electrode 816b in a region overlapping the gate electrode 804 refers to channel length. Note that when the transistor includes the source region and the drain region, the distance between the source region and the drain region in a region overlapping the gate electrode 804 may refer to channel length.

Note that a channel formation region is a region that is included in the multilayer film 806, overlaps the gate electrode 804, and is sandwiched between the source electrode 816a and the drain electrode 816b. A channel is a region which is included in the channel formation region and through which current mainly flows. Here, the channel refers to the oxide semiconductor layer 806b in the channel formation region.

The description of the multilayer film 706 is referred to for the multilayer film 806. Specifically, the descriptions of the oxide layer 706c, the oxide semiconductor layer 706b, and the oxide layer 706a are referred to for the oxide layer 806a, the oxide semiconductor layer 806b, and the oxide layer 806c, respectively.

The description of the substrate 700 is referred to for the substrate 800. The description of the source electrode 716a and the drain electrode 716b is referred to for the source electrode 816a and the drain electrode 816b. The description of the gate insulating film 712 is referred to for the gate insulating film 812. The description of the gate electrode 704 is referred to for the gate electrode 804. The description of the protective insulating film 718 is referred to for the protective insulating film 818.

Although the multilayer film 806 is formed to extend over the edge of the gate electrode 804 in FIG. 24A, the multilayer film 806 may be formed inside the edge of the gate electrode 804 in order to prevent carriers from being generated in the multilayer film 806 by light.

The base insulating film 802 can be formed using a single layer or a stacked layer of an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 802 may be, for example, a multilayer film including a silicon nitride layer as the first layer and a silicon oxide layer as the second layer. In this case, a silicon oxynitride layer may be used instead of the silicon oxide layer, and a silicon nitride oxide layer may be used instead of the silicon nitride layer. As the silicon oxide layer, a silicon oxide layer with a low defect density is preferably used. Specifically, a silicon oxide layer that has a spin density of $3\times10^{17}$ spins/cm$^3$ or less, preferably $5\times10^{16}$ spins/cm$^3$ or less corresponding to a signal at a g-factor of 2.001 in ESR is used. As the silicon nitride layer, a silicon nitride layer that releases a small amount of hydrogen and ammonia is used. The amount of released hydrogen and released ammonia can be measured by TDS. Further, as the silicon nitride layer, a silicon nitride layer through which oxygen does not penetrate or hardly penetrates is used.

Alternatively, the base insulating film 802 may be, for example, a multilayer film in which the first layer is a first silicon nitride layer, the second layer is a first silicon oxide layer, and the third layer is a second silicon oxide layer. In this case, the first silicon oxide layer and/or the second silicon oxide layer may be a silicon oxynitride layer. Moreover, the silicon nitride layer may be a silicon nitride oxide layer. As the first silicon oxide layer, a silicon oxide layer with a low defect density is preferably used. Specifically, a silicon oxide layer that has a spin density of $3\times10^{17}$ spins/cm$^3$ or less, preferably $5\times10^{16}$ spins/cm$^3$ or less corresponding to a signal at a g-factor of 2.001 in ESR is used. As the second oxide layer, a silicon oxide layer containing excess oxygen is used. As the silicon nitride layer, a silicon nitride layer that releases a small amount of hydrogen and ammonia is used. The amount of released hydrogen and released ammonia can be measured by TDS. Further, as the silicon nitride layer, a silicon nitride layer through which oxygen does not penetrate or hardly penetrates is used.

In the case where at least one of the gate insulating film 812 and the base insulating film 802 includes an insulating film containing excess oxygen, oxygen vacancies in the oxide semiconductor layer 806b can be reduced.

The transistor formed with the above components has a channel in the oxide semiconductor layer 806b of the multilayer film 806, and thus has stable electrical characteristics and high field-effect mobility.

Next, a method of fabricating the transistor illustrated in FIGS. 24A to 24C will be described with reference to FIGS. 25A to 25C and FIGS. 26A and 26B.

First, the substrate 800 is prepared. Then, the base insulating film 802 is formed. The above description is referred to for the kind and the like of the base insulating film 802.

Next, an oxide layer to be the oxide layer 806a is formed. The description of the oxide layer 706c is referred to for a method of forming the oxide layer to be the oxide layer 806a.

Then, an oxide semiconductor layer to be the oxide semiconductor layer 806b is formed. The description of the oxide semiconductor layer 706b is referred to for a method of forming the oxide semiconductor layer to be the oxide semiconductor layer 806b.

Subsequently, an oxide layer to be the oxide layer 806c is formed. The description of the oxide layer 706a is referred to for a method of forming the oxide layer to be the oxide layer 806c.

Subsequently, first heat treatment is preferably performed. The first heat treatment can be performed at temperatures ranging from 250° C. to 650° C., preferably from 300° C. to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for the loss of oxygen due to desorption. By the first heat treatment, the crystallinity of the oxide semiconductor layer to be the oxide semiconductor layer 806b can be improved, and in addition, impurities such as hydrogen and water can be removed from the oxide semiconductor layer to be the oxide semiconductor layer 806b and/or the oxide layer to be the oxide layer 806c.

Figure 25A:
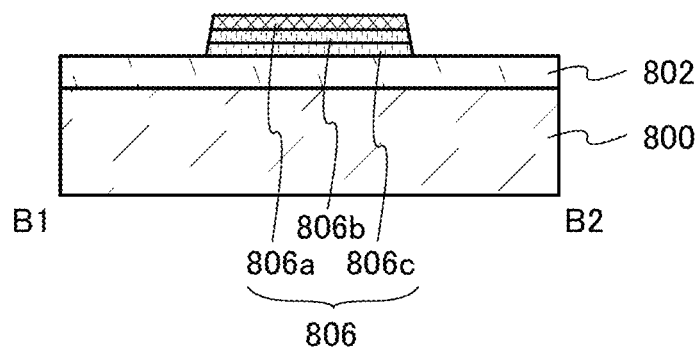
FIGS. 25A to 25C are cross-sectional views illustrating a method of fabricating a transistor of one embodiment of the present invention.

Then, the oxide layer to be the oxide layer 806a, the oxide semiconductor layer to be the oxide semiconductor layer 806b, and the oxide layer to be the oxide layer 806c are partly etched to form the multilayer film 806 including the oxide layer 806a, the oxide semiconductor layer 806b, and the oxide layer 806c (see FIG. 25A).

Next, a conductive film to be the source electrode 816a and the drain electrode 816b is formed. The description of the source electrode 716a and the drain electrode 716b is referred to for a method of forming the conductive film to be the source electrode 816a and the drain electrode 816b.

Figure 25B:
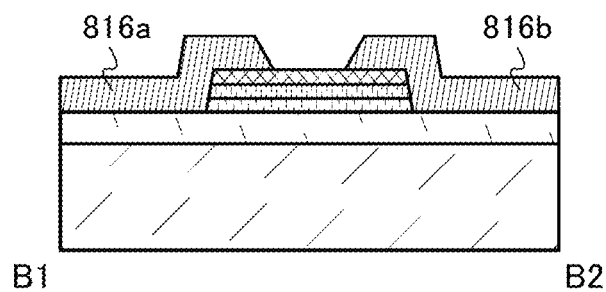

Then, the conductive film to be the source electrode 816a and the drain electrode 816b is partly etched to form the source electrode 816a and the drain electrode 816b (see FIG. 25B).

Next, second heat treatment is preferably performed. The description of the first heat treatment can be referred to for the second heat treatment. By the second heat treatment, impurities such as hydrogen and water can be removed from the multilayer film 806.

Figure 25C:
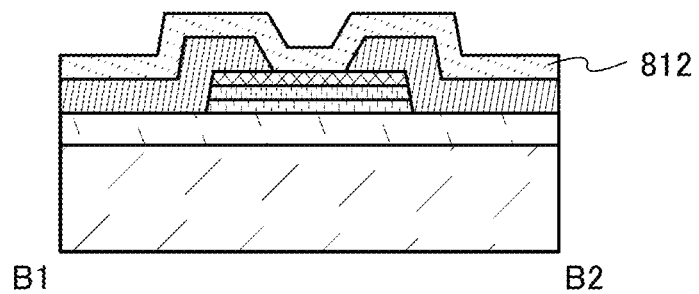

Then, the gate insulating film 812 is formed (see FIG. 25C). The description of the gate insulating film 712 is referred to for a method of forming the gate insulating film 812.

Next, a conductive film to be the gate electrode 804 is formed. The description of the conductive film to be the gate electrode 704 is referred to for a method of forming the conductive film to be the gate electrode 804.

Figure 26A:
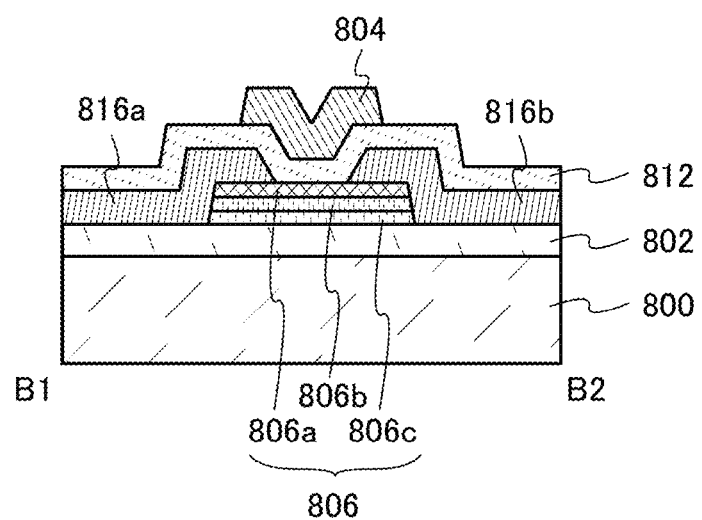
FIGS. 26A and 26B are cross-sectional views illustrating a method of fabricating a transistor of one embodiment of the present invention.

Then, the conductive film to be the gate electrode 804 is partly etched to form the gate electrode 804 (see FIG. 26A).

Figure 26B:
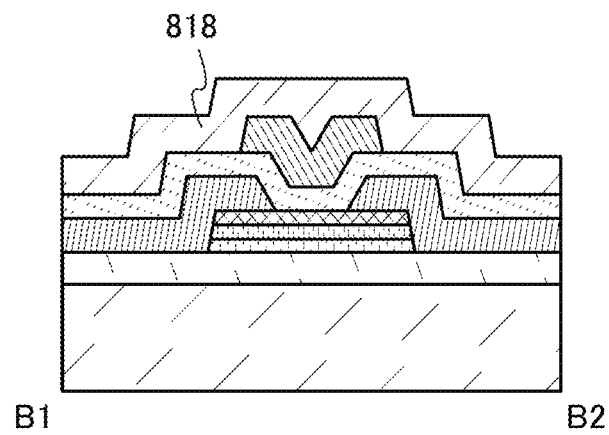

Next, the protective insulating film 818 is formed (see FIG. 26B). The description of the protective insulating film 718 is referred to for a method of forming the protective insulating film 818.

Through the above steps, the transistor can be fabricated. The transistor has stable electrical characteristics because oxygen vacancies in the oxide semiconductor layer 806b of the multilayer film 806 are reduced.

Embodiment 12

Figure 27:
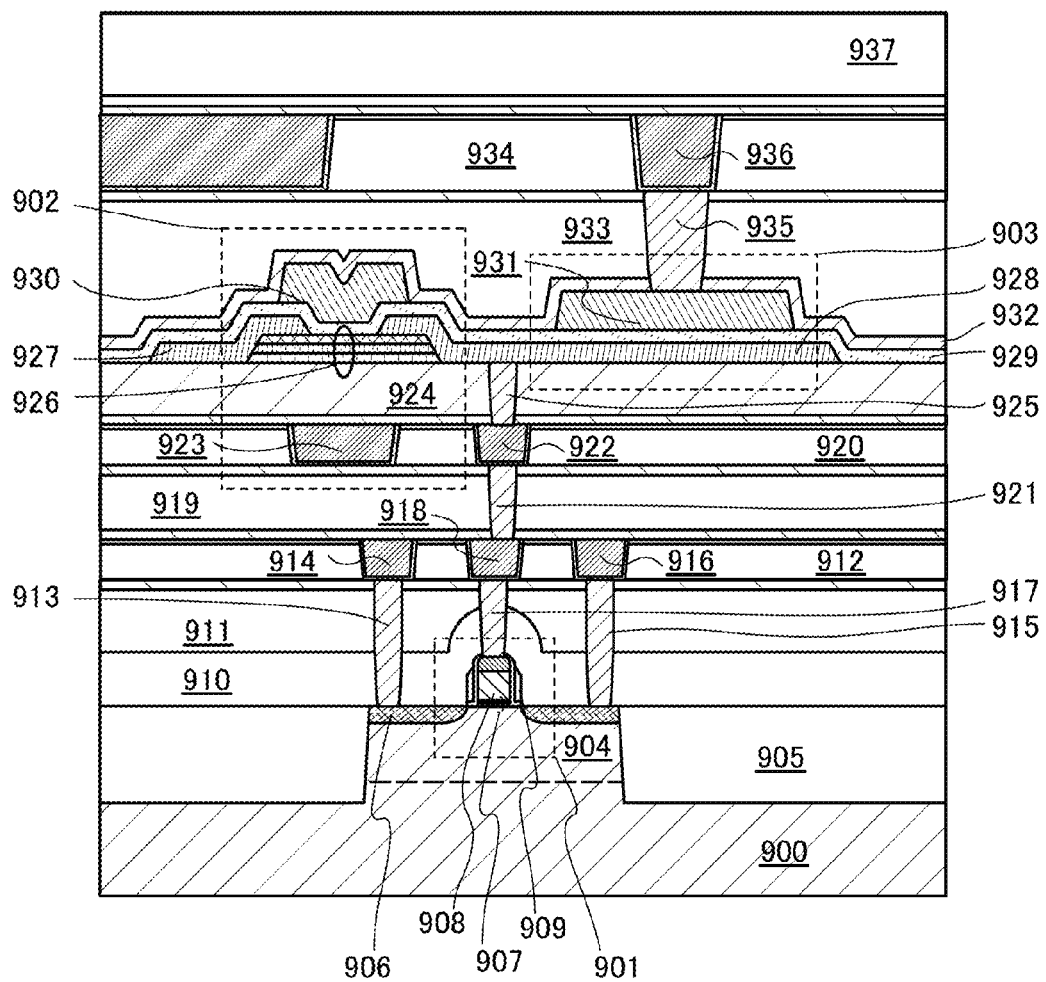
FIG. 27 is a cross-sectional view illustrating one embodiment of a semiconductor device.

Referring to FIG. 27, Embodiment 12 will explain an example of a cross-sectional structure and a fabrication method of the switch described in the foregoing embodiments, which includes a first transistor 902 in which an oxide semiconductor is used for a channel formation region and a second transistor 901 in which a single crystal silicon wafer is used for a channel formation region.

Note that a semiconductor material such as germanium, silicon germanium, or single crystal silicon carbide as well as silicon may be used for the second transistor 901 included in the switch. A transistor including silicon can be formed using a silicon thin film formed by an SOI method or a silicon thin film formed by vapor deposition, for example; in this case, a glass substrate formed by a fusion process or a float process, a quartz substrate, a semiconductor substrate, a ceramic substrate, or the like can be used as a substrate. In the case where a glass substrate is used and the temperature of heat treatment to be performed later is high, it is preferable to use a glass substrate with a strain point of 730° C. or higher.

FIG. 27 illustrates an embodiment of a cross-sectional structure showing the circuit structure of one group that stores one piece of configuration data in the switch. In this case, the second transistor 901 using a single crystal silicon wafer is formed, and the first transistor 902 using an oxide semiconductor and a capacitor 903 are formed above the second transistor 901. In other words, the switch shown in this embodiment is a semiconductor device that has a three-dimensional layered structure in which a silicon wafer is used as a substrate and a first transistor layer is provided above the silicon wafer. Moreover, the switch in this embodiment is a hybrid semiconductor device including a transistor in which silicon is used for a channel formation region and a transistor in which an oxide semiconductor is used for a channel formation region.

Although only a cross section of the structure of part of the switch is shown in this embodiment, a logic element or another circuit can be configured with this layered structure. Thus, the whole PLD can be integrated in this layered structure.

The second transistor 901 formed using a substrate 900 containing a semiconductor material can be either an n-channel transistor (nMOSFET) or a p-channel transistor (pMOSFET). In the example illustrated in FIG. 27, the second transistor 901 is electrically isolated from other elements by a shallow trench isolation (STI) 905. The use of the STI 905 can reduce generation of a bird's beak, which is caused by a LOCOS element isolation method, in an element isolation region and can reduce the size of the element isolation region. On the other hand, in a semiconductor device that is not required to be structurally miniaturized or downsized, the STI 905 is not necessarily formed and an element isolation means such as LOCOS can be used. In the substrate 900 where the second transistor 901 is formed, a well 904 to which an impurity imparting conductivity, such as boron, phosphorus, or arsenic, is added is formed.

The second transistor 901 in FIG. 27 includes a channel formation region in the substrate 900, impurity regions 906 (also referred to as a source region and a drain region) provided such that the channel formation region is placed therebetween, a gate insulating film 907 over the channel formation region, and a gate electrode layer 908 provided over the gate insulating film 907 to overlap the channel formation region. The gate electrode layer 908 can have a stacked structure of a gate electrode layer including a first material for increasing processing accuracy and a gate electrode layer including a second material for decreasing the resistance as a wiring. For example, the gate electrode layer 908 can have a stacked structure of crystalline silicon to which an impurity imparting conductivity, such as phosphorus, is added and nickel silicide. Note that the structure is not limited to this, and materials, the number of stacked layers, the shape, or the like can be adjusted as appropriate depending on required specifications.

Note that the second transistor 901 illustrated in FIG. 27 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film placed between the gate electrode layer and the protrusion. With the second transistor having a fin-type structure, the channel width can be reduced to achieve higher integration of transistors. Moreover, a larger amount of current can flow through the transistor and the control efficiency can be increased, so that the off-state current and threshold voltage of the transistor can be reduced.

Contact plugs 913 and 915 are connected to the impurity regions 906 in the substrate 900. Here, the contact plugs 913 and 915 also function as a source electrode and a drain electrode of the second transistor 901. In addition, impurity regions that are different from the impurity regions 906 may be provided between the impurity regions 906 and the channel formation region. The impurity regions function as LDD regions or extension regions for controlling the distribution of electric fields in the vicinity of the channel formation region, depending on the concentration of an impurity introduced thereto. Sidewall insulating films 909 are provided on side surfaces of the gate electrode layer 908 with an insulating film placed therebetween. By using this insulating film and the sidewall insulating films 909, the LDD regions or extension regions can be formed.

The second transistor 901 is covered with an insulating film 910. The insulating film 910 can function as a protective film and can prevent impurities from entering the channel formation region from the outside. With the insulating film 910 formed by PECVD using silicon nitride or the like, hydrogenation can be performed by heat treatment in the case where single crystal silicon is used for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and a surface of the insulating film 911 is planarized by CMP. Consequently, element layers can be stacked with high accuracy above the layer including the second transistor 901.

The layer including the capacitor 903 and the first transistor 902 in which an oxide semiconductor film is used for a channel formation region is formed above the layer including the second transistor 901.

The first transistor 902 is a top-gate transistor including a multilayer film 926, a source electrode layer 927, a drain electrode layer 928, a gate insulating film 929, and a gate electrode layer 930. The first transistor 902 can have a structure similar to that of the transistor illustrated in FIGS. 24A to 24C in Embodiment 11, and thus can be formed by referring to the above description. Therefore, the other components will be described below.

As the insulating film 924, an oxide insulating film that releases oxygen by heating is preferably used. Note that the expression "oxygen is released by heating" means that the amount of released oxygen which is converted into oxygen atoms is $1.0 \times 10^{18}$ atoms/cm$^3$ or more, preferably $3.0 \times 10^{20}$ atoms/cm$^3$ or more in TDS analysis.

The oxide insulating film from which part of oxygen is desorbed by heating can diffuse oxygen into an oxide semiconductor film in the multilayer film 926 formed later, because oxygen is released from the oxide insulating film by heating. For example, in the case where a silicon oxide film is used as the insulating film 924, the composition formula is $SiO_{2+\alpha}$ ($\alpha > 0$). With the insulating film 924 thus formed, oxygen can be supplied to the oxide semiconductor film, whereby oxygen vacancies in the oxide semiconductor film can be compensated.

Further, the insulating film 924 can be formed by sputtering, PECVD, or the like. For example, when the insulating film 924 is formed by PECVD, hydrogen or water derived from a source gas is sometimes mixed in the insulating film 924. For this reason, heat treatment is preferably performed as dehydrogenation or dehydration after the insulating film 924 is formed by PECVD. The heat treatment is preferably performed at a temperature at which hydrogen or water is released from the insulating film 924. An electric furnace, an RTA apparatus, or the like can be used for the heat treatment. With the use of an RTA apparatus, the heat treatment can be performed at a temperature higher than or equal to the strain point of the substrate if the heating time is short. Thus, time to release hydrogen or water from the insulating film 924 can be shortened.

By the heat treatment, dehydrogenation or dehydration can be performed on the insulating film 924, so that diffusion of hydrogen or water to the oxide semiconductor film in the multilayer film 926 formed later can be suppressed.

When oxygen is added to the insulating film 924, the amount of oxygen desorbed by heating can be increased. Oxygen can be added to the insulating film 924 by ion implantation, ion doping, plasma treatment, or the like.

Here, evaluation was performed to determine electrical characteristics of a transistor in which oxygen is added to the insulating film 924, and after that, heat treatment and oxygen addition are performed, and then the multilayer film 926 is formed in the semiconductor device having the structure illustrated in FIG. 27.

As the insulating film 924, a 300-nm-thick SiON film was used. The SiON film was formed by a PECVD apparatus under the following conditions: a substrate temperature of 400° C., flow rates of SiH$_4$ and N$_2$O of 2 sccm and 800 sccm, a deposition pressure of 40 Pa, and a deposition power (27 MHz) of 50 W.

The heat treatment was performed at 450° C. for one hour in a vacuum.

For oxygen addition, oxygen ions ($^{16}O^+$) were added by ion implantation with an acceleration voltage of 60 kV and a dose of $2.0 \times 10^{16}$ cm$^{-2}$.

The multilayer film 926 had a structure in which a first oxide layer was formed in contact with the insulating film 924, an oxide semiconductor layer was formed in contact with the first oxide layer, and a second oxide layer was formed in contact with the oxide semiconductor layer.

As the first oxide layer, a 20-nm-thick IGZO film (In:Ga:Zn=1:3:2) was used. The IGZO film (In:Ga:Zn=1:3:2) was formed by a sputtering apparatus under the following conditions: a substrate temperature of 200° C., flow rates of Ar and O$_2$ of 30 sccm and 15 sccm, a deposition pressure of 0.4 Pa, a deposition power (DC) of 0.5 kW, and a target-to-substrate distance (T-S distance) of 60 mm.

As the oxide semiconductor layer, a 15-nm-thick IGZO film (In:Ga:Zn=1:1:1) was used. The IGZO film (In:Ga:Zn=1:1:1) was formed by a sputtering apparatus under the following conditions: a substrate temperature of 300° C., flow rates of Ar and O$_2$ of 30 sccm and 15 sccm, a deposition pressure of 0.4 Pa, a deposition power (DC) of 0.5 kW, and a target-to-substrate distance (T-S distance) of 60 mm.

As the second oxide layer, a 5-nm-thick IGZO film (In:Ga:Zn=1:3:2) was used. The IGZO film (In:Ga:Zn=1:3:2) was formed by a sputtering apparatus under the following conditions: a substrate temperature of 200° C., flow rates of Ar and O$_2$ of 30 sccm and 15 sccm, a deposition pressure of 0.4 Pa, a deposition power (DC) of 0.5 kW, and a target-to-substrate distance (T-S distance) of 60 mm.

Figure 28:
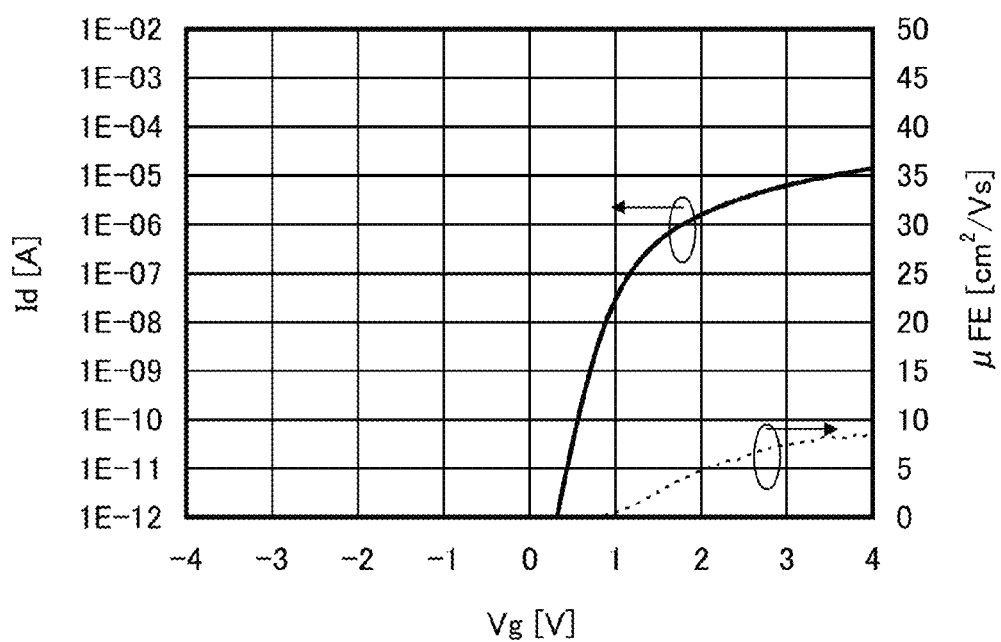
FIG. 28 shows the measurement results of electrical characteristics of a transistor.

FIG. 28 shows the electrical characteristics of the fabricated transistor.

FIG. 28 shows the measurement results of the drain current-gate voltage (Id-Vg) characteristics. Note that the transistor with the electrical characteristics shown in FIG. 28 had a channel length (L) of 0.39 µm and a channel width (W) of 0.8 µm. A voltage (Vd) between the source electrode and the drain electrode of the transistor was 1 V.

A solid line in FIG. 28 indicates the drain current (Id) with the gate voltage (Vg) varied from −4 V to 4 V in increments of 0.1 V. A thin dotted line indicates the field-effect mobility (µFE) with the gate voltage (Vg) varied from −4 V to 4 V in increments of 0.1 V.

From FIG. 28, the maximum field-effect mobility (µFE) of the transistor in a saturation region with a source-drain voltage (Vd) of 1 V and a gate voltage (Vg) ranging from −4 V to 4 V is 8.7 cm$^2$/Vs.

As noted above, the transistor shown in this embodiment has high field-effect mobility. In addition, it is clear from FIG. 28 that the transistor is a normally-off transistor.

The gate electrode layer 930 and an upper electrode layer 931 have a thickness of 10 nm to 400 nm, preferably 100 nm to 300 nm. In this embodiment, the gate electrode layer 930 and the upper electrode layer 931 are formed in the following manner: a 135-nm-thick tungsten film is stacked over a 30-nm-thick tantalum nitride film by sputtering to form a conductive film for the gate electrode, and then, the conductive film is processed (patterned) into a desired shape by etching. Note that a resist mask may be formed by an inkjet method. Formation of the resist mask by an inkjet method needs no photomask; thus, fabrication cost can be reduced.

The first transistor 902 includes a backgate electrode layer 923. With the backgate electrode layer 923, the first transistor 902 can serve as a normally-off transistor more easily. For example, when the potential of the backgate electrode layer 923 is set at GND or a fixed potential, the threshold voltage of the first transistor 902 can shift further in a positive direction, which leads to the formation of a normally-off transistor. The first transistor 902 may be a multi-gate transistor including a plurality of channel formation regions.

In order to electrically connect the second transistor 901, the first transistor 902, and the capacitor 903 to form an electric circuit, a single-layer or multilayer wiring layer for connecting these elements is stacked between layers and on the upper layer.

In FIG. 27, to form the group in the switch of FIG. 3, for example, one of the source and the drain of the second transistor 901 is electrically connected to a wiring layer 914 through the contact plug 913. The wiring layer 914 is electrically connected to an output terminal of a logic element. The other of the source and the drain of the second transistor 901 is electrically connected to a wiring layer 916 through the contact plug 915.

The wiring layer 916 is electrically connected to an input terminal of another logic element. The gate of the second transistor 901 is electrically connected to the drain electrode layer 928 of the first transistor 902 through a contact plug 917, a wiring layer 918, a contact plug 921, a wiring layer 922, and a contact plug 925.

The drain electrode layer 928 is extended to the right in FIG. 27 and functions as a lower electrode layer of the capacitor 903. The gate insulating film 929 of the first transistor 902 is provided over the drain electrode layer 928. In a region where the capacitor 903 is formed, the gate insulating film 929 functions as an interelectrode dielectric film of the capacitor 903. The upper electrode layer 931 is provided over the interelectrode dielectric film and electrically connected to a wiring layer 936 through a contact plug 935. The wiring layer 936 is a wiring for selecting a group that stores one piece of configuration data in the switch.

The wiring layers 914, 916, 918, 922, and 936 and the backgate electrode layer 923 are embedded in insulating films. These wiring layers and the like are preferably formed using a low-resistance conductive material such as copper or aluminum. Alternatively, the wiring layers can be formed using graphene formed by PECVD as a conductive material. Graphene is a one-atom thick sheet of $sp^2$-bonded carbon molecules or a stack of 2 to 100 sheets of the carbon molecules. Examples of a method of manufacturing such graphene are thermal CVD by which graphene is formed on a metal catalyst; and PECVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of the wiring material and has adhesion to the wiring material, a base film, or the like. The barrier film may be formed as a layer that is formed independently of the wiring layers, or may be formed in such a manner that a material of the barrier film is included in a wiring material and precipitated by heat treatment on the inner wall of an opening provided in an insulating film.

The insulating films 911, 912, 919, 920, 933, and 934 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide prepared from $Si(OC_2H_5)_4$, hydrogen silsesquioxane (HSQ), methyl silsesquioxane (MSQ), organosilicate glass (OSG), or an organic polymer-based material. In the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. In addition, since CMP is performed after the wirings are embedded in the insulating films, the insulating films need to have high mechanical strength. The insulating films can be made porous to have a lower dielectric constant as long as their mechanical strength can be secured. The insulating films are formed by sputtering, CVD, a coating method including spin coating (also referred to as spin on glass (SOG)), or the like.

The insulating films 911, 912, 919, 920, 933, and 934 may be additionally provided with an insulating film functioning as an etching stopper for planarization treatment by CMP or the like that is performed after the wiring material is embedded in the insulating films 911, 912, 919, 920, 933, and 934.

Barrier films are provided over the wiring layers 914, 916, 918, 922, and 936 and the backgate electrode layer 923, and a protective film is provided over each barrier film. The barrier film is provided in order to prevent diffusion of the wiring material such as copper. The barrier film can be formed using an insulating material such as silicon nitride, SiC, or SiBON. Note that a thick barrier film increases capacitance between wirings; therefore, a material with barrier properties and a low dielectric constant is preferably used.

Each of the contact plugs 913, 915, 917, 921, 925, and 935 is formed in such a manner that an opening (a via hole) with a high aspect ratio is formed in the insulating film and is filled with a conductive material such as tungsten. The opening is formed preferably by highly anisotropic dry etching and particularly preferably by reactive ion etching (RIE). The inner wall of the opening is covered with a barrier film (diffusion prevention film) formed of a titanium film, a titanium nitride film, a stack of such films, or the like, and a material such as tungsten or polysilicon doped with phosphorus or the like fills the opening. For example, tungsten is embedded in the via hole by blanket CVD, and an upper surface of the contact plug is planarized by CMP.

A protective insulating film 937 is provided in the top layer and prevents moisture and contaminant from entering the semiconductor device from the outside. The protective insulating film 937 can have a single-layer structure or a stacked structure using silicon nitride, silicon oxynitride, silicon nitride oxide, or the like.

With the above-described structure in which a transistor that includes a first semiconductor material and is capable of operating at high speed is used in combination with a transistor that includes a second semiconductor material and has significantly low off-state current, it is possible to fabricate a PLD or a semiconductor device that includes a logic circuit capable of operating at high speed with low power.

This embodiment can be combined with any of the other embodiments as appropriate.

Embodiment 13

The semiconductor device or the PLD in one embodiment of the present invention can be used for electronic devices in a wide variety of fields, such as digital signal processing devices, software-defined radio devices, avionic devices (electronic devices used in aircraft, such as communication systems, navigation systems, autopilot systems, and flight management systems), medical image processing devices, voice recognition devices, encryption devices, emulators for mechanical systems, and radio telescopes in radio astronomy. Application in ASIC prototyping in addition to the application in the field of bioinformatics is also possible.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the semiconductor device or the PLD of one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 29A to 29F illustrate specific examples of such electronic devices.

FIG. 29A illustrates a portable game console including a housing 5001, a housing 5002, a display portion 5003, a display portion 5004, a microphone 5005, a speaker 5006, an operation key 5007, a stylus 5008, and the like. Note that although the portable game console illustrated in FIG. 29A has the two display portions 5003 and 5004, the number of display portions included in a portable game console is not limited to two.

FIG. 29B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

FIG. 29C illustrates a laptop including a housing 5401, a display portion 5402, a keyboard 5403, a pointing device 5404, and the like.

FIG. 29D illustrates an electric refrigerator-freezer including a housing 5301, a refrigerator door 5302, a freezer door 5303, and the like.

FIG. 29E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

FIG. 29F illustrates a passenger car including a car body 5101, wheels 5102, a dashboard 5103, lights 5104, and the like.

This embodiment can be combined with any of the other embodiments as appropriate.

EXPLANATION OF REFERENCE

30: LUT, 31: multiplexer, 32: multiplexer, 33: multiplexer, 34: multiplexer, 35: multiplexer, 36: multiplexer, 37: multiplexer, 40: LUT, 41: multiplexer, 42: multiplexer, 43: multiplexer, 44: OR circuit, 51: transistor, 52: inverter, 53: inverter, 54: inverter, 60: switch, 61a: transistor, 61b: transistor, 61c: transistor, 62a: transistor, 62b: transistor, 62c: transistor, 63_1: wiring, 63_2: wiring, 64_1a: wiring, 64_1b: wiring, 64_1c: wiring, 64_2a: wiring, 64_2b: wiring, 64_2c: wiring, 65_1a: wiring, 65_1b: wiring, 65_1c: wiring, 65_2a: wiring, 65_2b: wiring, 65_2c: wiring, 65a: wiring, 65b: wiring, 65c: wiring, 66a: capacitor, 66b: capacitor, 66c: capacitor, 70a: deposition chamber, 70b: deposition chamber, 71: substrate supply chamber, 72a: load lock chamber, 72b: unload lock chamber, 73: transfer chamber, 73a: transfer chamber, 73b: transfer chamber, 74: cassette port, 75: substrate heating chamber, 76: substrate transfer robot, 80a: deposition chamber, 80b: deposition chamber, 80c: deposition chamber, 80d: deposition chamber, 81: substrate supply chamber, 82: load/unload lock chamber, 83: transfer chamber, 84: cassette port, 85: substrate heating chamber, 86: substrate transfer robot, 87: target, 88: shield, 89: glass substrate, 90: substrate stage, 92: substrate stage, 93: heating mechanism, 94: refiner, 95a: cryopump, 95b: cryopump, 95c: turbo molecular pump, 95d: cryopump, 95e: cryopump, 95f: cryopump, 96: vacuum pump, 96a: vacuum pump, 96b: vacuum pump, 96c: vacuum pump, 97: mass flow controller, 98: gas heating mechanism, 99: cryotrap, 101: logic array, 102: logic element, 103a: wiring group, 103b: wiring group, 104: switch box, 105: output terminal, 106: switch group, 110: wiring, 111: wiring, 112: switch, 113: switch, 114: switch, 115: switch, 116: switch, 117: switch, 200: switch, 201a: transistor, 201b: transistor, 201c: transistor, 202a: transistor, 202b: transistor, 202c: transistor, 203a: node, 203b: node, 203c: node, 204a: capacitor, 204b: capacitor, 204c: capacitor, 205a: wiring, 205b: wiring, 205c: wiring, 206a: wiring, 206b: wiring, 206c: wiring, 207: wiring, 210: wiring, 211: wiring, 212: logic element, 213: lookup table, 214: flip-flop, 215: AND circuit, 216: wiring, 217: wiring, 218: logic element, 219: lookup table, 220: flip-flop, 221: AND circuit, 230: group, 231: group, 232: group, 300: switch, 301a: transistor, 301b: transistor, 301c: transistor, 302a: transistor, 302b: transistor, 302c: transistor, 303a: node, 303b: node, 303c: node, 304a: capacitor, 304b: capacitor, 304c: capacitor, 305a: wiring, 305b: wiring, 305c: wiring, 306a: wiring, 306b: wiring, 306c: wiring, 307: wiring, 310: wiring, 311: wiring, 312: logic element, 313: lookup table, 314: flip-flop, 315: AND circuit, 316: wiring, 317: wiring, 318: logic element, 319: lookup table, 320: flip-flop, 321: AND circuit, 330: group, 331: group, 332: group, 400: switch, 401a: transistor, 401b: transistor, 401n: transistor, 402a: transistor, 402b: transistor, 402n: transistor, 403a: node, 403b: node, 403n: node, 404a: capacitor, 404b: capacitor, 404n: capacitor, 405a: wiring, 405b: wiring, 405n: wiring, 406a: wiring, 406b: wiring, 406n: wiring, 407: wiring, 410: wiring, 411: wiring, 412: logic element, 413: lookup table, 414: flip-flop, 415: AND circuit, 418: logic element, 419: lookup table, 420: flip-flop, 421: AND circuit, 430: group, 431: group, 432: group, 500: switch, 501a: transistor, 501b: transistor, 502a: transistor, 502b: transistor, 503a: node, 503b: node, 504a: capacitor, 504b: capacitor, 505a: wiring, 505b: wiring, 506a: wiring, 506b: wiring, 507: wiring, 510: wiring, 511: wiring, 512: logic element, 513: lookup table, 514: flip-flop, 515: AND circuit, 518: logic element, 519: lookup table, 520: flip-flop, 521: AND circuit, 530: group, 531: group, 540: transistor, 600: switch, 601a: transistor, 601b: transistor, 601c: transistor, 602a: transistor, 602b: transistor, 602c: transistor, 603a: node, 603b: node, 603c: node, 605a: wiring, 605b: wiring, 605c: wiring, 606a: wiring, 606b: wiring, 606c: wiring, 607: wiring, 608a: transistor, 608b: transistor, 608c: transistor, 610: wiring, 611: wiring, 612: logic element, 613: lookup table, 614: flip-flop, 615: AND circuit, 616: wiring, 617: wiring, 618: logic element, 619: lookup table, 620: flip-flop, 621: AND circuit, 630: group, 631: group, 632: group, 700: substrate, 704: gate electrode, 706: multilayer film, 706a: oxide layer, 706b: oxide semiconductor layer, 706c: oxide layer, 706d: source region, 706e: drain region, 712: gate insulating film, 716a: source electrode, 716b: drain electrode, 718: protective insulating film, 718a: silicon oxide layer, 718b: silicon oxide layer, 718c: silicon nitride layer, 800: substrate, 802: base insulating film, 804: gate electrode, 806: multilayer film, 806a: oxide layer, 806b: oxide semiconductor layer, 806c: oxide layer, 806d: source region, 806e: drain region, 812: gate insulating film, 816a: source electrode, 816b: drain electrode, 818: protective insulating film, 900: substrate, 901: transistor, 902: transistor, 903: capacitor, 904: well, 905: STI, 906: impurity region, 907: gate insulating film, 908: gate electrode layer, 909: sidewall insulating film, 910: insulating film, 911: insulating film, 912: insulating film, 913: contact plug, 914: wiring layer, 915: contact plug, 916: wiring layer, 917: contact plug, 918: wiring layer, 919: insulating film, 920: insulating film, 921: contact plug, 922: wiring layer, 923: backgate electrode layer, 924: insulating film, 925: contact plug, 926: multilayer film, 927: source electrode layer, 928: drain electrode layer, 929: gate insulating film, 930: gate electrode layer, 931: upper electrode layer, 933: insulating film, 934: insulating film, 935: contact plug, 936: wiring layer, 937: protective insulating film, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint This application is based on Japanese Patent Application serial No. 2012-229646 filed with Japan Patent Office on Oct. 17, 2012, the entire contents of which are hereby incorporated by reference.

The invention claimed is:

1. A semiconductor device comprising:
a first programmable logic element;
a second programmable logic element;
a switch comprising a first circuit group and a second circuit group; and
a first wiring,
wherein each of the first circuit group and the second circuit group comprises a first transistor and a second transistor,
wherein a first terminal of the first transistor of each of the first circuit group and the second circuit group is electrically connected to a gate of the second transistor of the corresponding one of the first circuit group and the second circuit group,
wherein a second terminal of the first transistor of each of the first circuit group and the second circuit group is electrically connected to the first wiring,
wherein a first terminal of the second transistor of each of the first circuit group and the second circuit group is electrically connected to the first programmable logic element,
wherein a second terminal of the second transistor of each of the first circuit group and the second circuit group is electrically connected to the second programmable logic element,
wherein the switch comprises a third transistor configured to short the first programmable logic element and the second programmable logic element when data is written into the gate of the second transistor of each of the first circuit group and the second circuit group,
wherein the first transistor comprises a gate electrode and a multilayer film with a gate insulating film therebetween,
wherein the multilayer film comprises a first oxide layer, an oxide semiconductor layer over the first oxide layer and comprising a channel formation region, and a second oxide layer over the oxide semiconductor layer, and
wherein the first oxide layer and the second oxide layer have a larger energy gap than the oxide semiconductor layer and comprise indium.

2. The semiconductor device according to claim 1, wherein the oxide semiconductor layer comprises indium.

3. The semiconductor device according to claim 1, wherein energy of a bottom of a conduction band of the first oxide layer is closer to vacuum level than that of the oxide semiconductor layer.

4. The semiconductor device according to claim 1, wherein energy of a bottom of a conduction band of the first oxide layer is closer to vacuum level than that of the oxide semiconductor layer by 0.05 eV or more and 2 eV or less.

5. The semiconductor device according to claim 1,
wherein the oxide semiconductor layer, the first oxide layer, and the second oxide layer comprise an In-M-Zn oxide, where M is Al, Ti, Ga, Y, Zr, La, Ce, Nd, or Hf, and
wherein an atomic ratio of In to M of the first oxide layer is lower than that of the oxide semiconductor layer.

6. The semiconductor device according to claim 1,
wherein the oxide semiconductor layer comprises an In—Zn oxide, an In—Ga oxide, or an In—Ga—Zn oxide.

7. A semiconductor device comprising:
a first programmable logic element;
a second programmable logic element;
a switch comprising a plurality of circuit groups; and
a first wiring,
wherein each of the plurality of circuit groups comprises a first transistor, a second transistor, and a third transistor,
wherein a first terminal of the first transistor of each of the plurality of circuit groups is electrically connected to a gate of the second transistor of the corresponding one of the plurality of circuit groups,
wherein a second terminal of the first transistor of each of the plurality of circuit groups is electrically connected to the first wiring,
wherein a first terminal of the second transistor of each of the plurality of circuit groups is electrically connected to the first programmable logic element,
wherein a second terminal of the second transistor of each of the plurality of circuit groups is electrically connected to a first terminal of the third transistor of each of the plurality of circuit groups,
wherein a second terminal of the third transistor of each of the plurality of circuit groups is electrically connected to the second programmable logic element,
wherein the switch comprises a fourth transistor configured to short the first programmable logic element and the second programmable logic element when data is written into the gate of the second transistor of each of the plurality of circuit groups,
wherein the first transistor comprises a gate electrode and a multilayer film with a gate insulating film therebetween,
wherein the multilayer film comprises a first oxide layer, an oxide semiconductor layer over the first oxide layer and comprising a channel formation region, and a second oxide layer over the oxide semiconductor layer, and
wherein the first oxide layer and the second oxide layer have a larger energy gap than the oxide semiconductor layer and comprise indium.

8. A semiconductor device comprising:
a first programmable logic element;
a second programmable logic element;
a switch comprising a plurality of circuit groups; and a first wiring, wherein each of the plurality of circuit groups comprises a first transistor and a second transistor, wherein a first terminal of the first transistor of each of the plurality of circuit groups is electrically connected to a gate of the second transistor of the corresponding one of the plurality of circuit groups, wherein a second terminal of the first transistor of each of the plurality of circuit groups is electrically connected to the first wiring, wherein a first terminal of the second transistor of each of the plurality of circuit groups is electrically connected to the first programmable logic element, wherein a second terminal of the second transistor of each of the plurality of circuit groups is electrically connected to the second programmable logic element, wherein the switch comprises a third transistor configured to short the first programmable logic element and the second programmable logic element when data is written into the gate of the second transistor of each of the plurality of circuit groups, wherein the first transistor comprises a gate electrode and a multilayer film with a gate insulating film therebetween, wherein the multilayer film comprises a first oxide layer, an oxide semiconductor layer over the first oxide layer, and a second oxide layer over the oxide semiconductor layer, wherein the oxide semiconductor layer comprises a channel formation region, and wherein the first oxide layer and the second oxide layer have a larger energy gap than the oxide semiconductor layer and comprise indium.

9. The semiconductor device according to claim 8, wherein the oxide semiconductor layer comprises indium.

10. The semiconductor device according to claim 8, wherein energy of a bottom of a conduction band of the first oxide layer is closer to vacuum level than that of the oxide semiconductor layer.

11. The semiconductor device according to claim 8,
wherein the oxide semiconductor layer, the first oxide layer, and the second oxide layer comprise an In-M-Zn oxide, where M is Al, Ti, Ga, Y, Zr, La, Ce, Nd, or Hf, and
wherein an atomic ratio of In to M of the first oxide layer is lower than that of the oxide semiconductor layer.

12. The semiconductor device according to claim 8, wherein the oxide semiconductor layer comprises an In—Zn oxide, an In—Ga oxide, or an In—Ga—Zn oxide.

* * * * *